United States Patent
Kawakita et al.

(10) Patent No.: US 9,622,346 B2
(45) Date of Patent: Apr. 11, 2017

(54) ADHESIVE BODY COMPRISING CONDUCTIVE POLYMER-METAL COMPLEX AND SUBSTRATE AND METHOD FOR FORMING THE SAME, CONDUCTIVE POLYMER-METAL COMPLEX DISPERSION LIQUID, METHOD FOR MANUFACTURING THE SAME AND METHOD FOR APPLYING THE SAME, AND METHOD FOR FILLING HOLE USING CONDUCTIVE MATERIAL

(71) Applicant: NATIONAL INSTITUTE FOR MATERIALS SCIENCE, Ibaraki (JP)

(72) Inventors: Jin Kawakita, Ibaraki (JP); Toyohiro Chikyo, Ibaraki (JP); Yasuo Hashimoto, Ibaraki (JP); Barbara Horvath, Ibaraki (JP)

(73) Assignee: NATIONAL INSTITUTE FOR MATERIALS SCIENCE, Ibaraki (JP)

( * ) Notice: Subject to any disclaimer, the term of this patent is extended or adjusted under 35 U.S.C. 154(b) by 17 days.

(21) Appl. No.: 14/438,004

(22) PCT Filed: Oct. 21, 2013

(86) PCT No.: PCT/JP2013/078486
§ 371 (c)(1),
(2) Date: Apr. 23, 2015

(87) PCT Pub. No.: WO2014/065242
PCT Pub. Date: May 1, 2014

(65) Prior Publication Data
US 2015/0282310 A1    Oct. 1, 2015

(30) Foreign Application Priority Data

| Oct. 24, 2012 | (JP) | 2012-235178 |
| Feb. 13, 2013 | (JP) | 2013-025154 |
| May 13, 2013 | (JP) | 2013-100815 |

(51) Int. Cl.
C09D 17/00    (2006.01)
H05K 1/09    (2006.01)
(Continued)

(52) U.S. Cl.
CPC ......... *H05K 1/095* (2013.01); *C08G 73/0266* (2013.01); *C09D 17/00* (2013.01);
(Continued)

(58) Field of Classification Search
CPC ......... C08K 3/08; C08L 65/00; C09D 201/00; C09J 2205/102
See application file for complete search history.

(56) References Cited

U.S. PATENT DOCUMENTS

| 5,855,755 A | * | 1/1999 | Murphy | C08G 61/124 204/157.15 |
| 2010/0075145 A1 | | 3/2010 | Joo et al. | |

(Continued)

FOREIGN PATENT DOCUMENTS

| JP | 2010-508387 | 3/2010 |
| JP | 2011-524464 | 9/2011 |
| WO | 2013/018732 | 2/2013 |

OTHER PUBLICATIONS

International Search Report issued Dec. 10, 2013 in International (PCT) Application No. PCT/JP2013/078486.
(Continued)

*Primary Examiner* — Michael A Salvitti
(74) *Attorney, Agent, or Firm* — Wenderoth, Lind & Ponack L.L.P.

(57) ABSTRACT

A conductive polymer-metal complex becomes to be adhered simply and strongly on the surface of a substrate such as PTFE. By subjecting a solution containing a mono-
(Continued)

Organic polymer

Metal mer which provides a conductive polymer, an anion, and a metal ions such as $Ag^+$, $Cu^{2+}$, $Cu^+$ and the like to an irradiation with light having an energy required for exciting an electron to an energy level capable of reducing the metal ion, such as ultraviolet light, under an appropriated condition, thereby precipitating the conductive polymer-metal complex as being dispersed in the reaction liquid. By supplying this dispersion liquid onto various substrates, the complex microparticles in the dispersion liquid enter into and mate with the narrow holes on the surface of the substrate. As a result, the complex precipitate formed on the surface of the substrate and the substrate can be adhered strongly to each other.

9 Claims, 38 Drawing Sheets

(51) Int. Cl.
| | | |
|---|---|---|
| C09D 201/00 | (2006.01) | |
| H01B 1/22 | (2006.01) | |
| C09J 7/02 | (2006.01) | |
| C08G 73/02 | (2006.01) | |
| H01L 21/768 | (2006.01) | |
| C08K 3/08 | (2006.01) | |
| C08L 65/00 | (2006.01) | |
| C09J 165/00 | (2006.01) | |
| C08L 79/02 | (2006.01) | |
| H05K 3/40 | (2006.01) | |
| H01L 23/498 | (2006.01) | |

(52) U.S. Cl.
CPC ............. *C09D 201/00* (2013.01); *C09J 7/02* (2013.01); *H01B 1/22* (2013.01); *H01L 21/76898* (2013.01); *C08G 2261/3221* (2013.01); *C08G 2261/3223* (2013.01); *C08G 2261/43* (2013.01); *C08G 2261/964* (2013.01); *C08K 3/08* (2013.01); *C08L 65/00* (2013.01); *C08L 79/02* (2013.01); *C09J 165/00* (2013.01); *C09J 2205/102* (2013.01); *C09J 2465/00* (2013.01); *H01L 23/49883* (2013.01); *H05K 1/097* (2013.01); *H05K 3/4069* (2013.01); *H05K 2201/032* (2013.01); *Y10T 428/24339* (2015.01)

(56) References Cited

U.S. PATENT DOCUMENTS

| | | | | |
|---|---|---|---|---|
| 2010/0295000 | A1* | 11/2010 | Zhang | .................. C08F 290/06 252/582 |
| 2011/0031450 | A1 | 2/2011 | Park et al. | |
| 2011/0186956 | A1* | 8/2011 | Hiroshige | ................ H01B 1/02 257/467 |
| 2014/0162061 | A1* | 6/2014 | Kawakita | ............... H01B 1/127 428/372 |
| 2015/0282310 | A1* | 10/2015 | Kawakita | ................. H01B 1/22 428/139 |

OTHER PUBLICATIONS

J. Kawakita et al., "Fast Formation of Conductive Material by Simultaneous Chemical Process for Infilling Through-Silicon Via", Japanese Journal of Applied Physics., vol. 51, pp. 06FG11-1-06FG11-5, 2012.

R. A. de Barros et al., "Conducting Polymer Photopolymerization Mechanism: The Role of Nitrate Ions ($NO_{3-}$)", Synthetic Metals, vol. 160, pp. 61-64, 2010.

Extended European Search Report dated Mar. 8, 2016 in corresponding European Application No. 13848557.8.

Zhao et al., "Preparation and optical properties of Ag/PPy composite colloids," Journal of Photochemistry and Photobiology A: Chemistry, vol. 187, pp. 146-151 (2007).

Stejskal et al., "The reduction of silver ions with polyaniline: The effect of the type of polyaniline and the mole ratio of the reagents," Materials Letters, vol. 63, pp. 709-711 (2009).

Khanna et al., "Synthesis of Ag/polyaniline nanocomposite via an in situ photo-redox mechanism," Materials Chemistry and Physics, vol. 92, pp. 214-219 (2005).

Breimer et al., "Incorporation of Metal Nanoparticles in Photopolymerized Organic Conducting Polymers: A Mechanistic Insight," Nano Letters, vol. 1, No. 6, pp. 305-308 (2001).

Japanese Office Action dated Jun. 1, 2016 in corresponding Japanese Patent Application No. 2014-543285 (with English summary).

Kawakita et al., "Organic conductive material capable of ultrafast forming. A three-dimensional stereo wiring in next generation stacked device is also possible at low cost," NIMS Now, vol. 12, No. 1, 124th Issue, p. 11 (Jan. 2012) (with English concise statement of relevance).

Hashimoto et al., "An influence of light/heat on a precipitation reaction of a new conductive material directed to fast wire for electronics," The Surface Finishing Society of Japan, Abstracts of 125th conference, pp. 26-27 (Mar. 2012) (with English concise statement of relevance).

\* cited by examiner

Substrate: Polypropylene (PP)

(a) Before peeling     (b) After peeling

Substrate: Teflon (PTFE)

(a) Before peeling     (b) After peeling

Substrate: Polyvinyl chloride (PVC)

(a) Before peeling  (b) After peeling

Substrate: Olefin resin (a) Before peeling  (b) After peeling

Substrate: Polycarbonate (PC)

(a) Before peeling          (b) After peeling

Substrate: Polyethylene (PE)

(a) Before peeling          (b) After peeling

Substrate: Acrylic resin (a) Before peeling  (b) After peeling

Substrate: Silicone rubber (a) Before peeling  (b) After peeling

Substrate: Plain Paper (a) Before peeling    (b) After peeling

Substrate: Glossy Paper (a) Before peeling    (b) After peeling

Substrate: Metal titanium (a) Before peeling      (b) After peeling

Substrate: Glass (surface blast processing)

(a) Before peeling      (b) After peeling

Substrate: Glass (non-surface blast processing)

(a) Before peeling  (b) After peeling (a)

(b)

(c)

10 mm

ADHESIVE BODY COMPRISING CONDUCTIVE POLYMER-METAL COMPLEX AND SUBSTRATE AND METHOD FOR FORMING THE SAME, CONDUCTIVE POLYMER-METAL COMPLEX DISPERSION LIQUID, METHOD FOR MANUFACTURING THE SAME AND METHOD FOR APPLYING THE SAME, AND METHOD FOR FILLING HOLE USING CONDUCTIVE MATERIAL

TECHNICAL FIELD

The present invention relates to an adhesive body comprising a conductive polymer-metal complex and a substrate resulting from a simultaneous precipitation of a conductive polymer and a metal and a method for forming the adhesive body. More specifically, it relates to an adhesive body utilizing that, when a dispersion liquid of a conductive polymer-metal complex is supplied to a substrate such as a polymer, by allowing the microparticles of the conductive polymer-metal complex to enter into a narrow hole existing on this substrate's surface, the conductive polymer-metal complex formed on the substrate adheres to the substrate strongly, as well as a method for forming the same.

The present invention also relates to a dispersion liquid of the conductive polymer-metal complex resulting from a simultaneous precipitation of a conductive polymer and a metal and a method for manufacturing the same. The present invention also relates to a method for applying the dispersion liquid in a thin layer.

The present invention also relates to a method for filling a hole having a high aspect ratio such as via with a conductive material using the aforementioned dispersion liquid.

BACKGROUND ART

A limitation in element downsizing in an LSI manufacturing process which begins to be realized in these days forces a three dimensional packaging technology to be focused on as one of the techniques for a higher integration. In the three dimensional packaging technology, LSI chips are stacked in a vertical direction to increase the number of the elements per unit area. In order to achieve this three dimensional packaging, an electric packaging technology with regard to the way that the electric signals between the stacked LSI chips are connected is essential. The electric connection between the LSI chips which has been proposed and performed actually so far is a wire bonding method using a metal thin wire for the connection.

Since the wire bonding has been employed in a two dimensional packaging for a long time and has a enormous accumulation of the technologies, it can be applied relatively easily to the three dimensional packaging technology. Nevertheless, it is required, for connecting the signals between the LSI chips by the wire bonding method, that a signal is drawn out first to the circumferential part of an LSI chip from which then a connection is made to the circumferential part of the target LSI using a metal thin wire and then further drawn using the wiring in the LSI chip into the place where the relevant signal is required within the target LSI. Accordingly, the wire bonding method requires to secure a region for the wire bonding in the circumference of the LSI chip, which leads to a problem involving an increase in the packaging area as well as an elongation of the signal transmission path. In addition, the number of the signal paths between LSI chips is limited by the number of the bonding terminals capable of being provided around the LSI chips.

Recently, a silicon through electrode (TSV (Through silicon via)) method (see Non Patent Literature 1) as an alternative means for electric connection between LSI chips became a focus of attention. In the TSV method, a direct connection of the circuit between the LSI chips is made by using a TSV which is a wiring in the vertical direction through stacked LSI chips instead of allowing an electric signal to go through a wire bonding outside of an LSI chip to obtain an electric connection. It is expected that the problems described above with regard to the wire bonding method are solved by means of wiring between LSI chips using the TSV.

As one of challenges for allowing the TSV method to become a practical one, it is exemplified that a fine hole (via) having a high aspect ratio is embedded within a short period with a conductive material having a high conductivity. While use of a copper as a high conductivity embedding material for a TSV is investigated (see Non Patent Literature 2), it requires, when achieved with copper plating, a time period as long as 2 hours or longer, which should be reduced substantially. In addition to the copper, those which are investigated for use as embedding materials are poly-silicon, tungsten, silver and the like (for example, see Patent Literature 1, Non Patent Literature 3). Comparison between these embedding materials is shown in Table 1.

TABLE 1

|  | Polysilicon | W | Cu | Ag |
| --- | --- | --- | --- | --- |
| Conductivity ($\Omega^{-1}cm^{-1}$) | $4.0 \times 10^4$ | $1.89 \times 10^5$ | $5.96 \times 10^5$ | $6.3 \times 10^5$ |
| Wiring formation method | CVD | CVD | Plating | Printing |
| Pretreatment (Barrier film formation) | SiN | WN (CVD) | Si/SiN, Ti/TiN, Ta/TaN, (Sputtering or CVD) | Not required |
| Pretreatment (Seed layer formation) | Not required | W (CVD) | Cu (CVD) | Not required |
| Remarks |  | Because of strategy material, stable availability is not expected. | Yield is problematic (voids tend to occur.) | Post heat treatment is required. Migration occurs. |

Other than these, those which are investigated for use as embedding materials are conductive polymers. The conductive polymers can be obtained from enormous sources and can be used in a process involving an ambient temperature/atmospheric pressure such as application which can advantageously be conducted at a low cost, while they have problematically low conductivities.

On the other hand, a method was reported, aiming at application to catalyst support, immunological diagnostic marker particle and the like, in which the reaction mechanism shown below is employed to conduct a simultaneous precipitation of silver and polypyrrole which is one of the conductive polymers (see Non Patent Literature 4, 5).

[Ch. 1]

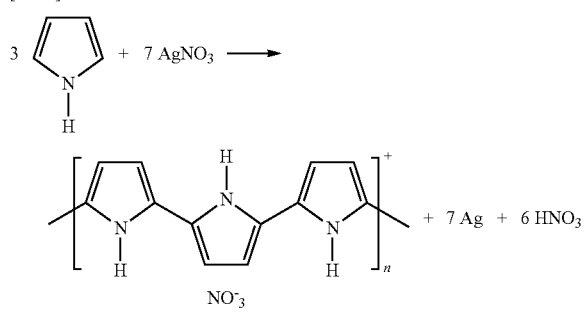

Using this method, it is possible to fill a via in a simple procedure with a material having a higher conductivity when compared with conductive polymers.

Nevertheless, the material obtained by this method also failed to achieve a sufficiently high conductivity which should be possessed by a filling material for the TSV, and a problematically high manufacturing cost is still associated because a relatively non-noble metal such as a copper cannot be used.

While Patent Literatures 2 and 3 disclose other methods for manufacturing conductive polymer-metal complexes, none of these Patent Literatures suggest the precipitation of the complex assisted by irradiation of a light and the like.

It is also possible, if such a satisfactorily conductive complex can be formed into thin layers by a simple operation, to provide a novel material which has the both properties of a polymer and a metal and which is suitable to various application. As used herein, a "thin layer" means a fine particle as well as a fine wire by regarding the fine particle and the fine wire as some kinds of thin layers resulting from reducing the areas while keeping the thicknesses constant.

Moreover, if a conductive polymer-metal complex having a satisfactory conductivity is given, and also if it has not only a property similar to that of an existing conductive body such as a metal but also an ability of adhering such a complex strongly by a simple operation onto various substrates usually posing a difficulty in adhering a conductive body such as PTFE (polytetrafluoroethylene), its applicability may dramatically be widened.

On the other hand, a hole having a high aspect ratio such as a via having a small diameter, when being filled with a conductive substance such as a metal, requires a complicated processing such as a procedure for ensuring the first entrance of a processing fluid into the hole, such as a transient reduction in pressure. On the other hand, an electrolytic plating method which is a conventional technique employed frequently for filling a hole such as a via with a metal requires an additional step for forming a seed layer (usually copper) inside the via usually by a non-electrolytic technique such as PVD. If such a hole is made, it fails usually to be in a completely cylindrical form, and protrusions and recesses are formed in ring forms. In such a form, it is difficult to form the seed layer uniformly inside of the via and the number of fabricating processes increases problematically for achieving the inside of the via which is close to a complete cylinder. Thus, a method for overcoming such a difficulty and filling the inside of the via with a conductive material simply and surely is demanded, as well as a processing material employed for such a filling process.

SUMMARY OF INVENTION

Technical Problem

An object of the present invention is to provide a conductive polymer-metal complex dispersion liquid having a high conductivity which solves the aforementioned conventional technological problems and can form a conductive thin structure such as electrodes or wirings readily and accurately, and a method for manufacturing the same, as well as a method for applying such a dispersion liquid.

Another object of the present invention is to provide an adhesive body comprising a conductive polymer-metal complex and a substrate in which the conductive polymer-metal complex having a satisfactory conductivity and various substrate are adhered to each other strongly, as detailed below.

Still another object of the present invention is to provide a method for filling the inside of a narrow hole such as a via using the aforementioned dispersion liquid.

Solution to Problem

According to one aspect of the present invention, an adhesive body comprising a conductive polymer-metal complex and a substrate; wherein a conductive polymer-metal complex comprising an organic conductive polymer and metal nanoparticles with at least a part of the metal nanoparticles being exposed on the surface of the organic conductive polymer is adhered to the surface of the substrate; and wherein microparticles of the complex which have entered into narrow holes on the surface of the substrate serves to engage the complex adhering to the surface of the substrate with the substrate is provided.

Here, the metal nanoparticles may have a diameter of 5 nm or more and less than 100 nm, the microparticles of the conductive polymer-metal complex may have a diameter of 5 nm to 500 nm and the fine hole may have a size of 5 nm or more. The size of the narrow holes may be 1000 nm or less.

The microparticles of the complex entering into the fine hole of the surface of the substrate may be bound to each other.

The binding of the microparticles of the complex to each other may occur via Van der Waals' force or hydrogen bond.

The organic conductive polymer may be an organic polymer of a straight chain, aromatic, hetrocyclic compound or a heteroatom compound having a conjugation structure.

The organic conductive polymer may be a polymer of a monomer selected from a group consisting of pyrrole, 3,4-ethylenedioxy-thiophene and aniline.

The metal may be at least a metal selected from a group consisting of gold, platinum, palladium, ruthenium, iridium, silver, copper, nickel, iron, chromium, zinc, cadmium, tellurium, tin and lead.

The substrate may be plastics.

According to another aspect of the present invention a conductive polymer-metal complex dispersion liquid wherein microparticles of a conductive polymer-metal complex comprising an organic conductive polymer and metal nanoparticles with at least a part of the metal nanoparticles being exposed on the surface of the organic conductive polymer is dispersed in a solvent is provided.

Here, the microparticles in the dispersion liquid may have a diameter of 5 nm to 100 nm, and the metal nanoparticles may have a diameter of 1 nm or more and less than 100 nm.

The organic conductive polymer may be an organic polymer of a straight chain, aromatic, hetrocyclic compound or a heteroatom compound having a conjugation structure.

The organic conductive polymer may be a polymer of a monomer selected from a group consisting of pyrrole, 3,4-ethylenedioxy-thiophene and aniline.

The aforementioned solvent may be selected from a group consisting of acetonitrile, ethanol and water.

A liquid in which the conductive polymer-metal complex can be dispersed more easily than in the solvent may further be contained.

A dispersing agent for the aforementioned conductive polymer-metal complex may further be contained.

The metal may be at least a metal selected from a group consisting of gold, platinum, palladium, ruthenium, iridium, silver, copper, nickel, iron, chromium, zinc, cadmium, tellurium, tin and lead.

A starting material for the conductive polymer-metal complex may further be contained.

According to still another aspect of the present invention, a method for manufacturing a conductive polymer-metal complex dispersion liquid according to any one of those described above comprising irradiating a solution containing a monomer serving as a starting material for the conductive organic polymer as well as an anion and a metal ion with light having an energy required for exciting an electron to an energy level capable of reducing the metal ion evenly for every small part of the solution is provided.

Here, a transparent container holding the solution in a thin layer condition may be irradiated with the light thereby accomplishing the even irradiation.

The solution may be held in a thickness of 2 mm or less in the transparent container.

Heat or sound may be used together with the light in order to give the energy.

Pyrrole may be used as the monomer with its concentration in the solution being 0.1 mol/L or more and $Ag^+$ may be used as the metal ion with its concentration in the solution being 5 times or more and 20 times or less that the concentration of the pyrrole.

Pyrrole may be used as the monomer with its concentration in the solution being 0.05 mol/L or more and $Cu^{2+}$ or $Cu^+$ may be used as the metal ion with its concentration in the solution being equivalent times or more and 10 times or less that the concentration of the pyrrole.

According to still further aspect of the invention, a method for applying a conductive polymer-metal complex dispersion liquid wherein a conductive polymer-metal complex dispersion liquid according to any one of those described above is applied onto the substrate using an inkjet or a dispenser is provided.

According to still another aspect of the present invention, a method for forming the adhesive body comprising a conductive polymer-metal complex and a substrate according to any one of those described above by adhering a conductive polymer-metal complex dispersion liquid wherein the microparticles of a conductive polymer-metal complex comprising an organic conductive polymer and metal nanoparticles with at least a part of the metal nanoparticles being exposed on the surface of the organic conductive polymer is dispersed in a solvent to the substrate is provided.

According to still another aspect of the present invention, a method for filling a hole with a conductive material; wherein a conductive polymer-metal complex dispersion liquid wherein the microparticles of a conductive polymer-metal complex comprising an organic conductive polymer and metal nanoparticles with at least a part of the metal nanoparticles being exposed on the surface of the organic conductive polymer is dispersed in a solvent, conductive polymer-metal complex dispersion liquid is provided; and wherein a member provided with a hole is immersed in the dispersion liquid is provided.

Here, the member may be removed from the dispersion liquid and dried.

The cycle of the immersion and the drying may be repeated more than one time.

An ultrasonic irradiation may be conducted during the immersion.

ADVANTAGEOUS EFFECTS OF INVENTION

The conductive polymer-metal complex dispersion liquid of the present invention has a high stability including a satisfactory storability, and allows a fine conductive pattern to be applied readily and strongly onto various substrates including materials having low abilities of adhering to other materials. In addition, the dispersion liquid of the present invention has a high compatibility with existing techniques and instruments for applying a thin layer precisely.

Furthermore, an adhesive body comprising a conductive polymer-metal complex and a substrate of the present invention achieves, by an extremely simple processing, a strong adhesion with various substrates including PTFE known to have an extremely poor adhesiveness.

Moreover, the present invention allows a conductive body to be filled in the inside of a narrow hole simply and surely.

DESCRIPTION OF EMBODIMENTS

When synthesizing a conductive polymer-metal complex employed in the present invention, a complex of a metal and a conductive polymer is precipitated at a high rate by being assisted by light. Typically, a solution (in acetonitrile, ethanol, water and the like) containing a monomer (pyrrole and the like) serving as a starting material for the conductive organic polymer as well as an anion and a metal ion receives a substrate (silicon, germanium, III-V group semiconductor, oxide semiconductor, glass plate and the like), and is irradiated with light having an energy required for exciting an electron to an energy level capable of reducing the metal ion irradiation. By means of this light irradiation, a reaction involving simultaneous progression of oxidizing polymerization of a conductive polymer from the organic monomer and a doping anion and reducing precipitation of the metal from the metal cation is accelerated, in other words, assisted by the light. While the following example employed such an irradiation using ultraviolet light (wavelength of 400 nm or less), light having a longer wavelength may be employed depending on the excitation energy required. It is a matter of course that heat or sound may be used at the same time as far as it is a stimulus capable of exciting the electron equivalently. After a certain time period, the apparatus is taken together with the precipitate thereon from the solution and dried.

As described above, in the synthesis of the conductive polymer-metal complex used in the present invention, the assistance by the irradiation such as light allows the simultaneous precipitation of the metal and the conductive polymer to be achieved at a high rate, and use of such a novel precipitation method enables production of the conductive polymer at a high rate and utilization of a relatively "non-noble" metal, which are advantage over the prior art technology shown in Non Patent Literature 4.

Figure 1:
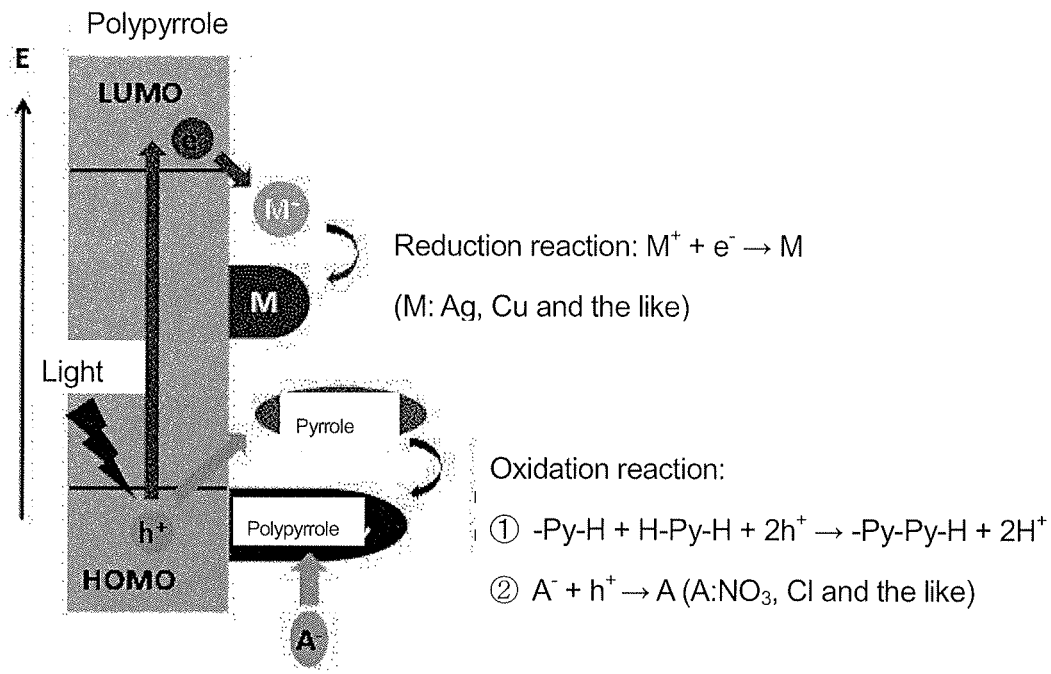
FIG. 1 shows a schematic view illustrating a reaction mechanism in synthesis of a conductive polymer-metal complex employed in the present invention.

Although the reaction mechanism of the conductive polymer-metal complex used in the present invention has not completely been elucidated yet, our study suggests that it is a phenomenon unknown before based on generation of a positive hole and an electron within a conductive polymer as a result of excitation by light and the like which leads to progression of potent oxidizing reaction and reducing reaction, as shown in FIG. 1 exemplifying polypyrrole as a conductive polymer. Typically, the oxidizing reaction and the reducing reaction are promoted by the positive hole and the electron. In the oxidizing reaction by the positive hole, oxidative polymerization of pyrrole and doping of an anion occur. In the reducing reaction by the electron, precipitation of a metal occurs.

Figure 2:
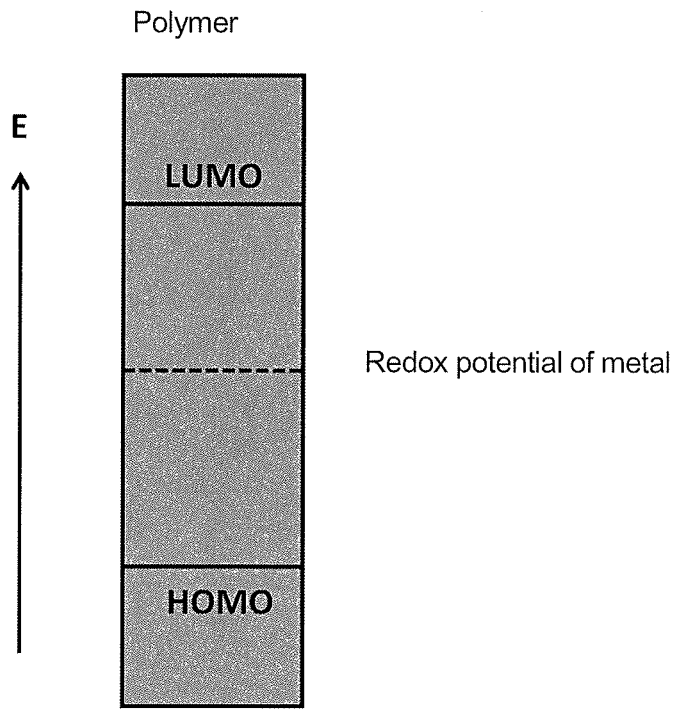
FIG. 2 shows a schematic view illustrating a condition allowing the conductive polymer-metal complex to precipitate.

Based on the reaction mechanism discussed above, it is understood that, when the redox potential of the metal is at an energy position lower than that a high energy rank (for example LUMO) to which the electron in the polymer can reach when excited as shown in FIG. 2, the complex material of the polymer and the metal can be precipitated.

Based on the discussion on the reaction mechanism described above and Examples described below, it is understood that the following monomers and metals can be employed as starting materials for the conductive polymer-metal complex used in the present invention.

Monomers: Monomers capable of producing organic polymers of straight chain, aromatic, hetrocyclic compounds, heteroatom compound having conjugation structures.

Metals: Gold, platinum, palladium, ruthenium, iridium, silver, copper, nickel, iron, chromium, zinc, cadmium, tellurium, tin, lead and alloys thereof.

Since the conductive polymer-metal complex used in the present invention consists mainly of organic materials, it is expected essentially to be applied to a conductive wiring pattern onto a flexible substrate or a conductive adhesive. Accordingly, the adhesion to various substrates including plastics is one of the important properties. In addition, with regard to utilization in a three-dimensional wiring described in the background technology, the adhesion to the substrate is important. Accordingly, in Examples described below, an adhesion test (tape peel-off test) or a bending test was conducted and their data were obtained.

Since this conductive polymer-metal complex can fill the inside of a TSV densely with a conductive polymer-metal complex having a high conductivity, it can readily construct an electric connection between LSI chips which is highly reliable and enables a highly dense packaging. In addition, since this conductive polymer-metal complex can precipitate the complex of the conductive polymer and the metal not only on the inside of the via but also on various surfaces and the complex thus precipitated can possesses a flexibility, use of the present invention enables formation of flexible wirings and electrodes in various fields including solar cells and EL illuminations. Furthermore, this conductive polymer-metal complex exhibits a satisfactorily adhesion to various substrates, and further enables, by being applied as its dispersion liquid onto the substrate using an inkjet device or dispenser, production of thin layers as small dots, fine wires or any other shapes on the substrate readily with high precision and arbitrariness.

EXAMPLES

Reference Example 1

Using pyrrole, 3,4-ethylenedioxythiophene (EDOT) and aniline as monomers for obtaining a conductive polymer, $Cu^{2+}$ and $Ag^+$ as metal ions and chloride ion ($Cl^-$) for $Cu^{2+}$ and nitrate ion ($NO_3^-$) for $Ag^+$ as anions, ultraviolet light irradiation was performed to precipitate a conductive polymer-metal complex. With varying types and concentrations of the monomers and varying types and concentration of the metal ions, 30 types of experiments were performed. It should be understood that these are merely examples and are not intended to restrict the technical scope of the present invention which is defined in Claims. These experiments were performed using the following experimental conditions and measurement conditions.

Typical experimental condition
  Temperature: Room temperature
  Solvent: Acetonitrile, ethanol and water
  Substrate: Glass
  Ultraviolet light intensity: 50 mW/cm$^2$
  Wavelength: 436 nm, 405 nm, 365 nm (bright line)
  Precipitation time: 0.5 to 240 min
Resistance measurement method
  Four probe method using Loresta AP MCP-T400 manufactured by Mitsubishi Chemical (While the measurement principle is well known and is not detailed here, reference can be made to Non Patent Literature 6.)

Using a method in which the aforementioned substrate was place on the bottom of the container, and received a sample (conductive polymer-metal complex) as being sedimented (precipitated) thereon, the conductive polymer-metal complexes of Experimental No. 1 to 30 in Table 2 were made.

The results of the experiment thus performed are shown in Table 2.

TABLE 2

| Experiment No. | Monomer Type | Monomer mol/L | $Ag^+$ mol/L | $Cu^{2+}$ mol/L | Resistance $\Omega$ |
|---|---|---|---|---|---|
| 1 | Pyrrole | 0.5 | 5 | | OL |
| 2 | Pyrrole | 0.2 | 2 | | 14.14 |
| 3 | Pyrrole | 0.2 | 1 | | 0.00067 |
| 4 | Pyrrole | 0.1 | 2 | | 8.54 |
| 5 | Pyrrole | 0.1 | 1 | | 4.4 |
| 6 | Pyrrole | 0.1 | 0.5 | | 32000 |
| 7 | Pyrrole | 0.1 | 0.2 | | 35800 |
| 8 | Pyrrole | 0.1 | 0.1 | | 68000 |
| 9 | Pyrrole | 0.05 | 0.5 | | 4280000 |
| 10 | Aniline | 0.2 | 2 | | 188 |
| 11 | Aniline | 0.2 | 1 | | 220 |
| 12 | Aniline | 0.1 | 1 | | 0.649 |
| 13 | Aniline | 0.05 | 0.5 | | 21 |
| 14 | EDOT | 0.1 | 1 | | 2080000 |
| 15 | EDOT | 0.05 | 0.5 | | OL |
| 16 | Pyrrole | 0.2 | | 2 | 13.35 |
| 17 | Pyrrole | 0.2 | | 1 | 1394 |
| 18 | Pyrrole | 0.1 | | 1 | 5.96 |
| 19 | Pyrrole | 0.1 | | 0.5 | 559 |
| 20 | Pyrrole | 0.1 | | 0.2 | 16100 |
| 21 | Pyrrole | 0.1 | | 0.1 | 913 |
| 22 | Pyrrole | 0.05 | | 0.5 | 38.9 |
| 23 | Pyrrole | 0.05 | | 0.1 | 100.7 |
| 24 | Pyrrole | 0.05 | | 0.05 | 273 |
| 25 | Aniline | 0.2 | | 2 | 49000 |
| 26 | Aniline | 0.2 | | 1 | OL |
| 27 | Aniline | 0.1 | | 1 | OL |
| 28 | Aniline | 0.05 | | 0.5 | OL |
| 29 | EDOT | 0.1 | | 1 | 689 |
| 30 | EDOT | 0.05 | | 0.5 | OL |

Here, the metal ions ($Ag^+$ ion and $Cu^{2+}$ ion) and the anions were given actually in the forms of $CuCl_2$, and $AgNO_3$. The indication "OL" in the column of resistances in Table 1 means that the resistance could not be determined because it was larger than the possible measurement range.

Figure 3:
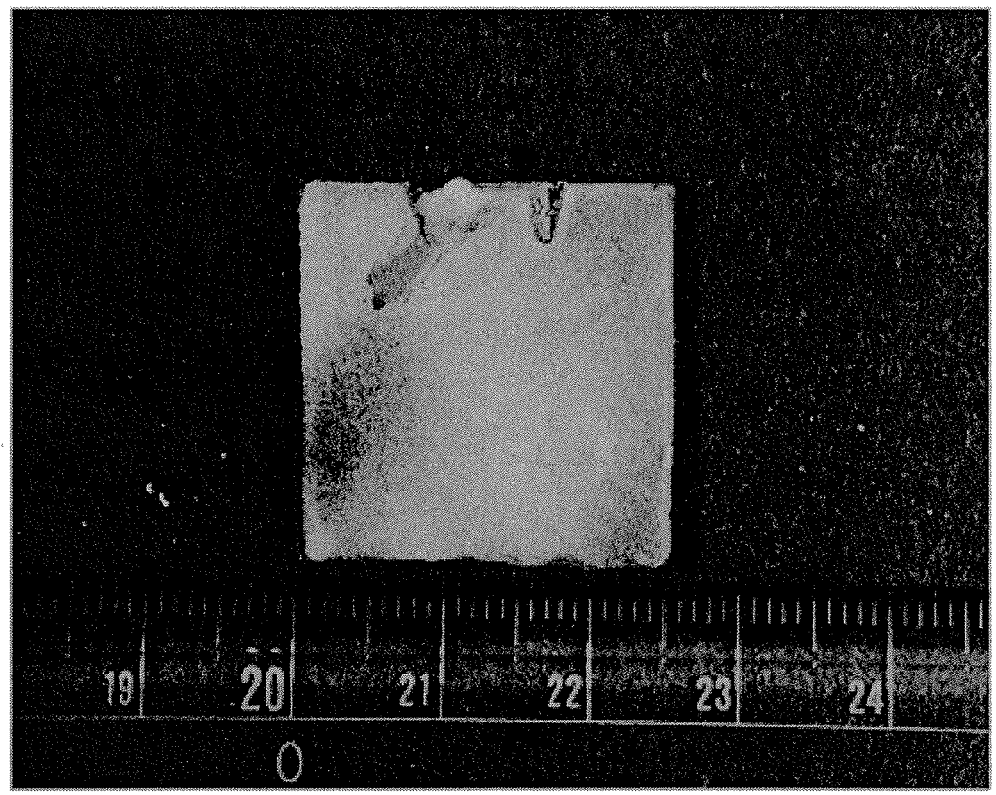
FIG. 3 is a photograph showing the appearance of the substrate on which the conductive polymer-metal complex is precipitated.
Figure 4:
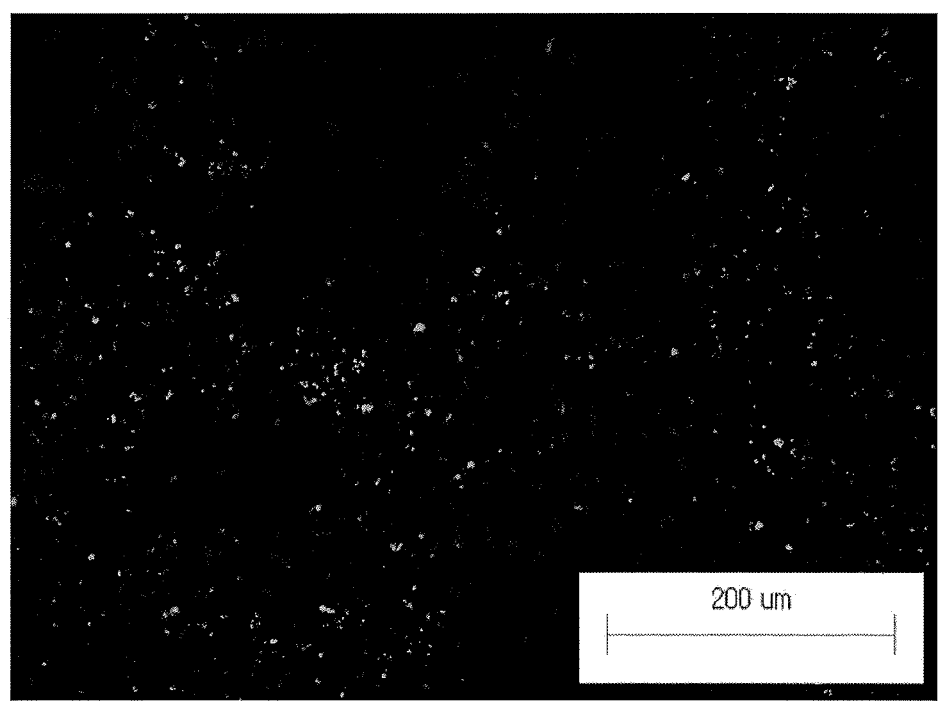
FIG. 4 is a microscopic photograph showing the precipitated conductive polymer-metal complex.

The photograph of the appearance of an example of the substrate on which a conductive polymer-metal complex is precipitated as described above is shown in FIG. 3. This example of the photograph corresponds to Experiment No. 3 in Table 2 shown below. The microscopic photograph of the conductive polymer-metal complex thus precipitated is shown in FIG. 4. As shown in FIG. 4, the microparticles of the metal observed as bright (orange color in the original photograph) spots are dispersed between the conductive organic polymers observed as black. As observed in FIG. 3 and FIG. 4, the conductive polymer-metal complex precipitated in the state where no large or small holes or void are observed.

Reference Example 2

The conductive polymer-metal complex used in the present invention and Non Patent Literature 4 were compared in an experiment. The following experimental conditions and measurement conditions were employed.

Pyrrole concentration: 0.1 mol/L
Metal ion concentration: 0.1 mol/L
Anion: $NO_3^-$, Anion concentration: 0.1 mol/L
Solvent: Acetonitrile
Substrate: Glass
Reaction time: 60 min As a result, when using the pyrrole as a monomer and $Ag^+$ as a metal ion, the resistance of the precipitate obtained precipitation performed for about 1 hour in the method of Non Patent Literature 4 was as substantially high as $10^5$ to $10^7 \Omega$. When using $Cu^{2+}$ instead of $Ag^+$, no precipitation of the conductive polymer-metal complex was observed.

On the other hand, when processing the combination of the pyrrole and $Ag^+$ based on the manufacturing method of the conductive polymer-metal complex used in the present invention, the precipitation for a time period less than 20 minutes while being irradiated with ultraviolet light yielded a conductive polymer-metal complex having a resistance of 0.3 to $0.6 \times 10^{-1} \Omega$. When using $Cu^{2+}$ instead of $Ag^+$, a time period of the ultraviolet light irradiation and precipitate less than 10 minutes resulted in a resistance of 0.2 to $0.3 \times 10^2 \Omega$.

As a result of a comparative control experiment, the conductive polypyrrole itself (PTS anion dope) had a resistance of $0.2 \times 10^2 \Omega$.

Based on the results of the experiment shown in Table 2 and the like, preferable ranges of the monomer concentration and the metal ion concentration when using pyrrole as a monomer and $Ag^+$ or $Cu^{2+}$ as a metal ion are shown in Table 3. In Table 3, the resistances of a conventional conductive polymer, Cu formed without electrolytic plating and W formed by CVD are shown as comparative controls.

In the conductive polymer-metal complex used in the present invention, the fact that the growth rate of the conductive polymer-metal complex is higher than that of other conductive bodies of the prior art is also one of the characteristics. To show this fact, Table 3 further includes the film growth rate (i.e., the growth rate in the direction of the film thickness).

TABLE 3

Examples (Summary)

| Monomer | | Cation | | | Resistivity | Film forming rate |
|---|---|---|---|---|---|---|
| | mol/L | $Ag^+$ | mol/L | $Cu^{2+}$ mol/L | $\Omega$cm | nm/s |
| Pyrrole | 0.1 or more | Monomer ratio of 5 times or more and 20 times or less | | | 0.00018 | 42 |
| Pyrrole | 0.05 or more | | | Monomer ratio of 1 time or more and 10 times or less | 1.8 | 67 |

Comparative Examples (Summary)

| | | | | | | |
|---|---|---|---|---|---|---|
| Polypyrrole (PTS Dope) | | | | | 0.36 | 11 (Note 1) |
| Cu Plating | | | | | 1.67E-06 | 0.5-1 (Note 2) |
| W-CVD | | | | | 5.3E-06 | 1-8 (Note 3) |

Note 1: Data found (the resistivity was obtained by converting the resistance measured by the method similar to that in Reference Example 1 into a resistivity.)

Note 2: Data from Non Patent Literature 2

Note 3: Data from Patent Literature 1 and Non Patent Literature 3

The column of the resistivity of the conductive polymer-metal complex varies depending on the pyrrole concentration and the metal ion concentration. In the column of the resistivity in Table 3, those which were the best in the data in Reference Example 1 within corresponding pyrrole concentration range and metal ion concentration range are indicated. The anion which can be employed in the conductive polymer-metal complex used in the present invention in addition to $NO_3^-$, $Cl^-$ employed in Reference Example 1 includes $I^-$, $BF_4^-$ and the like. It is also possible to use various anions such as protonic acid ions ($SO_4^{2-}$ or $ClO_4^-$ and the like in addition to $NO_3^-$), halide ions ($F^-$ or $Br^-$, as well as its mixture in addition to the aforementioned $Cl^-$ or $I^-$), Lowis acid ions ($PF_6^-$, $AsF_6^-$ and the like in addition to the aforementioned $BF_4^-$), transition metal halides (anions resulting from conversion of $FeCl_3$ or $MoCl_5$ possibly into the forms of $FeCl_4^-$ or $MoCl_6^-$), organic compounds (those resulting from conversion of a substituent of an organic compounds such as PSS into an anionic one such as $SO_3^-$ or TCNQ or TCNE, DDQ and the like in addition to PTS) and the like.

As known from Table 3, the metal conductive body comprising Cu or W formed by the conventional method has an extremely low resistivity. Nevertheless, its extremely slow growth makes it completely impossible to be used in a practical TSV formation and the like.

The conductive polypyrrole itself exhibits a substantially higher resistivity when compared with the conductive polymer-metal complex using Ag as a metal. Although the sensitivity was ⅕ of that of the complex using Cu, the growth rate was also ⅕ reflecting an extremely slow growth, which makes the use in the TSV formation impractical.

On the contrary, the conductive polymer-metal complex used in the present invention has a resistivity applicable for a practical use while its growth rate is far higher than that of a conventional conductive material of this type, it enables the formation of the TSV formation and other conductive body formation at a practical speed.

The reason for the smaller resistivity (0.36 Ωcm) of the conductive polypyrrole itself in Table 3 than the resistivity (1.8 Ωcm) of the conductive polymer-metal complex used in the present invention (polypyrrole-copper complex) using copper as a metal can be explained as follows.

The resistivity of polypyrrole varies depending on the type and the concentration of the anion to be doped. Since PTS dope was reported to exhibit the lowest resistivity, it was employed here as a comparative example.

On the other hand, the conductivity (resistivity) of the conductive polymer-metal complex used in the present invention is considered to be dependent on the conductivity of the polypyrrole itself and the metal content. In the polypyrrole-copper complex in Reference Example 1, it is assumed that the chloride ion was doped in the polypyrrole. The chloride ion does not provide a conductivity comparable to that by the PTS anion, and the dope level in Reference Example 1 is considered to be low. In addition, in Reference Example 1 employing copper as a metal, the low copper content (precipitated amount) is considered to be one of the reasons for the conductivity of the complex itself which was lower than that of polypyrrole (PTS dope). In any case, the aforementioned experiment examples indicate that the conductive polymer-metal complex used in the present invention was successful in achieving the aforementioned satisfactory conductivity and growth rate before optimizing the starting material and the precipitate condition sufficiently.

Figure 5A:
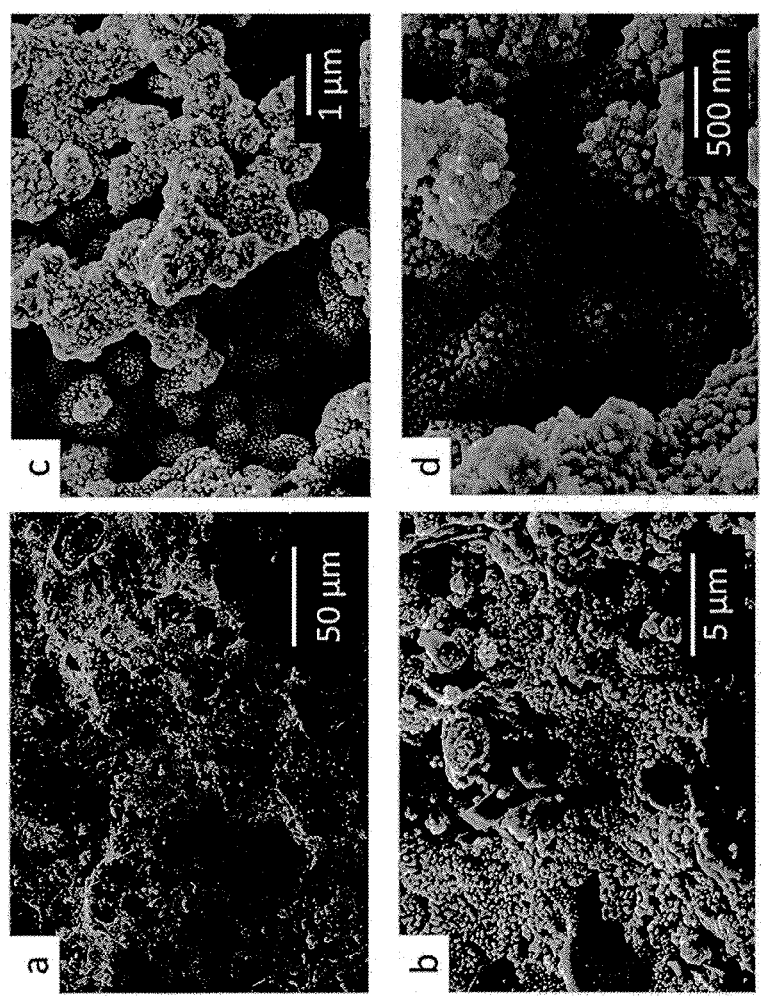
FIG. 5A shows an SEM image of the precipitated conductive polymer-metal complex at 4 levels of magnification.
Figure 5B:
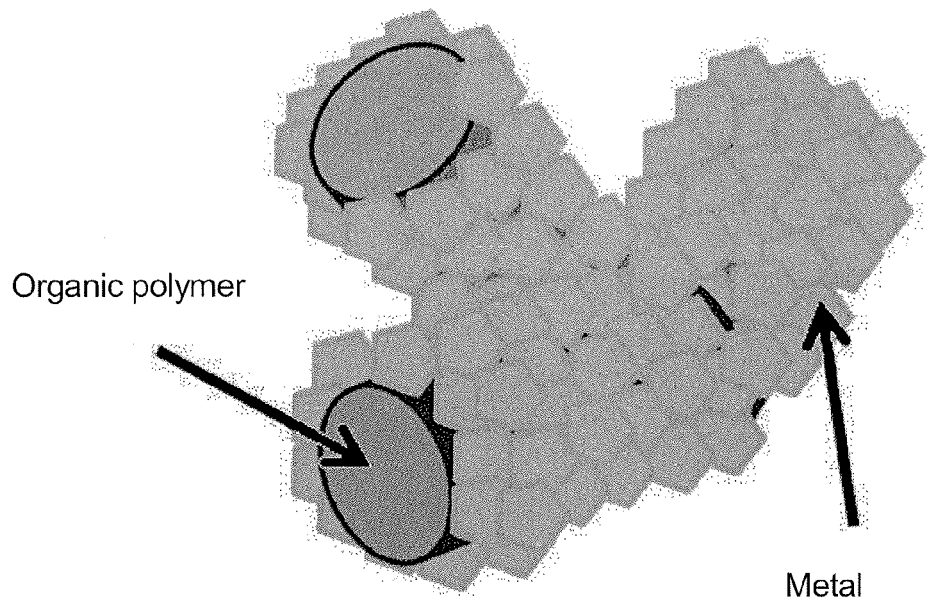
FIG. 5B shows a conceptual view of a conductive body covered with a metal shell.
Figure 6:
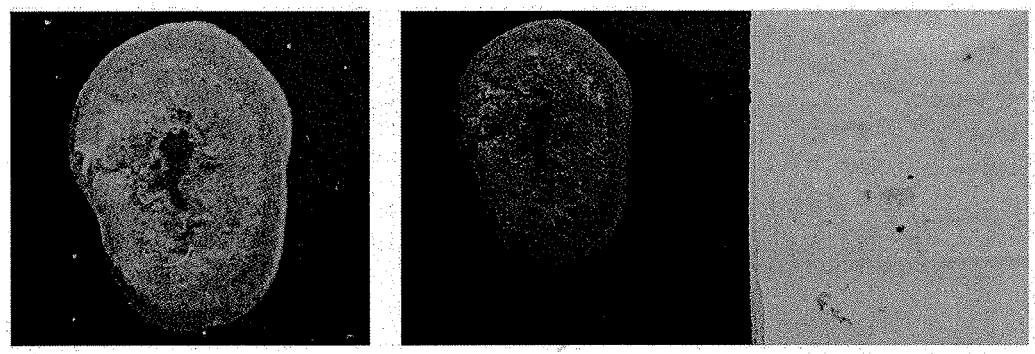
FIG. 6 is a photograph showing the results of a tape peel-off test of an ABS resin substrate on which a conductive polymer-metal complex is precipitated.
Figure 7:
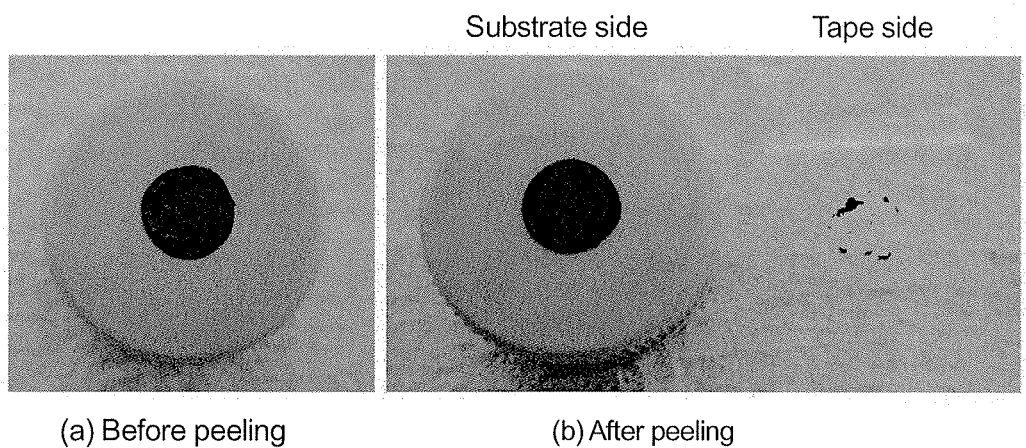
FIG. 7 is a photograph showing the results of a tape peel-off test of a polypropylene substrate on which a conductive polymer-metal complex is precipitated.
Figure 8:
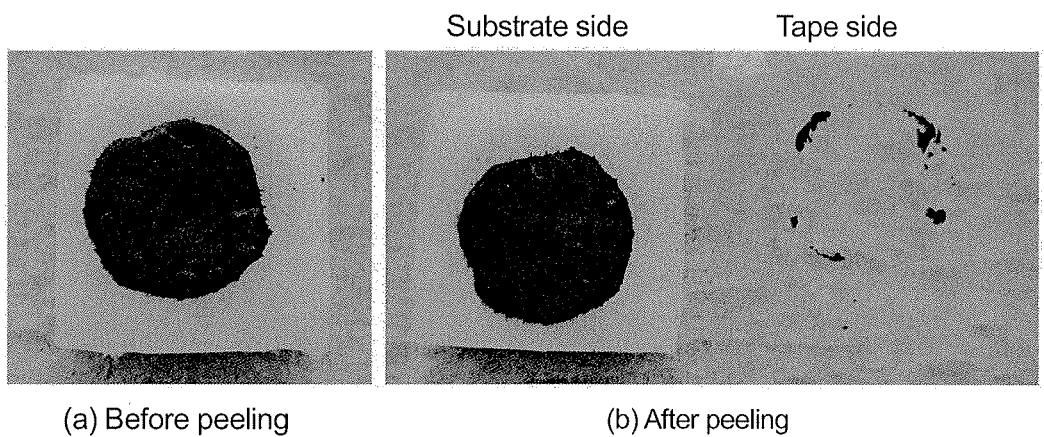
FIG. 8 is a photograph showing the results of a tape peel-off test of a Teflon (Trade mark) substrate on which a conductive polymer-metal complex is precipitated.
Figure 9:
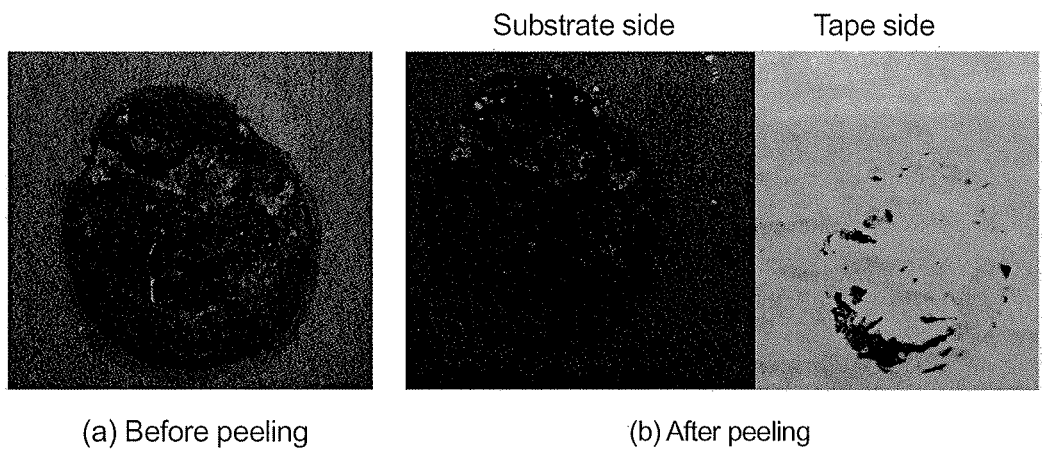
FIG. 9 is a photograph showing the results of a tape peel-off test of a polyvinyl chloride substrate on which a conductive polymer-metal complex is precipitated.
Figure 10:
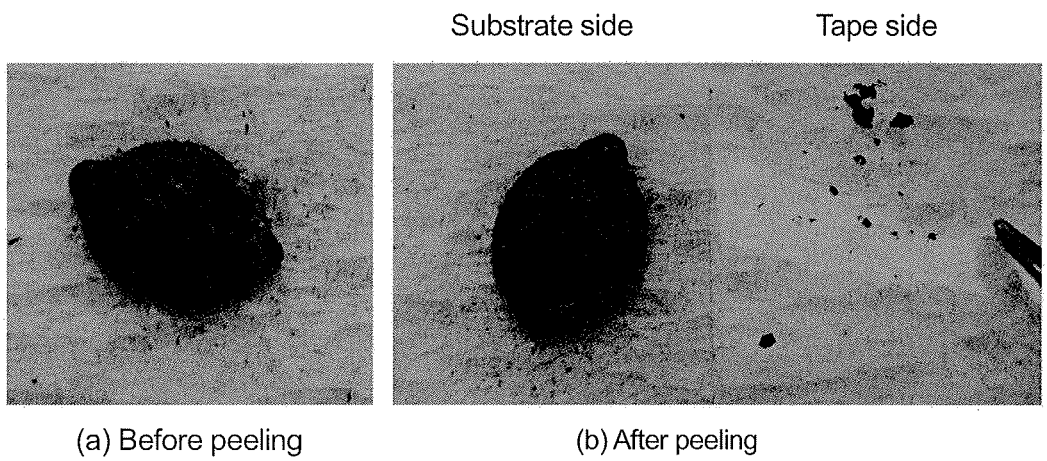
FIG. 10 is a photograph showing the results of a tape peel-off test of an olefin resin substrate on which a conductive polymer-metal complex is precipitated.
Figure 11:
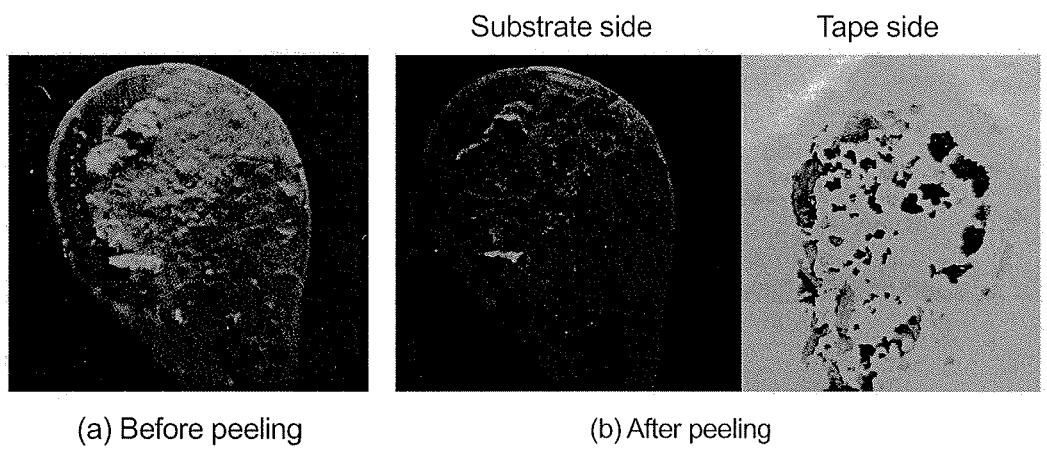
FIG. 11 is a photograph showing the results of a tape peel-off test of a polycarbonate substrate on which a conductive polymer-metal complex is precipitated.
Figure 12:
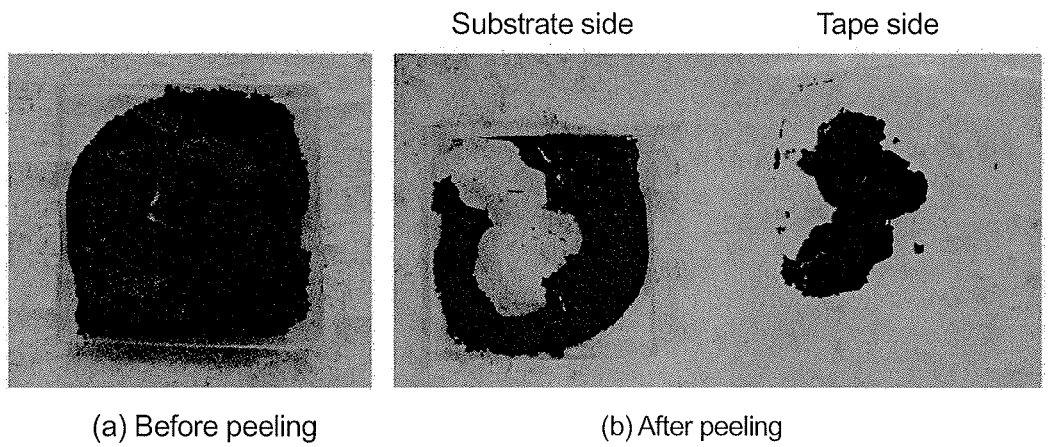
FIG. 12 is a photograph showing the results of a tape peel-off test of a polyethylene substrate on which a conductive polymer-metal complex is precipitated.
Figure 13:
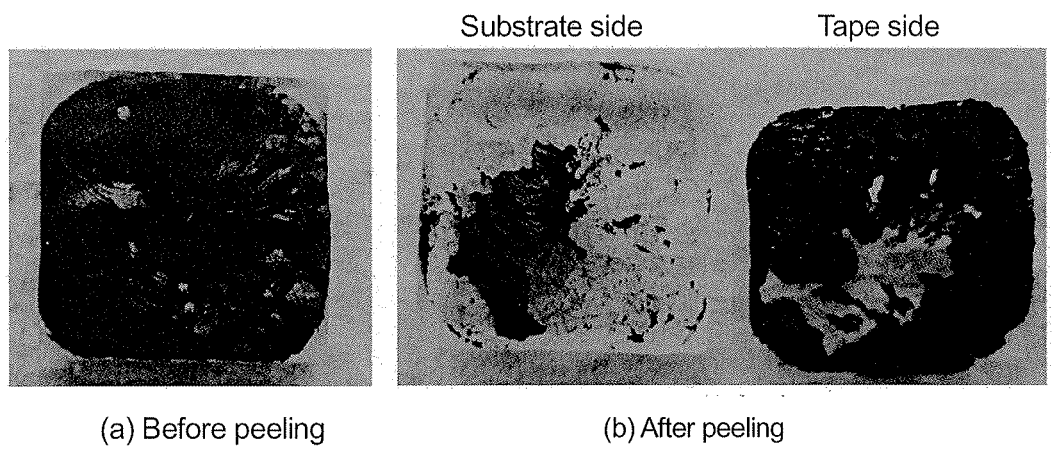
FIG. 13 is a photograph showing the results of a tape peel-off test of an acrylic resin substrate on which a conductive polymer-metal complex is precipitated.
Figure 14:
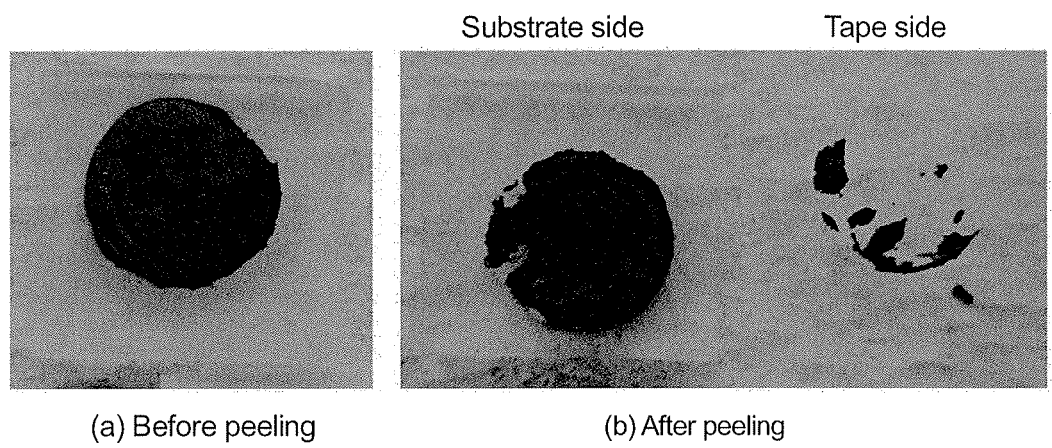
FIG. 14 is a photograph showing the results of a tape peel-off test of a silicone rubber substrate on which a conductive polymer-metal complex is precipitated.
Figure 15:
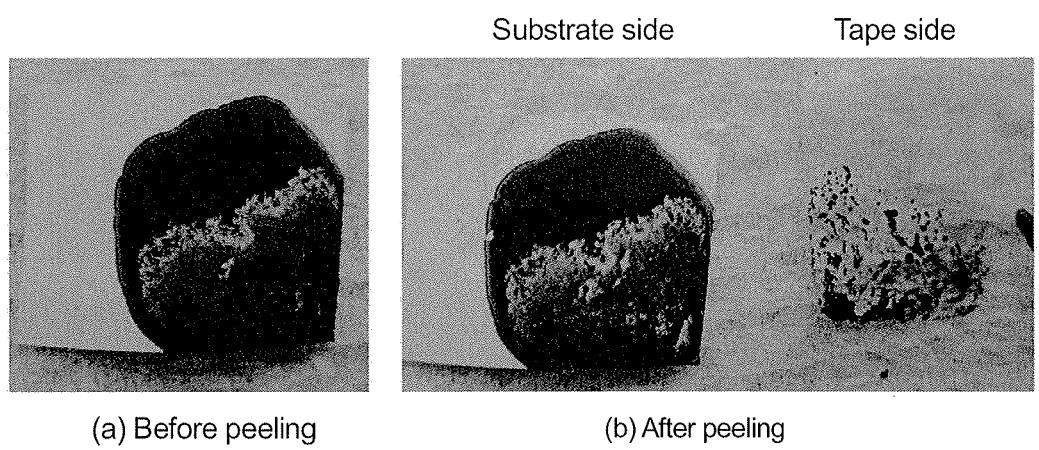
FIG. 15 is a photograph showing the results of a tape peel-off test of a plain paper substrate on which a conductive polymer-metal complex is precipitated.
Figure 16:
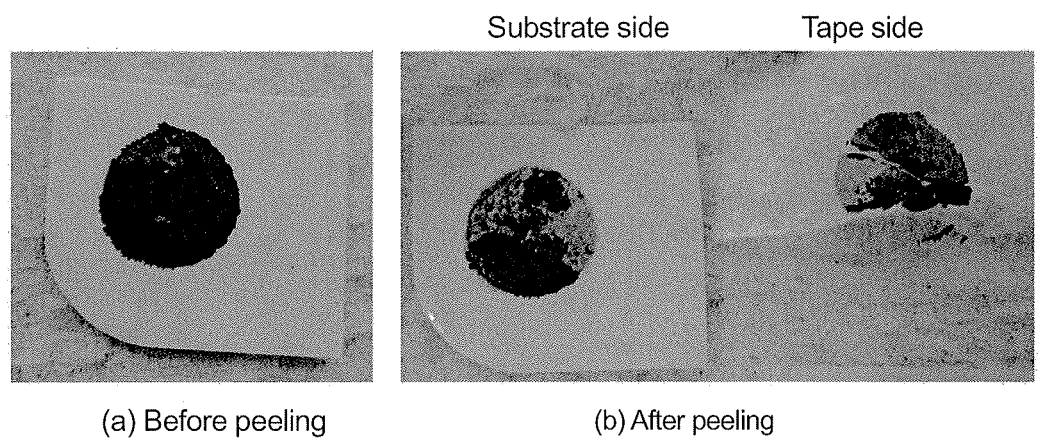
FIG. 16 is a photograph showing the results of a tape peel-off test of a glossy paper substrate on which a conductive polymer-metal complex is precipitated.
Figure 17:
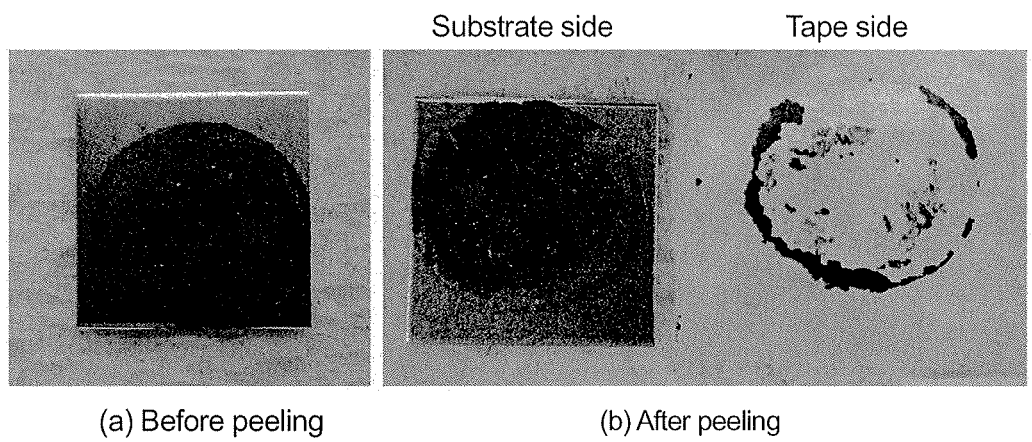
FIG. 17 is a photograph showing the results of a tape peel-off test of a metal titanium substrate on which a conductive polymer-metal complex is precipitated.
Figure 18:
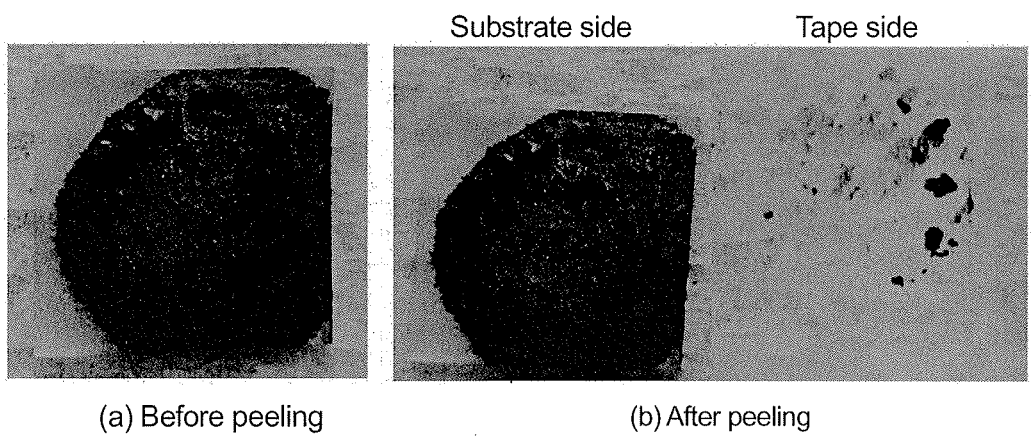
FIG. 18 is a photograph showing the results of a tape peel-off test of a glass substrate (blast-treated surface) on which a conductive polymer-metal complex is precipitated.

Also for the purpose of clarifying the structure of the conductive polymer-metal complex used in the present invention at nano level, the SEM image of the surface of the precipitated conductive polymer-metal complex was investigated. FIG. 5A, which is not intended to be limitative, shows the SEM image at 4 magnifications of the surface of the conductive polymer-metal complex precipitated under the condition employed in Experimental No. 3, as an example, in Table 2, which used a solution obtained by dissolving polypyrrole as a monomer at a concentration of 0.2 mol/L and $Ag^+$ in the form of silver nitrate as a metal ion at 1 mol/L in acetonitrile. The light irradiation time period employed here for precipitation was 120 minutes. In FIG. 5A, the SEM image at a low magnification (FIG. 5A (a)) exhibited particles having a diameter of 5 to 20 μm on the surface of the precipitate. The SEM image at higher magnification (FIG. 5A (b)) exhibited several granular particles, which particles were constituted from further smaller particles of submicron sizes. The surface of the granular particle was covered mostly with these further smaller particles. In the SEM image at further higher magnification (FIG. 5A (c)), the aforementioned further smaller particle was observed in a form of a granular aggregate having a high luminance, and they were present on dark cylindrical bodies attached to each other each having a thickness of 0.1 to 1 μm. In the SEM image (FIG. 5A (d)) at the highest magnification in FIG. 5A, the aforementioned further smaller highly illuminant particle having a size of 10 to 200 nm was observed on the dark cylindrical body The highly illuminant particle and the dark cylindrical body are considered to be a metal silver and a polymer, respectively. Such a structure of the conductive polymer covered with the metal particles in a shell form is indicated conceptually in FIG. 5B.

Based on these microscopic observation, the growth mechanism, of the conductive polymer-metal complex used in the present invention is suggested. While a polymer tends to grow in one-dimensional direction, a metal (silver here in a typical experiment) tends to grow in three-dimensional direction as being precipitated on the polymer surface. Thus, the metal nanoparticles tend to present exclusively on the surface in a manner covering the surface of the polymer cluster (see FIG. 5A (c), (d) and the like) instead of being embedded in the inside of the polymer thereby being covered by the polymer, although a part of them may be enclosed in the inside of the polymer. As a result, the conductive polymer-metal complex used in the present invention allows at least a part of the components having higher conductivities among various components which constitute the complex to be gathered on the surface of the complex as being exposed externally (i.e., not covered with the polymer), resulting in an increase the conductivity of the entire complex. In addition, since the polymer tends to grow in the one-dimensional direction, a structure having a high aspect ratio such as a rod or a string (hereinafter referred to as a linear body) appears on the surface, resulting in a larger surface area even with the same volume. In this Reference Example, such a linear body has an aspect ratio of about 2 to 10. Because of such a structure, the number of the paths having higher conductivities enabling easy run of the current is increased, resulting in a further increased conductivity of the complex. Moreover, since the central part of this structure is occupied mostly by the polymer, this part becomes to possess a high flexibility. In the conductive polymer-metal complex dispersion liquid described below, this complex is dispersed, in a liquid, in the form of microparticles whose growth degree are lower when compared with that in this Reference Example. In the case of such complex microparticles, the metal nanoparticles are gathered less densely on the surface of the complex than in FIG. 5A and FIG. 5B. Nevertheless, even in such a case, the metal nanoparticles in the complex may be brought into contact with each other, but never be connected into one, or never be grown too larger to impair the flexibility. Therefore, the conductive polymer-metal complex as a solid body obtained from the conductive polymer-metal complex dispersion liquid by aggregation and the like also exhibits a high conductivity together with a high flexibility.

Reference Example 3

An example of the behavior of a reaction system in which both of a light and a heat are employed as energies upon precipitating the conductive polymer-metal complex is shown below.

The substrate employed was a silica glass (8×8×0.9 mm), and this substrate was immersed in an acetonitrile solution containing silver nitrate (1.0 mol·dm$^{-3}$) serving as sources of a metal cation and a doping anion and pyrrole (0.5 mol·dm$^{-3}$) as an organic monomer. The reaction system was subjected to light irradiation using an ultra high pressure mercury lamp (bright line wavelength: 436 nm, 405 nm, 365 nm) with the intensity being set at 30 mW·cm$^{-2}$ or 60 mW·cm$^{-2}$. The reaction system was heated using a hot plate and the temperature was set at 50° C. or 70° C. The temperature of the reaction system when not heated was 30° C.

When the light irradiation was not performed and the heating temperature was changed, the solution remained transparent at 30° C. and 50° C. regardless of the time elapsed. When heated at 70° C. without light irradiation, a black precipitate was obtained and increased along with the time. These findings are in consistent with the report that black agglomeration of silver particles covered with polypyrrole was produced (Non Patent Literature 5).

On the other hand, when the intensity of the light irradiation was changed in a non-heating state (30° C.), when the light irradiation was not conducted, the solution remained transparent regardless of the time elapsed. With a light irradiation intensity of 30 mW·cm$^{-2}$, the solution became yellowish transparent along with the time, and no change was observed after 30 minutes of the reaction time or later. With an irradiation intensity of 60 mW·cm$^{-2}$, the time period until the yellow color became deep was short, and a black-mixed silver precipitate was observed after 10 minutes or later, and was increased until 60 minutes later, after which there was no change.

When both of the light irradiation intensity and the heating temperature were changed, a black-mixed silver precipitate was observed, and its production increasing rate tended to be higher as the light irradiation intensity and/or the temperature was raised. Since the precipitate under the light irradiation has a structure in which the surface of the conductive polymer was covered with the microparticles of the metal silver, the silver precipitate was considered to be an agglomeration of such microparticles.

Based on the behavior of the aforementioned reaction system, it was clarified that, in the reaction for forming a complex of a conductive polypyrrole with a metal silver and a metal, a structure in which the silver covers the polypyrrole surface can readily be formed by light irradiation. It was also clarified that the precipitation reaction rate can mainly be improved by heating under the light irradiation.

While both of the light and the heat were employed in the aforementioned Reference Example as energies given for precipitating the conductive polymer-metal complex, it is possible to use both of light and sound. While any sound in general can simultaneously be employed, ultrasonic waves having a frequency of 20 kHz or more are employed preferably. It is also possible to use ultrasonic waves within the range of about 20 kHz to 100 kHz which is employed for example in an ultrasonic washing machine. Using such an irradiation with sound such as ultrasonic waves, it is possible to control the length or the aspect ratio of the polymer constituting the resultant particle as well as the particle size of the metal particle. Such a control utilizes a particle size-reducing effect which is a phenomenon observed frequently when using the ultrasonic waves for dispersing emulsion or dissolving powders in a liquid.

Reference Example 4

In order to investigate the adhesion between the conductive polymer-metal complex used in the present invention and the substrate, a tape peel-off test was performed under the following condition.

In order to prepare a thin sample having a small film thickness, a complex as being dispersed preliminarily in a solution (possibly having a particle size smaller than that in Reference Example 1) was made, and this solution was added dropwise onto various substrates to be subjected to the tape peel-off test and then dried.

More detailed experiment conditions are described below.
Solution prepared
  Pyrrole concentration: 0.2 mol/L
  Metal (Ag) ion concentration: 1.0 mol/L
  Anion: $NO_3^-$, Anion concentration: 1.0 mol/L
  Solvent: Acetonitrile (pyrrole was dissolved in 10 ml of acetonitrile)
Polymerization processing
The aforementioned solution was placed in a cell (small and thin container) having the following structure, and using a light at a bright line wavelength of 436 nm, 405 nm or 365 nm and an intensity of 60 mW/cm$^2$, the polymerization was performed for 10 minutes at room temperature.
Cell structure: Obtained by cutting a 1-mm thick Si sheet and sandwiching the circumference between a 1-mm thick optical glass.
Processing for adhering complex to substrate as test subject
A solution in which the complex after the polymerization processing was dispersed was added dropwise using a micropipette onto the substrate as a test subject. The volume to be added dropwise was constant at 50μ. The substrate after adding the solution dropwise was allowed to dry in a draft chamber. The sample was allowed to dry under a lighting condition which was not a complete darkness but an ordinary room light condition for indoor work (under a fluorescent lamp). The quantity of the illumination irradiated during drying when measured by an accumulated light meter was 1 mW or less.
Tape peel-off test
The tape peel-off test is one of the peel-off tests among the adhesion testing method for plating (JIS-H8504). This test examines the adhesion of a plating by bonding a tape having an adhesiveness onto a plated surface and peeling the tape off rapidly and strongly. The tape peel-off test is suitable generally to a relatively thin plating such as a noble metal plating, and not suitable to a thick plating. Nevertheless, since it is used for a verification test of a final product because it becomes a non-destructive test if the adhesive is satisfactory, this tape peel-off test was employed here for examine the adhesive between the conductive polymer-metal complex of the present invention and the substrate.

The results of the test performed as described above are shown in Table 4 and FIG. 6 to FIG. 19.

TABLE 4

| Substrate | Results | Remarks |
|---|---|---|
| ABS resin | ○ | |
| Polypropylene (PP) | ○ | |
| Teflon (PTFE) | ○ | |
| Polyvinyl chloride (PVC) | ○ | |
| Olefin resin | ○ | |
| Polycarbonate (PC) | Δ | |
| Polyethylene | X | |
| Acrylic resin | X | Substrate surface dissolution |
| Silicone rubber | ○ | |
| Plain paper | Δ | |
| Glossy paper | X | |
| Metal titanium | Δ | |
| Glass (surface blast treatment) | ○ | |
| Glass (non-surface blast treatment) | X | |

As shown in Table 4 and FIG. 6 to FIG. 10, FIG. 14 and FIG. 18, when using as a substrate an ABS resin, polypropylene, Teflon (Trade Mark), polyvinyl chloride, olefin resin, silicone rubber and glass (surface blast treatment), the adhesion between the conductive polymer-metal complex of the present invention and the substrate was satisfactory (○).

Figure 19:
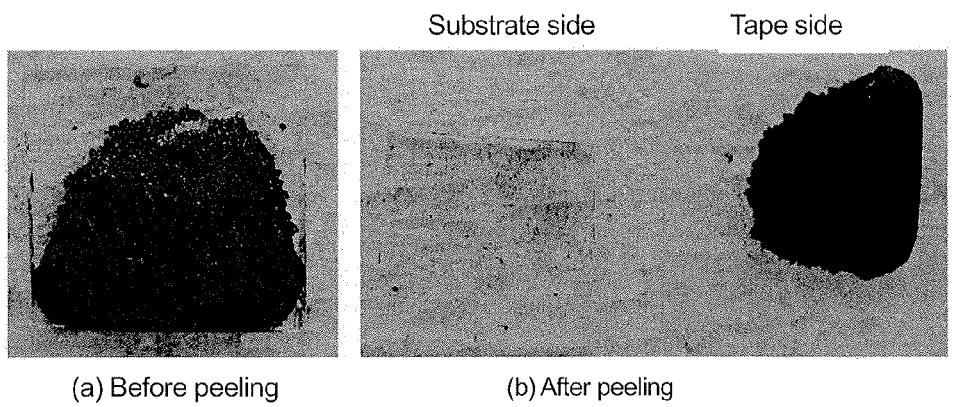
FIG. 19 is a photograph showing the results of a tape peel-off test of a glass substrate (non-treated surface) on which a conductive polymer-metal complex is precipitated.

Some of the substrates exhibited the experimental results indicating that the adhesion was insufficient (x), or substantially poor (Δ) (FIG. 11 to FIG. 13, FIG. 15 to FIG. 17 and FIG. 19), which do not means that the complexes of the present invention do not always suit generally to the relevant substrates. As evident from the results of the tape peeling test indicating that a glass having untreated surface (i.e., an extremely smooth glass: FIG. 19) and a glass having blast-treated surface (having rough surface by being jetted with a blast agent)(FIG. 18) as a substrate gave a substantial difference in the adhesion, the physical state of the surface of the substrate (such as surface roughness) has a substantial influence on the adhesion. Accordingly, it is possible that, even in the case of the substrate exhibited unsatisfactory results of the tape peel-off test of this Reference Example, if another certain substrate of the same type is used, a satisfactorily adhesion can be obtained due to the difference in the starting material or the manufacturing method employed actually in manufacturing the substrate or in the subsequent processing method.

In any case, the utility of this complex capable of achieving a highly adhesion even with Teflon (Trade Mark) usually exhibiting an extremely poor adhesion only by using a plain adhering method applicable simply to a wide range of the conditions in which the solution in which the complex after the polymerization processing is dispersed is just added dropwise and then dried is considered to be extremely high.

It should be understood that the highly adhesion observed in the results of the adhesion test (tape peel-off test) especially when using as a substrate Teflon (Trade Mark) or polypropylene as a substrate is noteworthy. This understanding is based on the recognition that the surface energy of Teflon (Trade Mark) or polypropylene is low and its adhesion to different materials is poor. Accordingly, in order to know the adhesion of Teflon (Trade Mark), the sectional image was investigated.

Figure 20:
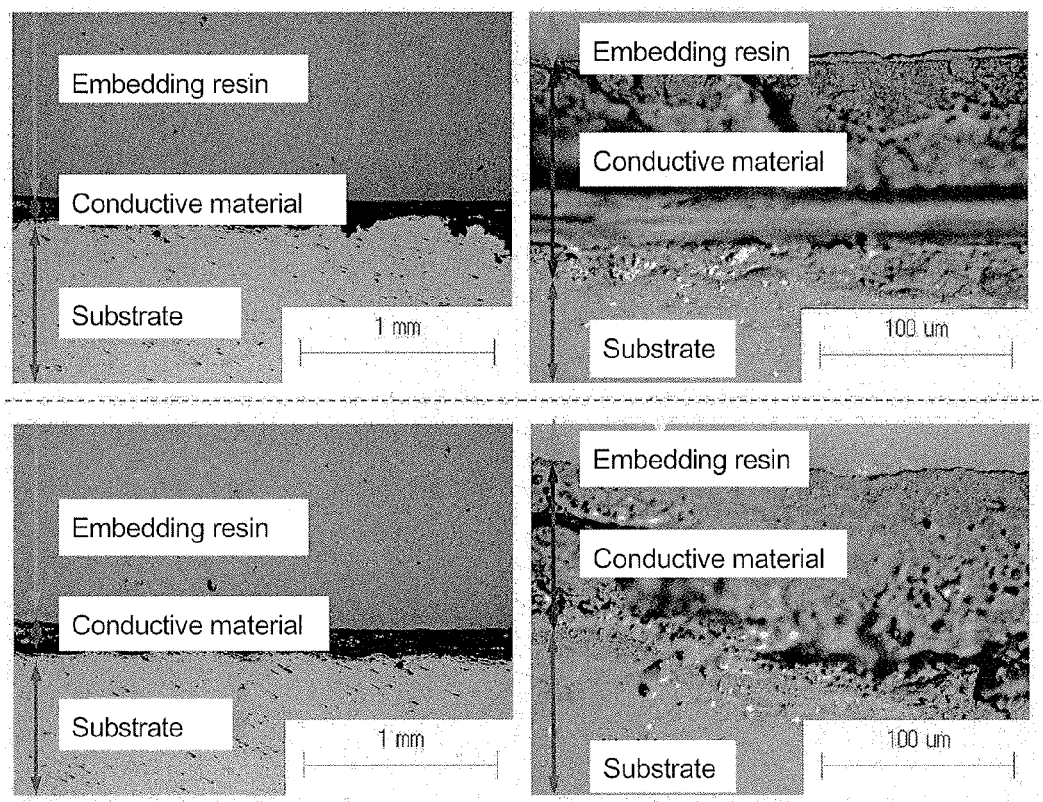
FIG. 20 is a microscopic photograph showing the section of a conductive material on a Teflon (Trade Mark) substrate by an embedding method.

Focusing on the fact that in the adhesiveness the conductive polymer-metal complex used in the present invention exhibited a high adhesion to Teflon (Trade Mark) which adhesion to an ordinary material such as adhesives or various paints is known to be extremely poor, a section of the both which are in a adhesion was prepared and its microscopic photograph is shown in FIG. 20.

In the photograph, one indicated as "embedding resin" is one which is used for exposing the section to be observed by "embedding" a sample in a "resin" such as an epoxy resin which is then polished. Two pair of the photographs at low and high magnifications are shown because of the reason as follows. Since the material observed here is a novel material and has no established method for preparing a section thereof, no smooth surface was obtained satisfactorily throughout the entire field of vision (the entire field of vision is not focused on correctly). Accordingly, each of the two observed fields of vision was indicated as photographs at low and high magnification with its conditions of section preparation and photographing being consistent with each other as possible, thereby allowing them to be observed as comparable morphologies of the sections.

In the photograph of the section, when viewing the interface between the conductive material which is the conductive polymer-metal complex used in the present invention and the substrate made from Teflon (Trade Mark), it is known that even into extremely fine protrusions and recesses of the substrate the conductive material has entered and the adhesion has been established almost to a level of integration without undergoing any peeling even when viewing the photograph in the right side which is the photograph of the section at the higher magnification. In addition, both of the 2 sections exhibited the states of the adhesion which are completely the same, which suggests that it is highly possible that any other sections are in similar conditions.

It is well known that Teflon (Trade Mark) is not dissolved in an ordinary solvent, and the solvent used for applying and forming this conductive material on the substrate is not able to dissolve as a matter of course. Nevertheless the both are adhesive to each other to a level that there was no gap between the both, which should be noted.

Reference Example 5

Figure 21:
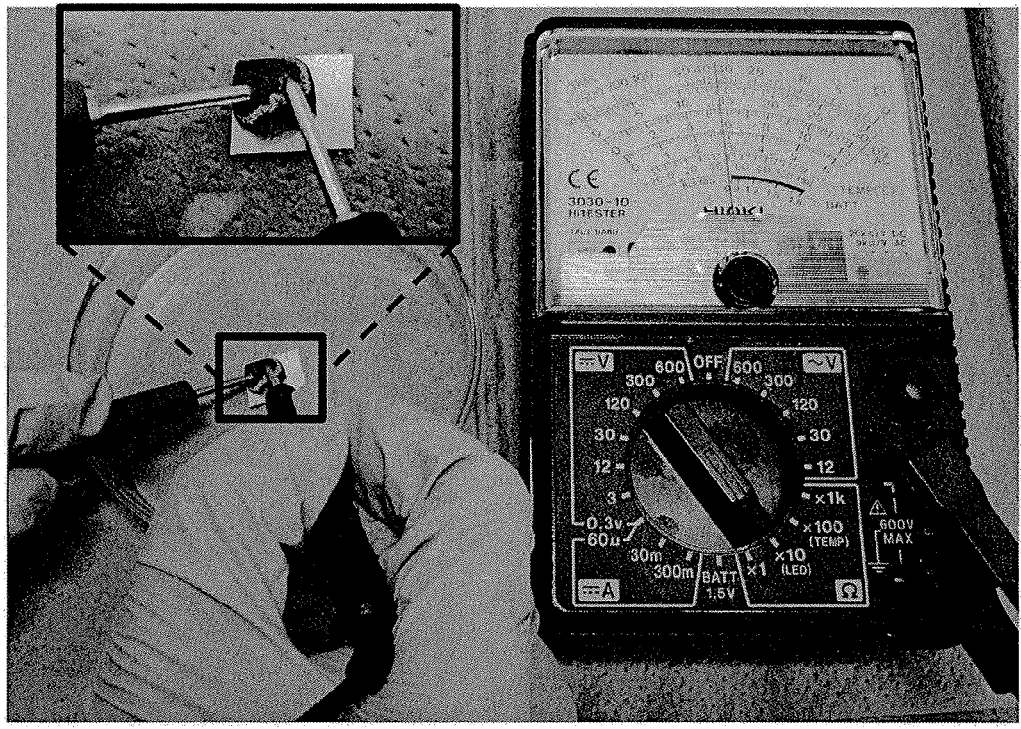
FIG. 21 is a photograph showing a conductive polymer-metal complex sticking on substrate and the method for determining the resistance of this complex.
Figure 22:
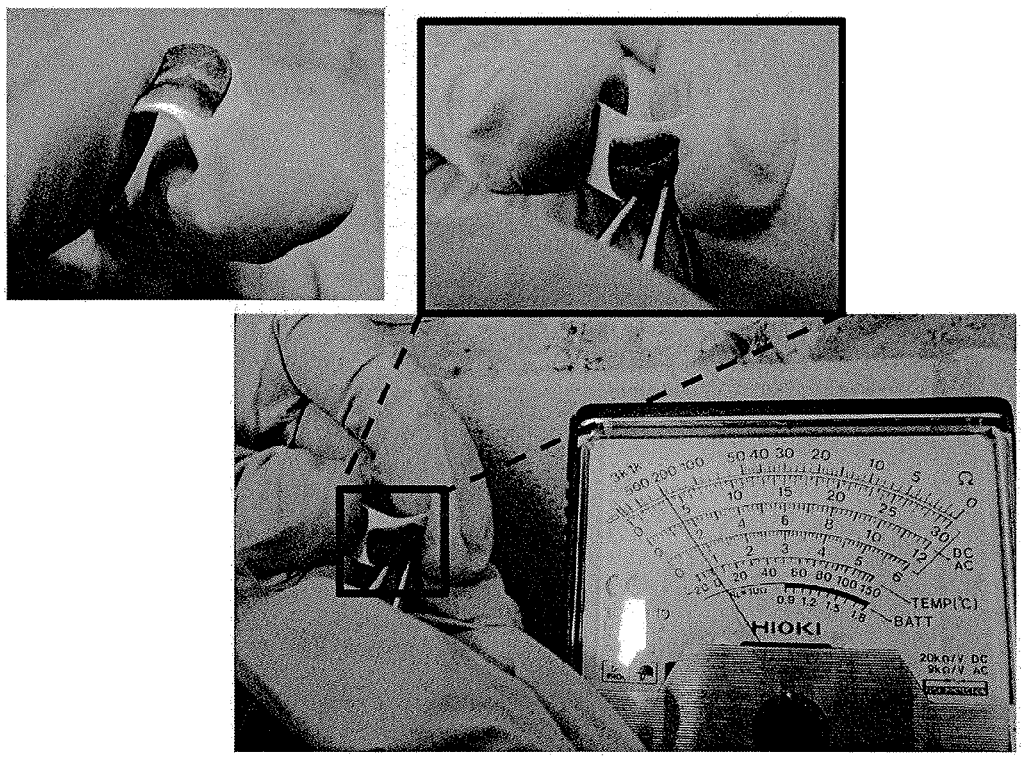
FIG. 22 is a photograph showing the results of a folding test of a conductive polymer-metal complex sticking on substrate.

The results of a bending test of the conductive polymer-metal complex sticking on substrate of the present invention are shown in FIG. 21 and FIG. 22.

In order to clarify that even when the conductive polymer-metal complex used in the present invention was formed on a pliable material the complex can fully tolerate such a deformation of the substrate without any peeling and maintains the conductivity even in a substantially deformed condition, the conductive polymer-metal complex of the present invention was formed on a paper substrate and subjected to an experiment in which the substrate was deformed intentionally. The conductive polymer-metal complex of the present invention formed on the substrate here was one made from the polymer and the metal employed in "tape peel-off test".

The first photograph in FIG. 21 shows the complex sticking on substrate made as described above. A measurement was made using a tester to show that this complex has a low resistance (measured resistance: about 340Ω).

This sample was folded substantially to the extent that the right and the left of the substrate are in an angle of approximately 90°, but no peeling was observed as shown in the second photograph in FIG. 22. Although it should be noted that, when the resistance in this state was measured, there was a difficulty in ensuring an equality in measurement points or measurement probe pressure between the non-deformed condition and the deformed (folded) condition which makes it impossible to compare the both measured values directly, the measured resistance was as satisfactorily low as 2 k$\Omega$, which proved that the conductivity did not diminish even after bending.

Example 1

By applying a dispersion liquid of the conductive polymer-metal complex manufactured by the method similar to that in Reference Example 4 to a substrate using an inkjet or a dispenser, a uniform thin layer of this conductive polymer-metal complex can be formed on the substrate with a high precision. The detailed description is made below.
A suspension was manufacture as described below.
Solution prepared
Pyrrole concentration: 0.5 mol/L
Metal (Ag) ion concentration: 1.0 mol/L
Anion: $NO_3^-$, Anion concentration: 1.0 mol/L
Solvent: Acetonitrile (pyrrole was dissolved in 10 ml of acetonitrile)
Polymerization processing
The aforementioned solution was placed in a cell (small and thin container) having the following structure, and using light at a bright line wavelength of 436 nm, 405 nm or 365 nm and an intensity of 50 mW/cm$^2$ or more, the polymerization was performed for 10 minutes at room temperature.
Cell structure: Obtained by cutting a 1-mm thick Si sheet and sandwiching the circumference between a 1-mm thick optical glass.

Figure 23:
FIG. 23 is a photograph showing the appearance of the conductive polymer-metal complex dispersion liquid.

By performing the aforementioned processing, a transparent solution was obtained. This solution is a dispersion liquid in which the conductive polymer-metal complex is dispersed. FIG. 23 is a photograph obtained by observing this dispersion liquid using transmission light. While the actual color is not known from this monochromic FIG. 23, this dispersion liquid exhibited a beautiful blue color.

Figure 24:
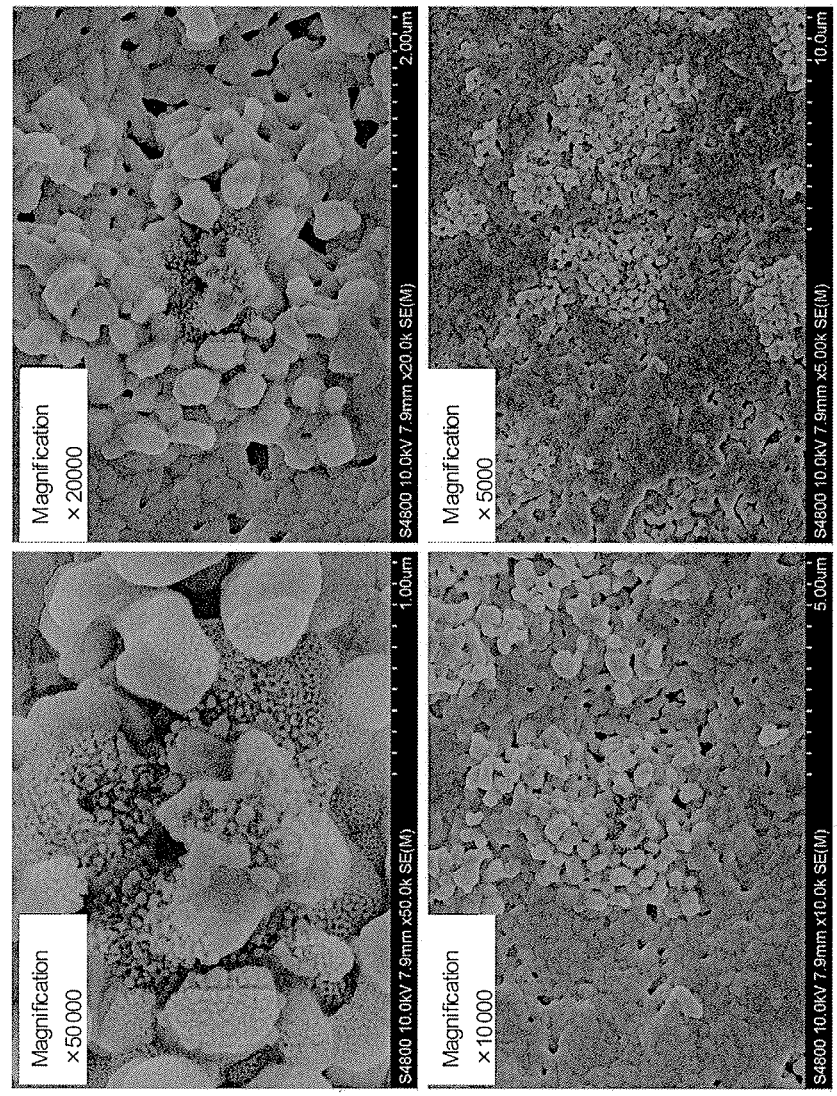
FIG. 24 is an SEM image showing the conductive polymer-metal complex dispersion liquid as being dried.

The SEM image of this dispersion liquid (here the intensity of the irradiated light was 60 mW/cm$^2$) when dried after being dropped was shown in FIG. 24. Based on this figure, it is known that the structure had primary particles having sizes of 200 to 300 nm which were aggregated. However, the primary particles observed here were those after drying the dispersion liquid, and there is a possibility that the particle size was further smaller in the dispersion liquid. For example, Patent Literature 4 describes that gold or silver colloid exhibits blue color with a particle size of 70 to 80 nm. When referring to other several reports, there is a possibility of blue color illumination with a particle size within the range of 50 to 100 nm. The fine protruded part (see photographs in FIG. 24, especially at a magnification of 50000) appearing on the surface of the primary particle is considered to be a silver particle appearing on the surface of the primary particle.

While in Reference Example 1 and the like the conductive polymer-metal complex precipitated upon synthesis on the substrate, no such a precipitation occurred in this Reference Example with the dispersion in the reaction solution being maintained. When this dispersion liquid was stored in a refrigerator in 2 weeks, no change was observed, indicating a high storability and stability.

The reason why the aforementioned difference is observed between this Example and Reference Example 1 etc. may exist in the manner of the light irradiation upon the reaction. Thus, in Reference Example 1 etc., the solution was placed in a container whose diameter and depth were not different extremely and then was irradiated with the light. In such a manner of the light irradiation, there is a difference in the light intensity between the solution in front and the solution in back when observed from the direction of the light irradiation, and the reaction employing the light tends to less proceed in back. As a result, the number of the nuclei formed even irradiated with the light in the same quantity is smaller in Reference Example 1 etc., and the growth of the nucleus is more preferential than the formation of the nucleus, resulting in a greater particle. On the contrary, this Example employs the container (cell) in which the reaction occurs has a thickness as extremely small as 1 mm when compared with Reference Example 1 etc., which allows each small part of the solution in the cell to receive the light irradiation at the almost similar intensity when the light is irradiated uniformly from the direction almost perpendicular to the cell plane. As a result, the nucleus is formed in every place in the solution contained in the cell. Accordingly, it is possible that the formation of the nucleus becomes more preferential than the growth of the nucleus in this Example unlike to Reference Example 1, resulting in formation of a larger number of the highly uniform fine particles.

While in the aforementioned example the case employing a cell thickness, of 1 mm was described, other experiment gave the dispersion liquid similar to that described above when using a cell having a thickness of 2 mm or less. While the aforementioned example employed acetonitrile as a solvent for dissolving the starting materials of the reaction, any other solvent can be employed as a matter of course. For example, any solvent capable of dissolving the starting material, i.e., monomer, metal ion and doping anion can be employed including water and ethanol. Here, the solubility of a starting material can be raised usually by a polar solvent. On the other hand, the liquid in which the conductive polymer-metal complex is dispersed may preferably be a non-polar solvent assuming from the solvent for dispersing the metal nanoparticles. Accordingly, a solvent mixture of a polar solvent and a non-polar solvent may definitely be effective for the dispersion liquid.

While the dispersion liquid prepared in this Example contained the minimum components, including the conductive polymer-metal complex, the solvent, remainders of the components added for synthesizing the conductive polymer-metal complex, reaction by-products, other impurities and the like, it is possible to add other components as required. For example, those contemplated are components for further improving the stability of the dispersion liquid such as a surfactant, components for improving or adjusting the application performance of the dispersion liquid or the properties of the dispersion liquid compatible to the requirements by an application instrument, components for preventing corrosion or other adverse effect on instruments for applying the dispersion liquid or subjects of application as well as other components for adding any desirable functions to the dispersion liquid. Also with regard to the timings of the addition of such components, addition at any time is acceptable including addition into starting material for synthesizing the conductive polymer-metal complex, addition immediately after synthesis, addition several hours after synthesis, addition immediately before use, and the like.

When the conductive polymer-metal complex precipitate from the dispersion liquid applied onto the substrate, in addition to the precipitation of the complex as itself already existing in the dispersion liquid, an in-situ polymerization/precipitation of some of the components which were added for synthesizing the complex and remained in the dispersion liquid may occur. When such an in-situ polymerization/precipitation occurs, the adhesion between the substrate and the precipitated complex may be promoted because of the effects involving the growth of the complex in the deeper region of a hole on the surface of the substrate or in the circumference of a protruded part as well as the growth of the complex while being bound or adhered closely to the surface of the substrate. Also in a process of aggregation of the microparticles of the conductive polymer-metal complex in the dispersion liquid, the polymerization may proceed on the surface of such microparticles. It is also possible that, upon aggregation of the conductive polymer-metal complex microparticles in a narrow hole on the surface of the substrate, progression of such a polymerization allows the aggregate to be grown into a larger one, or, even if there is no such a growth by the polymerization, bindings due to hydrogen bond or Van der Waals' force and tangling of microparticles with each other may lead to formation of an aggregate having a shape and a size enabling a function as a "closure" which is difficult to be pull out of the narrow hole.

While various techniques and instruments can be employed for applying the dispersion liquid thus prepared to a substrate, an inkjet (Non Patent Literature 7) and a dispenser (Non Patent Literature 8) were employed here to validate that by using the dispersion liquid a conductive polymer-metal complex thin layer (including small dots and fine wires) can be formed.

First, the contact angle of this dispersion liquid was measured using several substrate materials, and was found to be 10.21° for a silica glass, 32.10° a polished silicon wafer whose surface was oxidized naturally, 59.33° for a silicone rubber and 83.78° for PTFE.

Figure 25A:
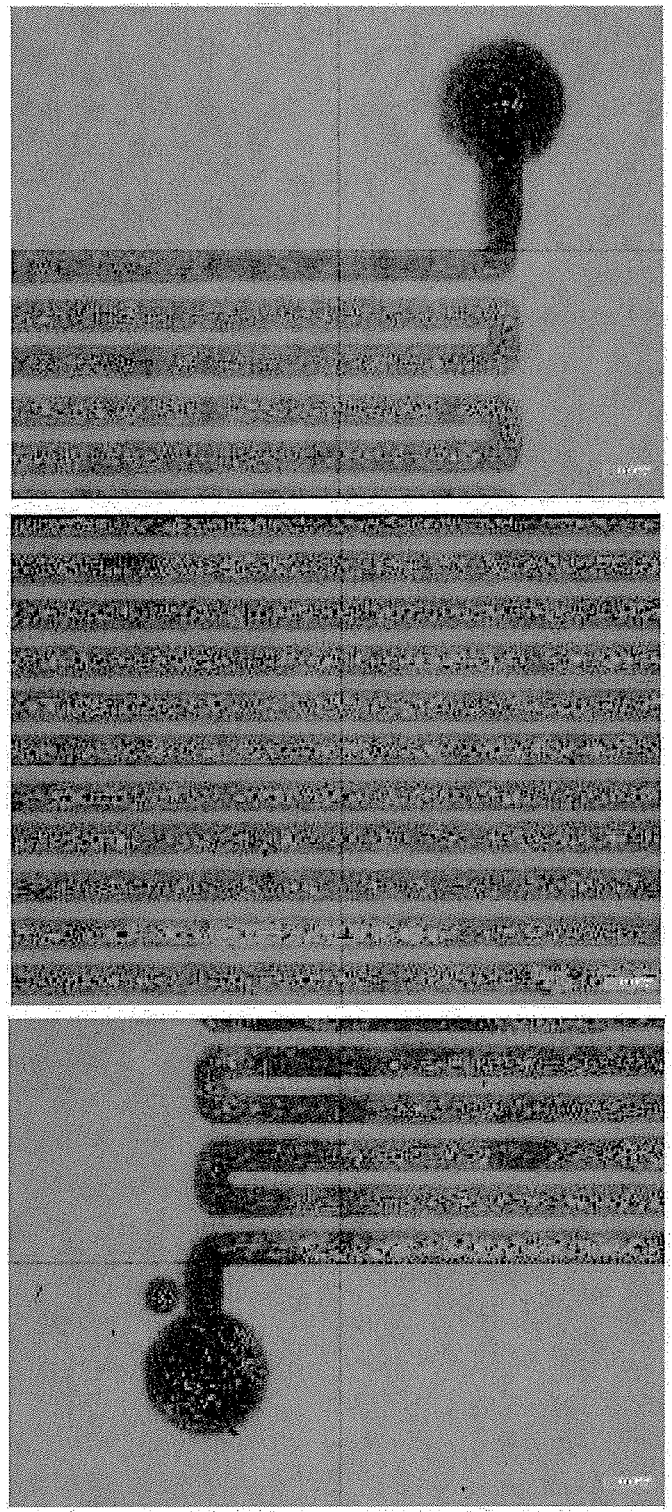
FIG. 25A is a photograph showing a small line pattern formed by applying a conductive polymer-metal complex dispersion liquid using an inkjet.

FIG. 25A shows the photographs (scale: 100 μm) of the starting part, intermediate part and ending part of the product obtained by using this dispersion liquid to draw a zigzag microline pattern on a glass substrate by an inkjet. Based on these, it was clarified that by using this dispersion liquid a small conductive material line having a line width less than 100 μm can be formed precisely.

Figure 25B:
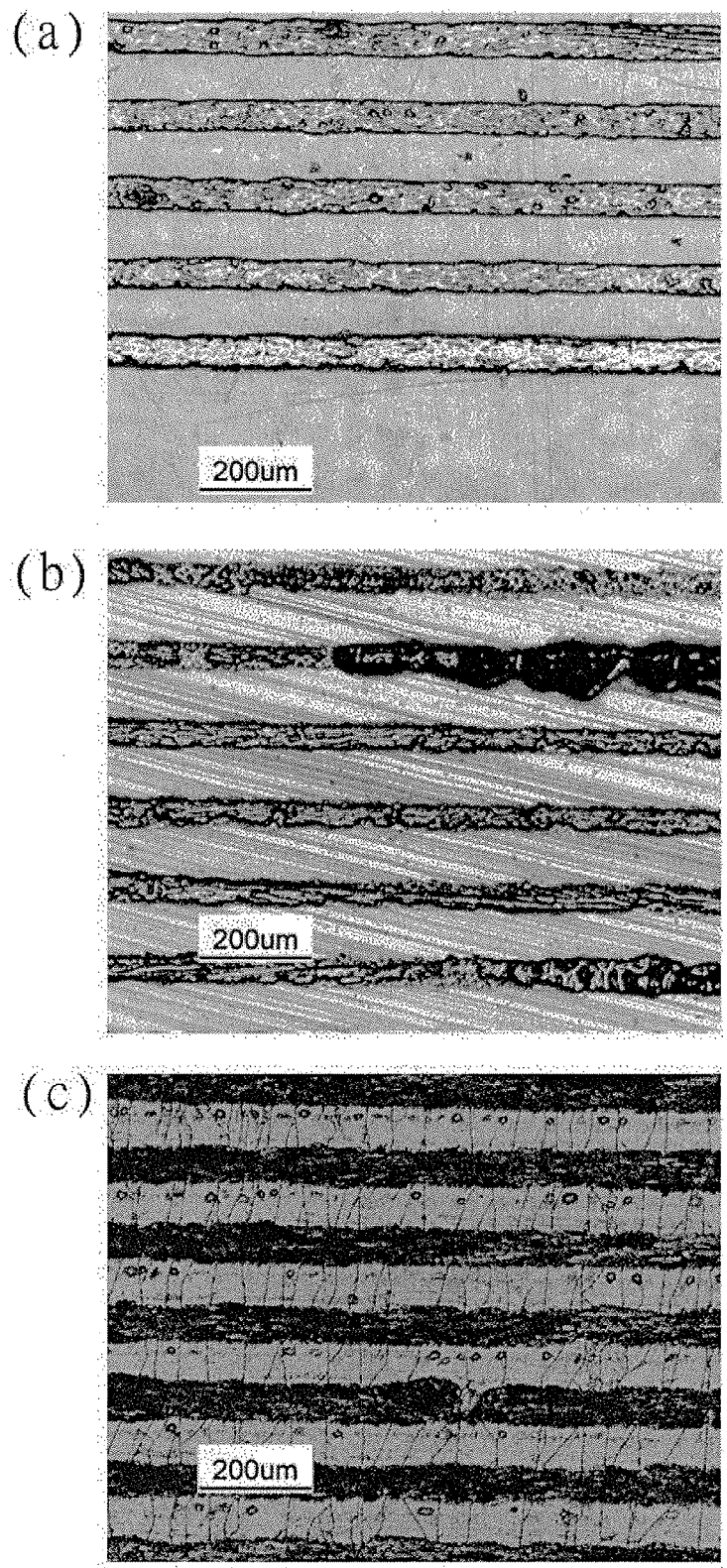
FIG. 25B is a photograph showing a small line pattern formed by applying a conductive polymer-metal complex dispersion liquid onto the substrate of the material which is different from that in FIG. 25A using an inkjet.

FIG. 25B shows the photographs (scale: 200 μm) of the small line patterns drawn on a substrate made from other materials using this dispersion liquid under the condition similar to that indicated in FIG. 25A. FIG. 25B includes the small line pattern formed on the substrates made from (a) polyethylene, (b) polyimide and (c) silicone rubber. As evident from these, it was confirmed that also when using these substrates, small lines of the conductive material less than 100 μm can accurately be formed.

Figure 25C:
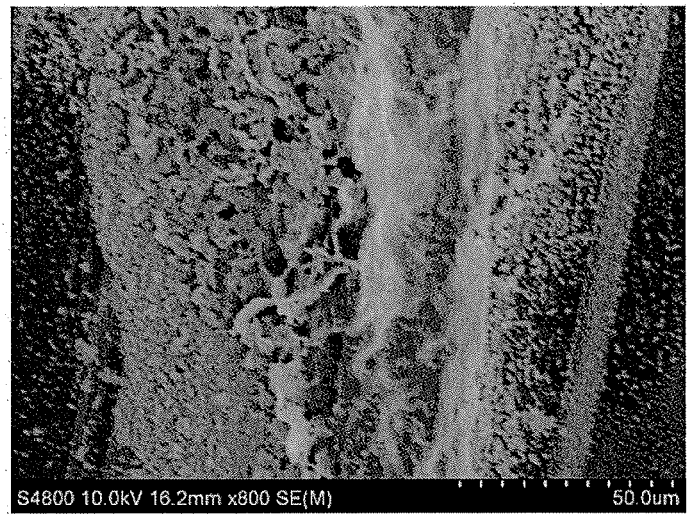
FIG. 25C shows an SEM image indicating the small structure of the small line pattern in FIG. 25B and an image indicating the element mapping for Ag element.
Figure 25C:
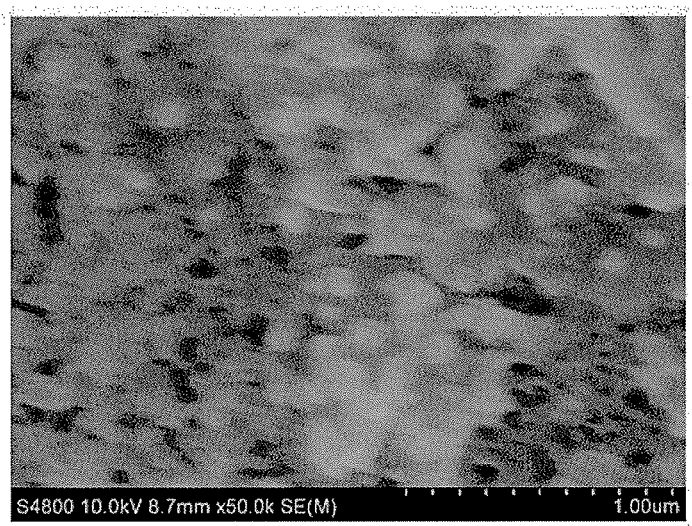
Figure 25C:

FIG. 25C is a figure showing the small structure of the small line pattern formed on the polyimide substrate shown in FIG. 25B(b), and FIG. 25C (a) and (b) are SEM images and (c) is a figure showing in the elemental mapping for Ag element. FIG. 25C(a) is an SEM image of a single small line on the substrate which was rotated by 90 degree and magnified, and the edge of the small line can be seen near the left and right edges of the image in FIG. 25C(a). FIG. 25C(b) is an SEM image at a magnification 50 times that of FIG. 25C, and shows a microparticle of the conductive polymer-metal precipitated from the conductive polymer-metal dispersion liquid. The elemental mapping image in FIG. 25C(c) corresponds to the range in FIG. 25C(a) and shows a uniform dispersion of Ag nanoparticles within the line width of the small line. This internal structure gives a high conductivity and the flexibility to this line pattern.

Figure 26:
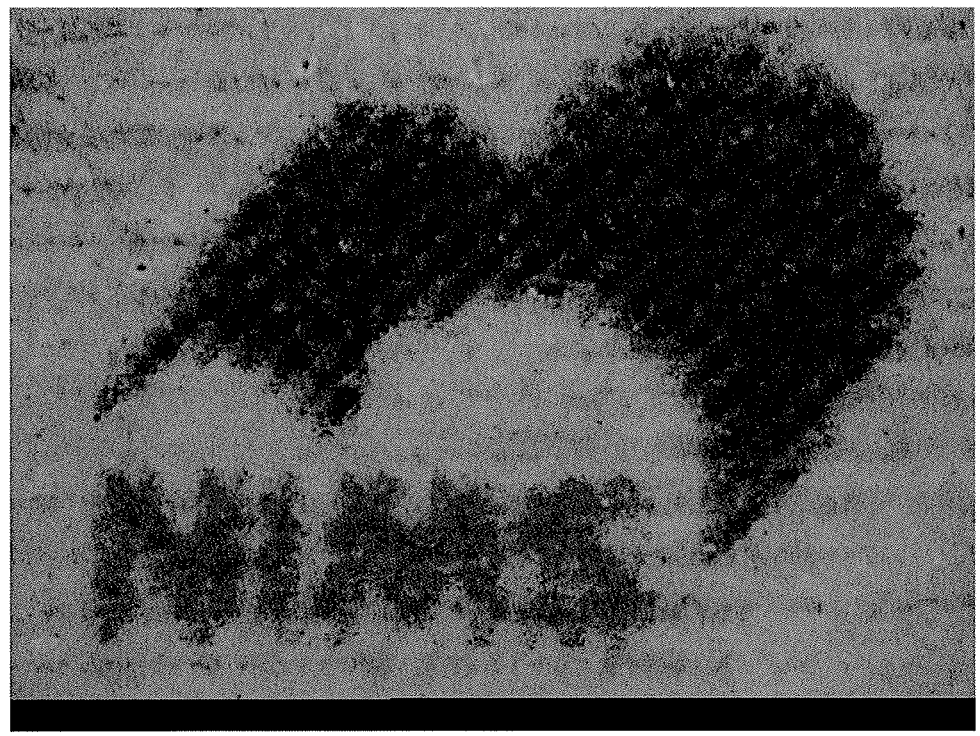
FIG. 26 is a photograph showing a small linear and planar patterns formed by applying a conductive polymer-metal complex dispersion liquid using a dispenser.
Figure 27:
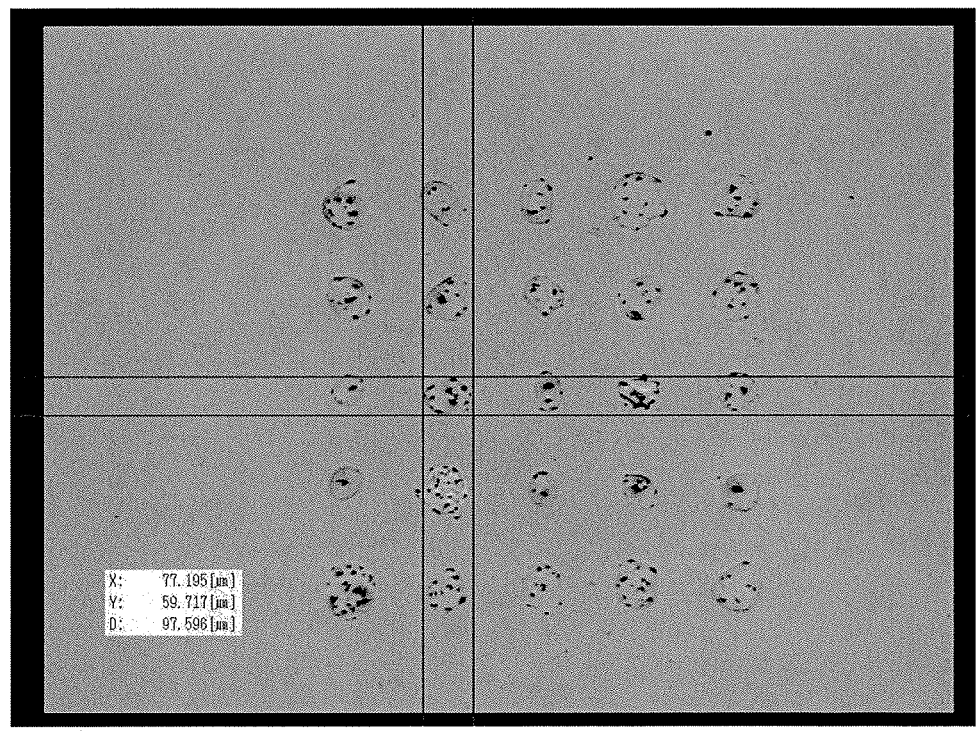
FIG. 27 is a photograph showing a small dot pattern formed by applying a conductive polymer-metal complex dispersion liquid using a dispenser.

FIG. 26 is a photograph showing micrographic linear and planar patterns formed using a dispenser to apply the conductive polymer-metal complex dispersion liquid. FIG. 27 is a photograph showing a micrographic dot pattern also formed using a dispenser. These photographs show that this dispersion liquid can form small patterns accurately even when using a dispenser.

As described above, the conductive polymer-metal complex of the present invention dispersion liquid has a high compatibility with existing techniques and instruments for applying thin layers including fine wires and small dots precisely, and can apply a small and flexible conductive line pattern precisely, readily and strongly onto various substrates shown in Reference Example.

Example 2

If it is possible to adhere the conductive polymer-metal complex thin layer, shown for example in Example 1, onto various substrates such as polymers strongly, utilizations in various electric instruments is achieved preferably. Accordingly, an experiment which is further detailed from the experiment in Reference Example 4 was performed, and the interface where the adhering occurs was observed further precisely using SEM and the like.

Commercially available plastic plates (shown in Table 5) such as PTFE were employed as substrates. Pyrrole (manufactured by Kanto Chemical Co., Inc., reagent grade) as a monomer to be polymerized and silver nitrate ($AgNO_3$, manufactured by Kanto Chemical Co., Inc., reagent grade) as a metal cation ($Ag^+$) source and a doping anion ($NO_3^-$) source were dissolved in acetonitrile ($CH_3CN$, manufactured by Kanto Chemical Co., Inc., reagent grade). The concentrations of pyrrole and silver nitrate were 0.2 mol/$dm^3$ and 1.0 mol/$dm^3$, respectively. This solution was placed in a cubic container. This solution was irradiated via the side wall of the container made from an optical glass with an ultraviolet light for 15 minutes. As a light source, an ultra high pressure mercury lamp (manufactured by USHIO INC., bright line Wavelength: 436 nm, 405 nm and 365 nm, light quantity: 60 mW/$cm^2$) was employed. An aliquot (50 $mm^3$) of the resultant solution was added dropwise onto a board (surface area: 20×20 $mm^2$) and dried to obtain a precipitate.

The adhesion strength between the precipitate and the substrate was evaluated by the peel-off test in accordance with Japanese Industrial Standard (JIS) Z1522. On the surface of the sample having the precipitate adhering onto the substrate, a cellophane tape was stuck and then peeled rapidly off the sample. The conditions of the surface where the tape was stuck and the test surface of the sample were observed.

The surface of the sample after the peel-off test was embedded in the epoxy resin similarly to Reference Example 4, and the section was exposed by slicing and polishing. This section was observed using a scanning electron microscope (SEM, S4800 manufactured by Hitachi High-Technologies Corporation) and an optical microscope (ECLIPSE ME600 manufactured by Nikon Corporation). Furthermore, this section was analyzed by an energy dispersive X-ray spectrophotometer (EDS, EXAM Energy EX-220 manufactured by HORIBA, Ltd.).

Figure 28:
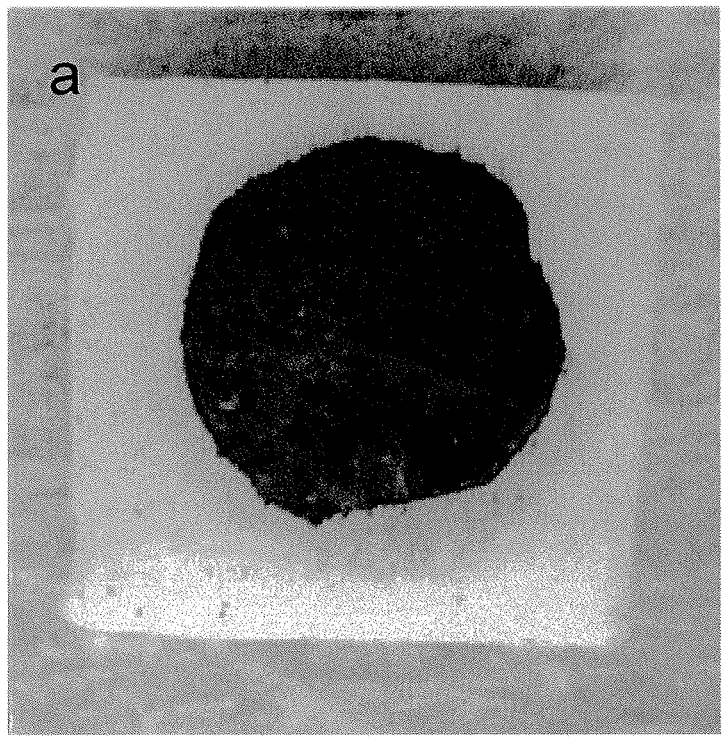
FIG. 28 shows (a) a photograph indicating a sample whose substrate is a PTFE after the peel-off test and (b) a photograph indicating the appearance on the tape side after the peel-off test.
Figure 28:
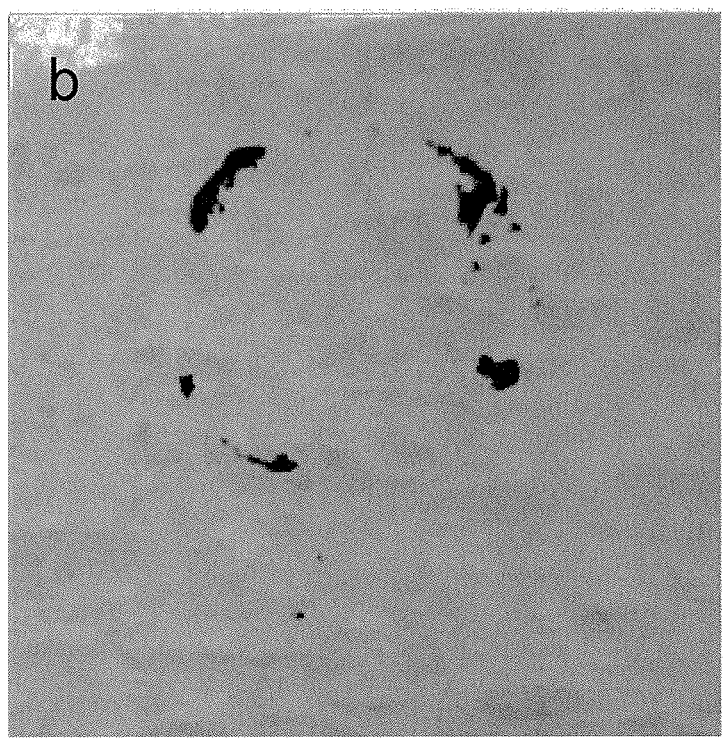

FIG. 28 shows the appearance of the sample after the peel-off test whose substrate was PTFE. Based on the appearance of the sample, the adhesiveness according to the present invention can be defined as follows.

Adhesiveness (%)=[area of precipitate on substrate]/ [total area of precipitate on substrate and tape]

When a precipitate exhibits a strong adhesiveness toward the substrate, the precipitate remains on the substrate against the peeling motion of the adhesive tape, thereby exhibiting a high adhesiveness. Table 5 shows the adhesiveness of the polypyrrole-silver complex prepared as described above toward various plastic substrates and the like. A certain kind of the plastic substrate exhibited an adhesiveness of 90% or more. PTFE, which is known especially to show a low adhesiveness generally to various materials because of its low surface energy, exhibited here the adhesiveness as high as 96%. Other polymers exhibited the adhesivenesses of about 70%. The adhesiveness to the acrylic resin substrate was as relatively low as 14%. The surface of the acrylic resin exposed after the peel-off test seemed to be dissolved.

TABLE 5

| Type of substrate | Adhessiveness |
| --- | --- |
| Acrylonitrile butadiene styrene (ABS) copolymer | 99 |
| Olefin resin | 99 |
| Polypropylene (PP) | 97 |
| Polyimide (PI) | 96 |
| Polytetrafluoroethylene (PTFE) | 96 |
| Polyvinyl chloride (PVC) | 94 |
| Polycarbonate (PC) | 76 |
| Polyethylene (PE) | 67 |
| Acrylic resin | 14 |
| Silicone rubber | 98 |

Figure 29:
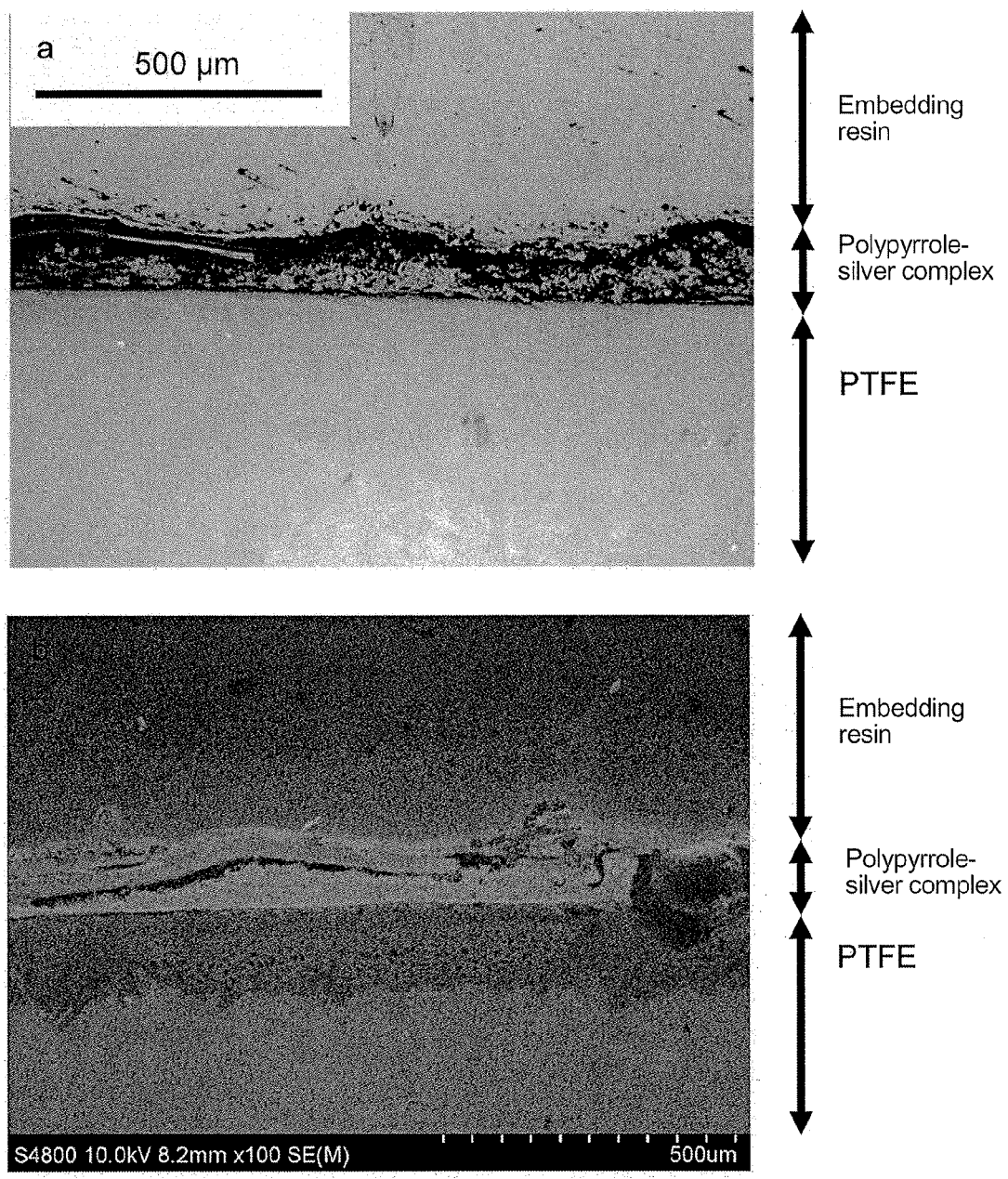
FIG. 29 shows a sectional image of the polypyrrole-silver complex precipitated on a PTFE substrate, including (a) an optical microscopic image and (b) an SEM image at an almost same magnification.

In order to clarify the adhesion mechanism of the conductive polymer-metal complex as a precipitate on a substrate of a plastic etc., the interface structure between the polypyrrole-silver complex prepared as described above and PTFE was investigated below. PTFE was selected here in order to eliminate various chemical factors which may have an influence on the adhering. This is based on the fact that PTFE has generally low reactivities with various materials, and has a low solubility in $CH_3CN$ employed as a solvent in this Example. FIG. 29 shows a sectional image of the polypyrrole-silver complex precipitated on a PTFE substrate. FIG. 29(a) is an optical microscopic image and FIG. 29(b) is an SEM image at an almost similar magnification. No clear segregation between the precipitate and the substrate was observed. A partial exfoliation and cracking were observed in the precipitate layer and near the interface between the precipitate and the embedding resin. They are induced by a stress exerted during the embedding processing and during the section exposing processing.

Figure 30:
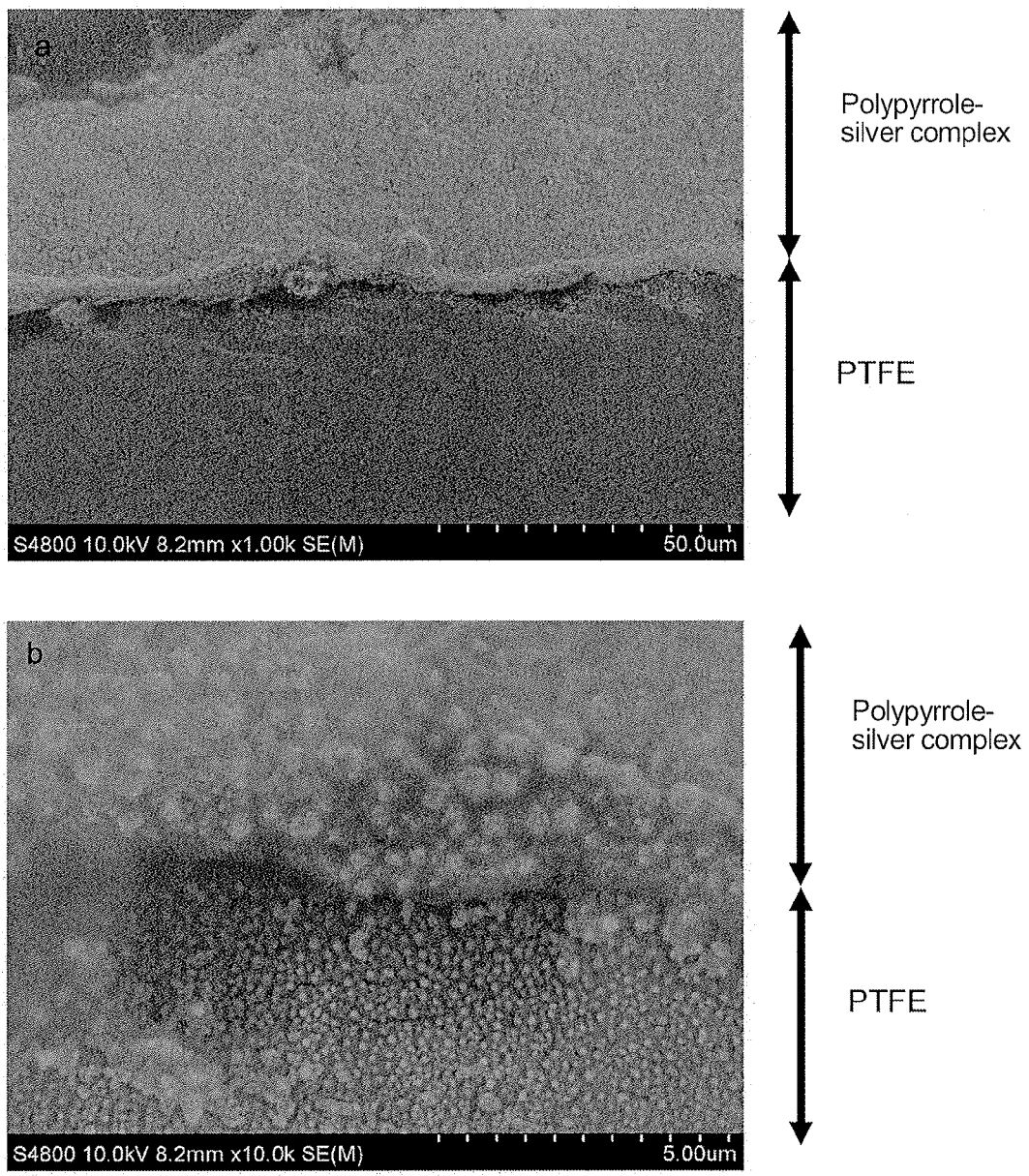
FIG. 30 is an SEM image at a high magnification near the interface between the precipitated polypyrrole-silver complex and the PTFE substrate with (b) being at a higher magnification when compared with (a).

FIG. 30 shows a magnified figure of the part near the interface between the precipitate complex and the PTFE substrate when observed by SEM, and (a) has a higher magnification than (b). Also in these SEM images, no clear segregation of the interface was observed. The complex precipitate had a uniform structure exhibiting no hole or exfoliation. The SEM image at a high magnification exhibited agglomerations having sizes of about 500 nm to 1 μm in the precipitate layer. These agglomerations consisted of microparticles having sizes of about 100 nm. Under the interface, these particles having same sizes were dispersed. These particles are considered to be of the pyrrole-silver complex.

Figure 31:
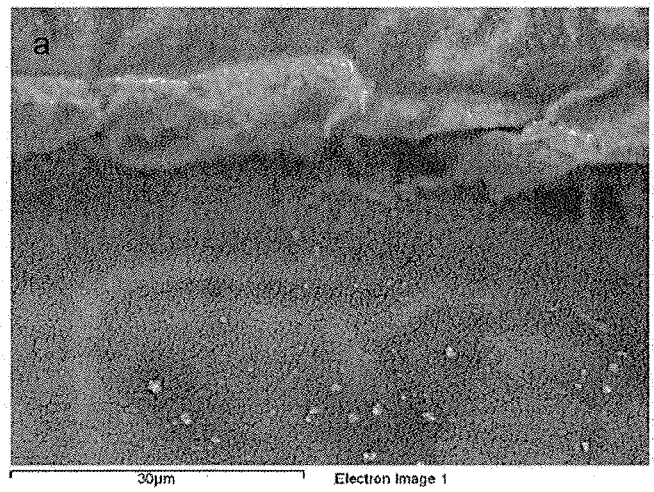
FIG. 31 shows (a) an SEM image of the section of the polypyrrole-silver complex precipitated on the PTFE and (b) and (c) images indicating the element mapping for F element and Ag element at the same site.
Figure 31:
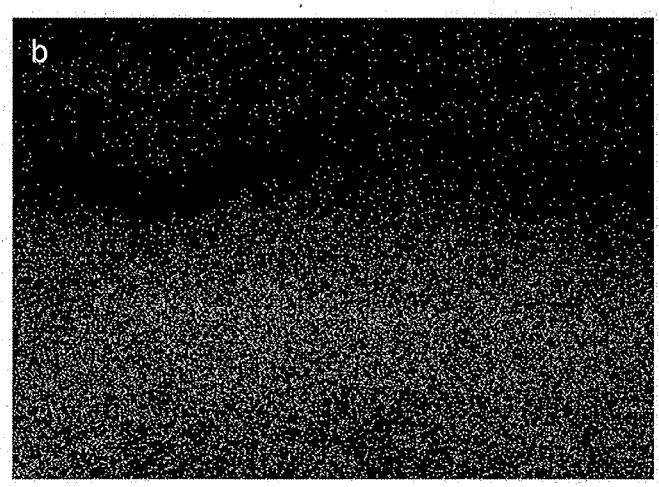
Figure 31:
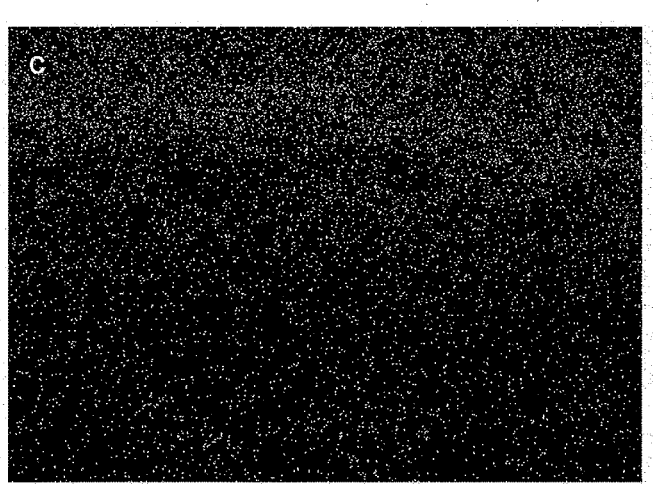

The elemental distribution near the interface of the precipitated complex and the PTFE substrate was investigated by EDS, and the results with regard to fluorine (F) and silver (Ag) elements are shown in FIGS. 31 (b) and (c). The SEM image of the same position is shown in FIG. 31(a). The elements F and Ag are major components of PTFE and the polypyrrole-silver complex, respectively. The presence of the element F was identified clearly under the interface between the complex and the substrate, but the ratio was substantially low in the complex. While the element Ag was detected clearly in the complex precipitate, it was also detected in the substrate. The ratio of Ag in the substrate was lower than that in the precipitate. Based on these results, it was indicated that the polypyrrole-silver complex existed in the PTFE substrate. Accordingly, the small particles observed under the interface (FIG. 30 (b)) is considered to be the complex. This may be due to that the complex entered into the narrow hole of the PTFE substrate. A plastic material such as PTFE has a large number of narrow holes in its bulk. When a complex precipitate is made by added its dispersion liquid dropwise onto the substrate of a plastic such as PTFE, the microparticles of the complex enter into the narrow hole near the surface of the substrate. These complex microparticles were bound to each other via van der Waals' force or a chemical interaction in their constituent polypyrrole, such as a hydrogen bond between the nitrogen atom of the polypyrrole and the hydrogen atom at the terminal of the polypyrrole. As a result, the complex entering into the substrate mates with the substrate thereby serving to fix the precipitate on the substrate, resulting in a strong adhesion. As shown in Table 5, a certain kind of plastics exhibited an adhesiveness of 90% or more, while another plastic exhibits an adhesiveness of about 70%, possibly reflecting the degree of the entering of the complex into the narrow hole of the surface of the substrate.

The narrow hole referred herein generally in conjunction with substrates is not always a round hole, and rather present in a form having a narrow and long section, which is to be expressed as a gap or crack. Thus, it should be noted that the narrow hole has various shapes. Since the significance of the discussion on the fine hole diameter relates mainly to the possibility that the microparticle or the dispersion liquid enters into the fine hole, the shorter diameter (which is generally referred to as "width" in cases of a gap or fissure shape) is significant than the longer diameter. Accordingly, the size or the diameter of the narrow hole, as used herein, means the shorter diameter when the section is in an oval shape, or the width when the section is in an extremely narrow and long shape such as a gap or fissure, unless otherwise specified.

In case of PTFE, the measurement indicated that the sizes of the narrow holes are distributed within the range of about 5 nm to 100 nm. In case of a silicone rubber among other materials, the sizes of the narrow holes are distributed within the range of about 5 nm to 1000 nm. While it is a matter of course that smaller or larger narrow holes than the aforementioned range may exist, a too small narrow hole does not allow the complex to enter into it. Also in case of a larger narrow hole having a size exceeding 1000 nm, the aforementioned adhesion effect can surely be obtained, but in such a large narrow hole any ordinary adhesive can readily enter. Accordingly, in this application, the narrow holes within the range of 5 nm to 1000 nm are focused on.

Figure 32:
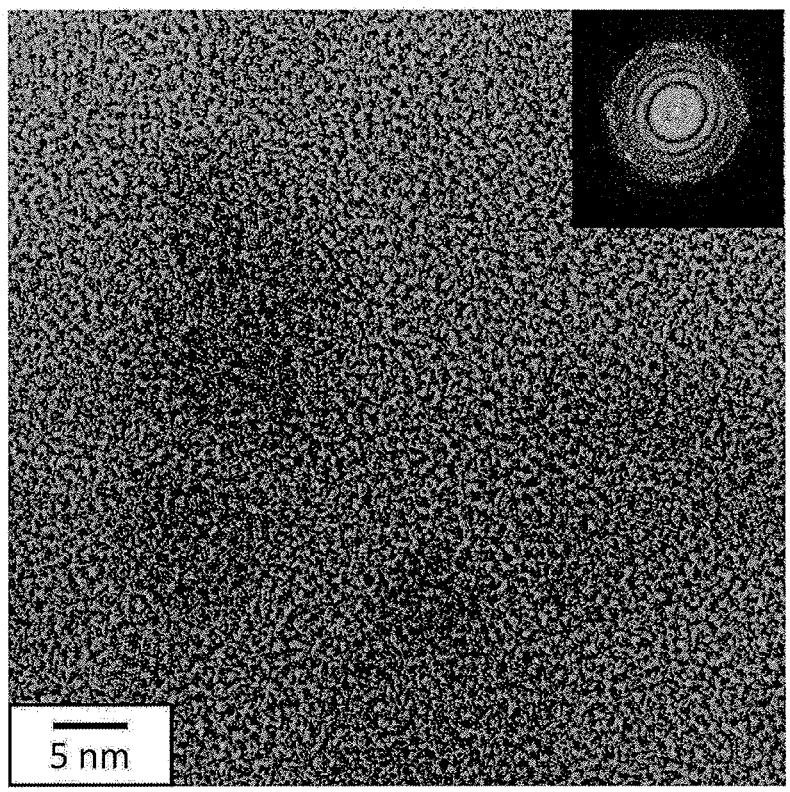
FIG. 32 shows (a) a TEM image of the polypyrrole-silver complex microparticle in a polypyrrole-silver complex dispersion liquid. The inserted figure is the relevant electron diffraction image. (b) a dark field electron image of the polypyrrole-silver complex microparticle in the polypyrrole-silver complex dispersion liquid.
Figure 32:
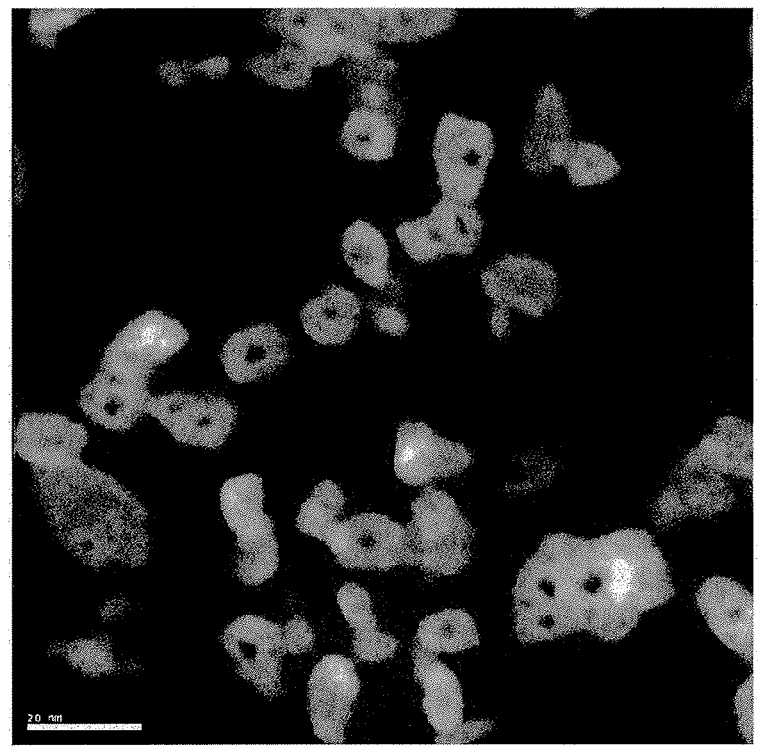
Figure 33:
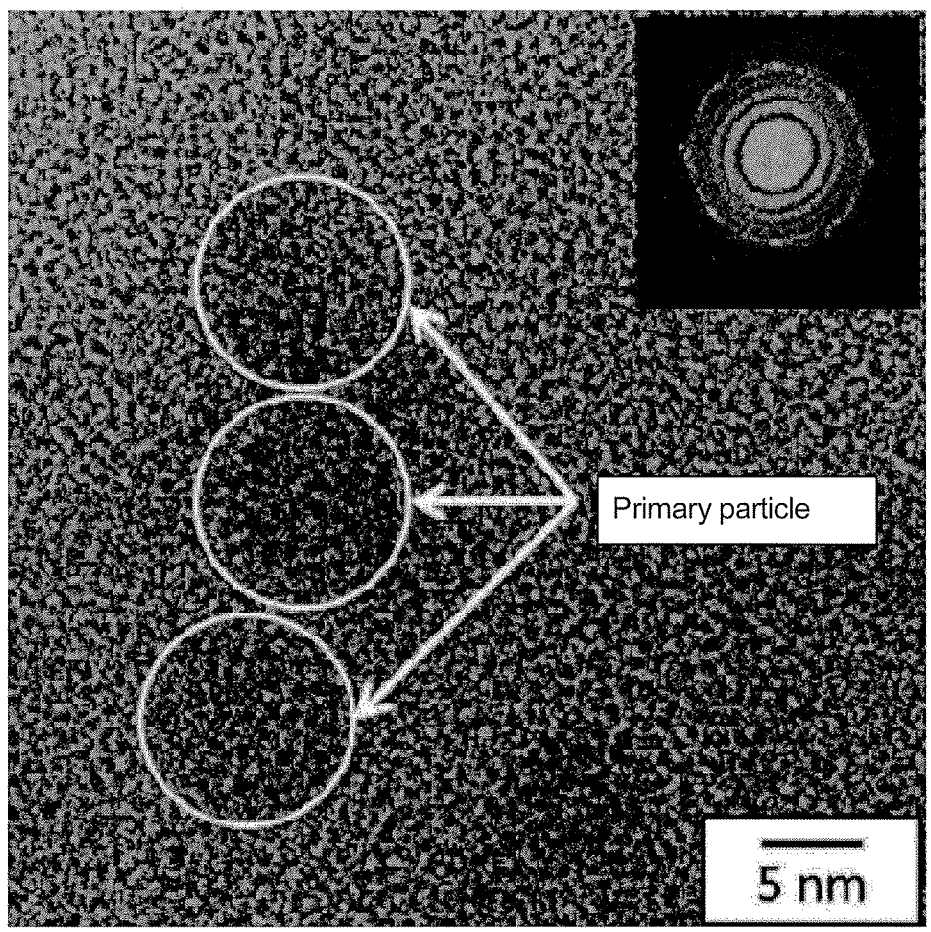
FIG. 33 is a figure in which an indication clarifying the outline of the primary particle is added to (a) the TEM image in FIG. 32.

In order to clarify here that the microparticle of the complex which enters into the narrow hole of the surface of the substrate actually exists in the dispersion liquid of the complex as well as the degree of its size, the dispersion liquid employed was observed using a transmission electron microscope (TEM). The TEM image is shown in FIG. 32(a). Also in the inserted figure, the relevant electron diffraction image is indicated. Based on the TEM image in FIG. 32(a), it was known that the complex primary particles each in a spherical or spheroid form having a diameter of about 5 to 20 nm were dispersed in the dispersion liquid. Since this TEM image is somewhat difficult to be observed, a figure having an indication of the outline of the primary particle newly added to the TEM image in FIG. 32 (a) is shown in FIG. 33. The Debye-Scherrer ring in the electron diffraction image in FIG. 32 (a) also suggested the presence of polycrystalline form. Accordingly, it is assumed that the complex particle having a diameter of about 100 nm observed in the SEM image of the section of the precipitate is resulting from aggregation of the primary particle in the dispersion liquid, or resulting from the growth of the primary particle due to a further advancement of the complex forming reaction in the drying process.

Also in order to investigate whether the Ag nanoparticle is exposed on the surface of the complex microparticle in the dispersion liquid, the dark field electron image of the complex microparticle in the dispersion liquid shown in FIG. 32 (b) was observed. While this dark field image shows a large number of the complex microparticles, a precise observation suggest that this image is constructed from the following 4 gradations rather than a smoothly changing gradation.

White

Light grey color

Almost blackish dark grey color

Black

Since the dark field electron image becomes brighter when the crystallinity is higher, these 4 gradation parts can be interpreted as described below.

The white part is a part in which the Ag nanoparticle is exposed on the surface of the microparticle.

The light grey part is a part in which the Ag nanoparticle can be seen via the conductive polymer, i.e., the part in which the Ag nanoparticle is covered with the conductive polymer.

Almost blackish dark grey part is a part in which only the conductive polymer can be seen with no Ag nanoparticle in the background.

The black part is the background region having no complex microparticle.

Accordingly, at least a part of the complex microparticle allowed the exposure of the metal nanoparticle from the conductive polymer to be confirmed. This minute structure achieves such a high conductivity of the precipitate of the complex microparticle.

The diameter of the primary particle in the dispersion liquid observed as described above is 5 to 20 nm, and these particles have the particle sizes which are far smaller than the wavelengths of the visible light region. Accordingly, these particles do not undergo light absorption in their nature, and the aforementioned colors should not be observed. However, the dispersion liquid here exhibited a blue color because of the color development by a surface plasmon resonance due to the metal nanoparticle present on the complex particle even in case of such a further smaller primary particle, although the presence of complex particles having larger diameters can not be eliminated.

The distribution of the diameters of the primary particles present in the dispersion liquid is frequently within the range of 5 to 40 nm even when changing the conditions of preparation of the dispersion liquid. It is also possible that by allowing the growth to further proceed for example by prolonging the light irradiation time period, or by allowing the primary particles in the dispersion liquid to aggregate the size of the complex microparticles in the dispersion liquid is further increased and the diameter reaches 100 nm at maximum. Nevertheless, a diameter exceeding 100 nm is not preferable because it does not allow the dispersion liquid to maintain the colloid state, resulting in sediment or state of suspension. On the contrary, a diameter of 100 nm or less is sufficiently small for entering into the narrow holes on the surfaces of various substrates, which allows the mating-based adhesive effect of the conductive polymer-metal complex described above to be exerted.

While the range of the size of the complex microparticles (primary particles) in the dispersion liquid precipitate adhering to the substrate is about 100 nm in the experiment employing PTFE as a substrate as described above, it may vary depending on the dispersion liquid employed or difference in various processing conditions. The upper limit of the range of the size is 300 nm, with about 500 nm at maximum. The lower limit is about 5 nm since the complex microparticles in the dispersion liquid entering into the narrow holes on the surface of the substrate does not become larger than the narrow holes unless it binds to other microparticles outside of the narrow hole or it grows out of the narrow hole and also since even outside of the narrow holes the complex microparticles in the dispersion liquid may remain as it is in the precipitate without binding to other microparticles because of other reasons.

While the size of the metal nanoparticles contained in the complex microparticles in the dispersion liquid or in the precipitate usually does not differ substantially from the size of the complex microparticles in the dispersion liquid containing this metal nanoparticle, it is about 1 nm at minimum and the largest size is less than the size of the complex microparticles containing this metal nanoparticles in the dispersion liquid as a matter of course.

Figure 34:
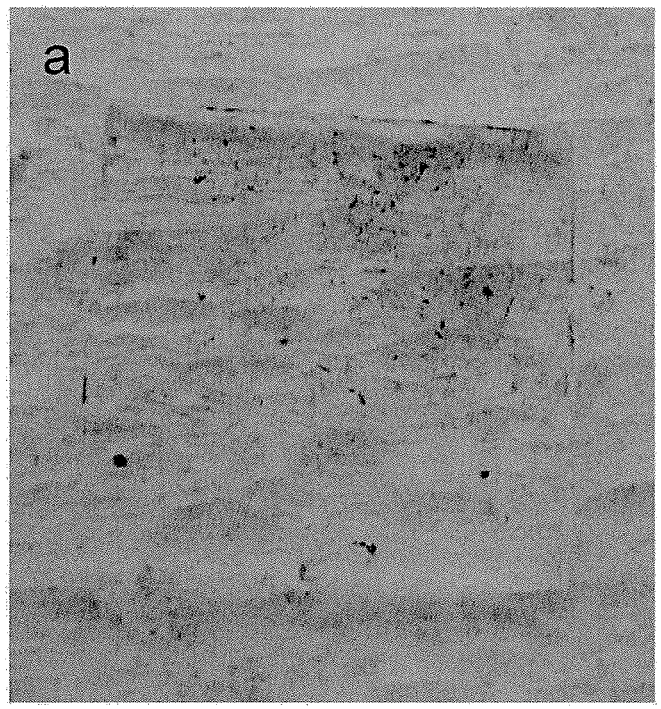
FIG. 34 is a photograph showing the appearance after the peel-off test of a sample whose substrate is a glass substrate. (a) shows the results obtained when using a glass plate as being received. (b) shows the results obtained when using as a substrate a glass plate processed by blasting before the peel-off test.
Figure 34:
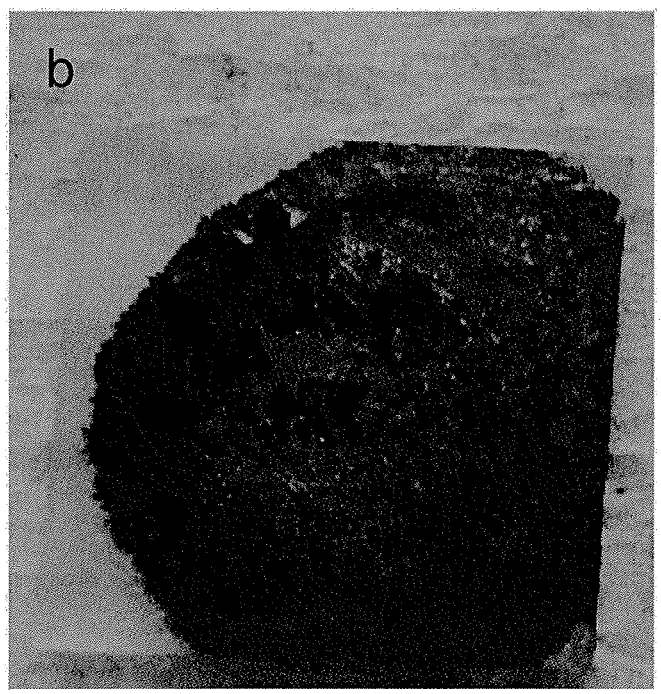
Figure 34:

In order to clarify the mating-based adhesive effect of the conductive polymer-metal complex, the aforementioned peel-off test was conducted using a glass plate as a substrate. FIG. 34 shows the appearance of this sample after the peel-off test. The substrate was a glass plate as being received in FIG. 34 (a) and a glass plate subjected to the blasting processing before the peel-off test in FIG. 34 (b). When using the glass plate as being received, almost all of the precipitate were peeled off by the tape, and the adhesiveness was less than 1%. On the contrary, the glass plate which had obtained a rough surface as a result of the blasting processing allowed almost all precipitate to adhere to the substrate, and the adhesiveness was improved to almost 100%. Based on these results, the conductive polymer-metal complex of this application is proven to exert a marked mating-based adhesive effect. This is because of the reason that the microparticles of this complex dispersed in the solution can enter even into a micrographic narrow holes near the surface of the substrate.

Variation Example

In the present invention, a substrate has a cavity as a narrow hole, which serves as a mold when receiving a liquid containing a complex microparticle to allow the complex in a fine wire shape to be formed in the narrow hole. The fine wire thus formed increases the adhesiveness. Since one entering into the narrow hole here is the microparticle of the complex, the hydrogen bond attributable to the polymer in the complex is considered to contribute to the binding force between the microparticles as described above. Nevertheless, it is also possible to obtain a fine wire consisting only of the metal by removing the polymer component by a processing such as an external heating of the entire adhesive body after formation of such an adhesive body. When this heating is performed by allowing a current to run into the complex to generate the heat, the precipitate part serving as a current path (for example, a part employed as a wiring) becomes a pure metal which gives a reduced resistance, but the fine wire part of the complex entering deep into the narrow hole of the substrate does not receive the current, thereby allowing the complex structure to be maintained. In such a case, it is considered that the initial adhesiveness is maintained since the fine wire part entering deep into the substrate is not changed.

When the fine wire of the complex formed by the complex microparticle entering into the substrate has a unique shape, such as a shape in which it bends inside the substrate, it is bigger inside than at entrance, it is branched inside, the fine wire becomes resistant to be pulled out from the substrate, resulting in a further improved adhering force. It is further preferable to allow a narrow hole advantageous for improving the adhesiveness to be formed or added on the substrate surface in addition to utilizing as a narrow hole of the substrate those existing initially on the substrate.

As a further utility of the conductive polymer-metal complex, it is contemplated that on an elastic body such as a rubber the present complex is formed. This complex may be floated up and peeled off when being compressed strongly. Accordingly, when this complex is formed on the substrate which should be assumed to be compressed during use, the complex is formed by the processing in the state where the board of a rubber etc. has been compressed to the possible maximum compression level. By this way, no further compression occurs during use as a product, thereby avoiding problems such as peeling off.

Also when the apparatus for forming a vertical wiring such as a via is one which can readily be deformed such as a rubber, by supplying the dispersion liquid while allowing the diameter of the hole for the vertical wiring to be larger by deforming the substrate, a rapid penetration deep into the substrate utilizing gravity and the like becomes possible. Since this solution undergoes relatively slow precipitation at a low temperature, such a low temperature may be employed to ensure deep penetration without precipitation while enlarging the narrow hole at the same time.

While silver was exemplified in the aforementioned Example as a metal for forming a complex, the present invention poses no restriction to silver, and it is possible to use, for example, copper, platinum and gold. In this way, a copper wiring can be formed as being adhered to a film of PET and the like. When a highly reactive metal such as copper is employed, it may exist intermediately as a compound of the relevant metal in the complex as long as it becomes the metal itself finally. In case for example of copper, copper oxide, instead of the metal oxide, may exist at the time when the complex is formed as a wiring pattern etc which is adhering strongly on the substrate according to the present invention. Subsequently, this copper oxide can be converted into the metal copper having a low resistance by allowing an excessive current to run or by external heating. Although the case only of using $Cu^{2+}$ as a copper ion was exemplified above, $Cu^+$ may also be used actually instead of $Cu^{2+}$ to make a conductive polymer-metal complex dispersion liquid similarly.

Example 3

In this Example, an experiment employing a dispersion liquid of a polypyrrole-silver complex was performed to show that the conductive polymer-metal complex dispersion liquid is preferable for filling a narrow hole such as via.

Similarly to the dispersion liquid which has already been described, 2.5 cc of the acetonitrile solution containing silver nitrate at a concentration of 1 mol/L and pyrrole at a concentration of 0.2 mol/L was subjected to ultraviolet light irradiation to prepare a polypyrrole-silver complex dispersion liquid. This dispersion liquid had a blue color as described above. This dispersion liquid was used to subject a silicon substrate having a narrow hole having a diameter of 30 μm and a depth of 100 μm, which reflected an almost cylindrical form having a high aspect ratio, to the two types of the filling processing described below. The same experiment was performed for holes having diameters of 20, 50 and 80 μm (constant depth of 100 μm), which exhibited the results similar to those obtained for a diameter of 30 μm.

First filling processing: An operation involving immersing the aforementioned silicon substrate in the dispersion liquid while stirring for 1 minute followed by allowing the silicon substrate to be taken out and then dried is repeated 5 times.

Second filling processing: The aforementioned silicon substrate was immersed in the dispersion liquid for 5 minutes with an ultrasonic irradiation in an ultrasonic washing machine and then taken out and dried.

In any of the filling processings, any particular processing for improving the penetration of the dispersion liquid into the hole, such as reducing the pressure, was not performed, and merely immersion and stirring were performed.

Figure 35:
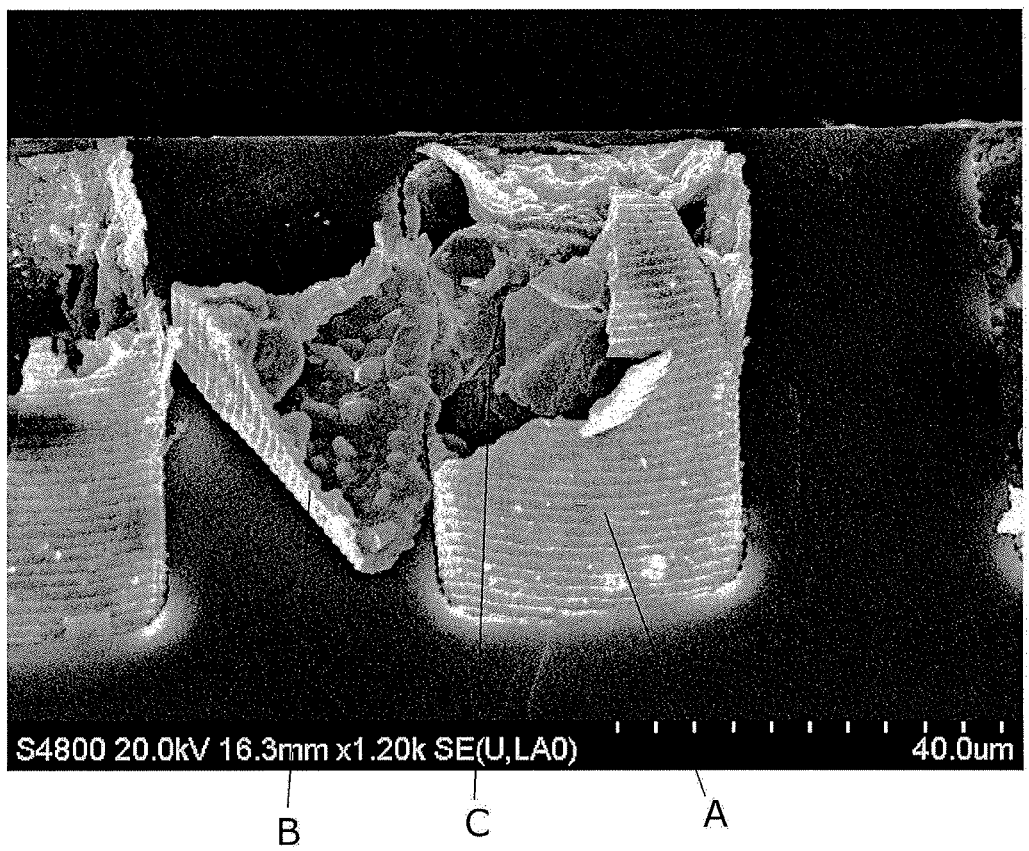
FIG. 35 is an SEM image showing an example of the structure of a polypyrrole-silver complex filling material formed in the inside of a via by repeating the immersion processing using a polypyrrole-silver complex dispersion liquid.
Figure 36:
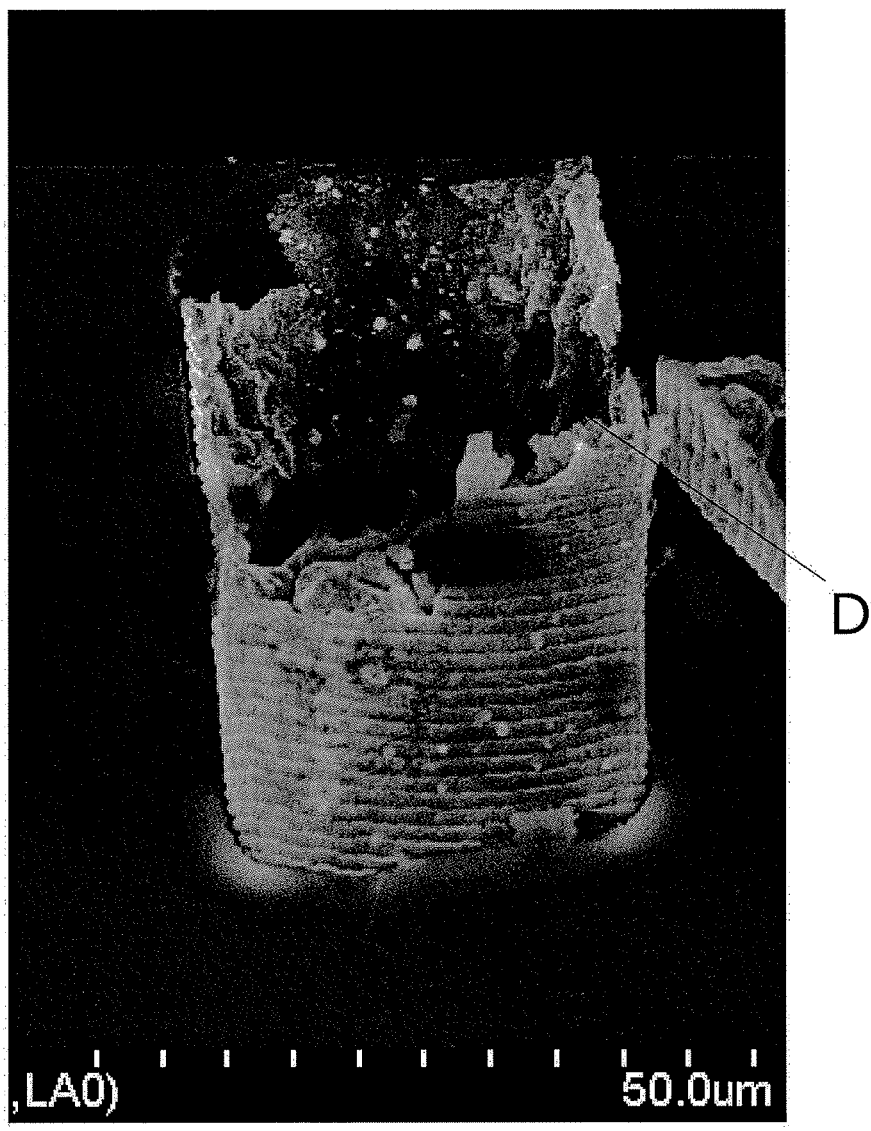
FIG. 36 is an SEM image showing another example of the structure of a polypyrrole-silver complex filling material formed in the inside of a via by repeating the immersion processing using a polypyrrole-silver complex dispersion liquid.
Figure 37:
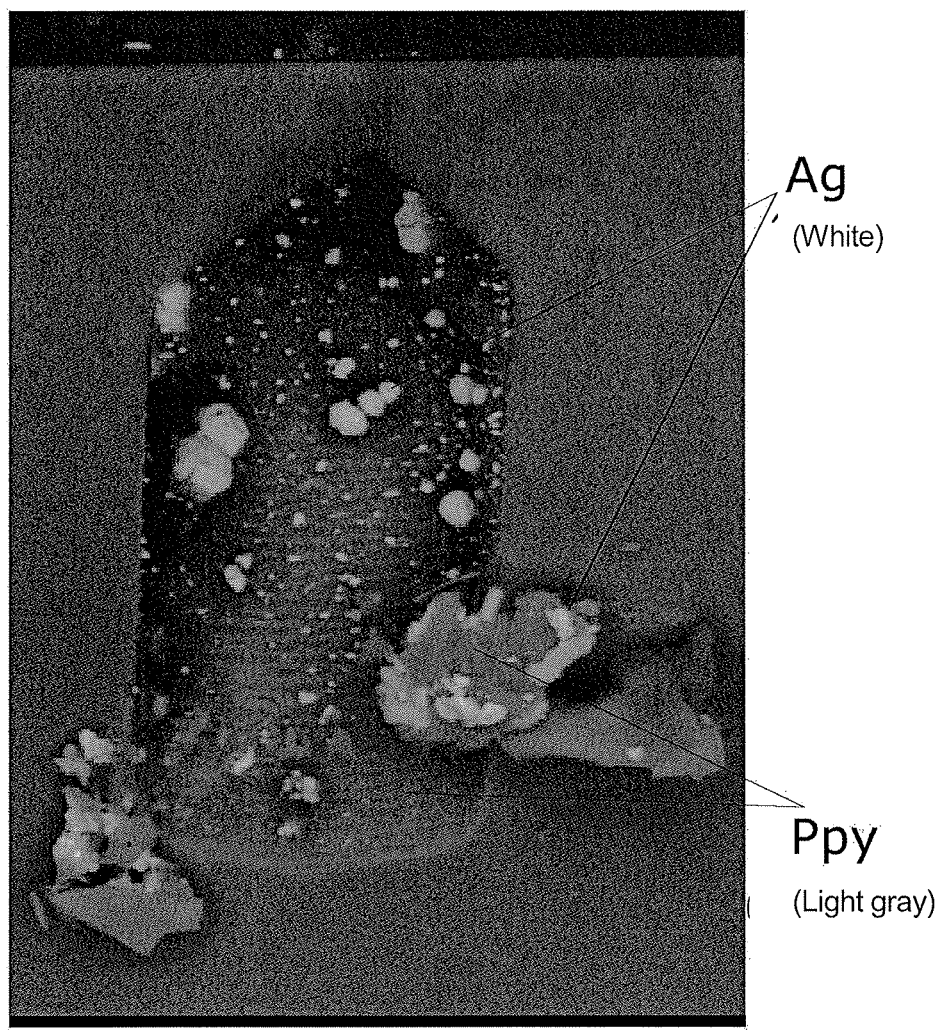
FIG. 37 is an SEM image showing an example of the inside of the via which failed to form a satisfactory polypyrrole-silver complex filling material even after repeating the immersion processing using a polypyrrole-silver complex dispersion liquid.

FIG. 35 to FIG. 37 are SEM images showing the results of the first filling processing. These SEM images were taken in a state in which the inner filling materials are allowed to be exposed partly from the hole by cleaving the silicone substrate after completing the filling processing. As evident from these figures, when the filling was performed, the polypyrrole-silver complex was formed as being adhered strongly to the wall of the hole, although all holes are not necessarily filled completely because of no optimization of the processing condition being completed.

FIG. 35 shows a state in which the silicon substrate was cleaved along with the plane parallel to its surface, and the substrate, i.e., the silicon from the upper end of the hole to somewhat lower position was removed. All images in FIG. 35 to FIG. 37 and further to FIG. 47 show the states in which the top surface of the silicon substrate (i.e., the side of the exit of the hole) is in an upper position. All figures except for FIG. 46 in which the section after the polishing was observed indicates the state after the cleavage. In the center of FIG. 35, from the filling material formed in the holes, one exhibiting a satisfactory filling state was selected and indicated. This filling material is almost cylindrical, and its side has a ring-shaped groove formed at almost same intervals along with the axis in the direction of the depth of the hole (such as Region A in FIG. 35). This groove reflects the ring-shaped protrusion/recess structure formed on the inner wall of the hole as described above. The formation of such a ring-shaped groove on the surface of the outer wall of the filling material suggest that, in spite of fine protrusions/recesses present on the inner wall of the hole, the filling material was adhered uniformly to any of the protrusions and the recesses on the inner wall of the hole, in other words, the state of the adhesion between the filling material and the inner wall of the hole is extremely satisfactory. It is also observed that a part of the outer wall of the upper left of this center-positioned filling material is peeled off (Region B in FIG. 35). This resulted from a partial break of the filling material, upon cleavage of the silicon substrate while peeling the upper part of the silicon substrate, because of adhesion of the filling material to the relevant upper position. Such a structure also suggests that the filling material was adhered to the inner wall of the hole. While such a partial break of the outer wall of the filling material allows a part of the inside of the filling material to be observed as shown in Region C, it is known, as a result, that the inside of this filling material is not hollow and is mostly filled with the material precipitated from the dispersion liquid. The structure of the surface and the inside of the filling material described above suggest that the formation of the filling material begins on the surface of the inner wall of the hole.

This SEM image is not sufficient to ensure that the hole in the center of FIG. 35 has completely been filled deep into the bottom. Nevertheless, it can be assumed that a sufficient filling to a position substantially close to the bottom was achieved even though a complete filling can not be known. This is based on the fact that, as described above, the depth of the hole is 100 µm and the length of the part exposed by the cleavage was about 50 µm as measured actually in the SEM image. The ring-shaped groove described above was an offset of the small protrusions/recesses on the surface of the inner wall which was formed in the course of preparing the inner wall of the hole, and these protrusions/recesses are not present on the bottom of the hole because of the nature of the method for forming the hole. Accordingly, even if a part formed near the bottom of the hole (about 50 µm at maximum) exists in the filling material observed in FIG. 35, it is shielded beneath the cleavage surface. Upon discussing whether such a part is actually present, or how deep the filling was achieved, it should first be noted that such a filling material remained as being embedded in the lower surface in the course of peeling the part upper than the cleavage surface during the cleavage operation. This suggest that, because the filling material has been embedded while maintaining a high filling rate to a sufficiently lower position than the cleavage surface, the upward force exerted to the filling material upon this peeling (a strong force to allow a part of Region B on the filling material to be peeled off) can be tolerated. Accordingly, it is possible that the filling material was formed at least substantially deep into this hole at a high filling rate.

FIG. 36 shows the SEM images showing the filling material, among the filling materials protruding on the board subjected to the cleavage processing similar to FIG. 35, whose filling state was somewhat poorer when compared with that shown in the center of FIG. 35. Similarly to Region B in FIG. 35, the filling material in FIG. 36 also had a broken part of the outer wall, the inside of which was exposed as shown in Region D. This indicates that the filling material shown in FIG. 36 is hollow. Nevertheless, its outer wall part was formed over a most part of the inner wall of the hole, and this filling material was adhered to the inner wall which was sufficiently satisfactory, as evident also from a partial break of the outer wall of the filling material upon cleavage.

FIG. 37 shows an example of the SEM image of the inner wall of a hole appearing on the surface of cleavage along with a surface passing through the neighbor of the central axis of the hole and almost in parallel with this axis. While the hole shown in FIG. 37 can be observed from the intermediate part to the bottom of the hole, the neighbor of the entrance of the hole showed the silicon as a substrate instead of the inner wall of the hole because the cleavage surface did not match with the hole. In this case of the hole, the inside of the hole was mostly hollow, but the inside had polypyrrole (Ppy) and silver particles deep into the bottom. This suggests that the dispersion liquid entered once deep into the bottom of the hole but the subsequent removal of the substrate from the dispersion liquid allowed the dispersion liquid to be drawn out.

Figure 38:
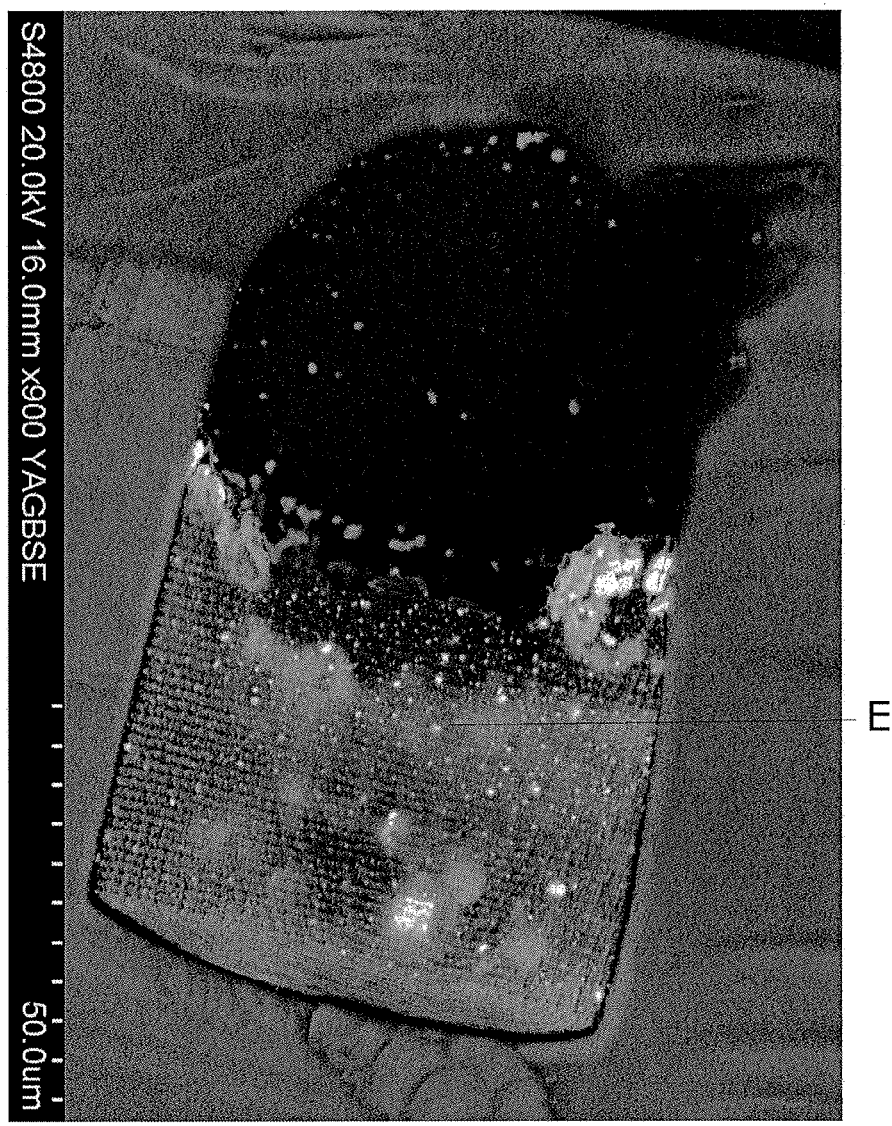
FIG. 38 is an SEM image showing an example of the structure of a polypyrrole-silver complex filling material formed in the inside of a via by a processing employing an ultrasonic irradiation simultaneously with immersion in a polypyrrole-silver complex dispersion liquid.
Figure 39:
FIG. 39 is an SEM image showing an example of the structure of a polypyrrole-silver complex filling material formed near the bottom in the inside of a via by a processing employing an ultrasonic irradiation simultaneously with immersion in a polypyrrole-silver complex dispersion liquid.

FIG. 38 and FIG. 39 are the SEM image showing examples of the results of the second filling processing.

FIG. 38 shows the SEM image of the state obtained by cleavage along with a surface passing through the neighbor of the central axis of the hole and almost in parallel with this axis similarly to FIG. 37, more specifically, the BSE (Back Scattered Electron) image. As shown in FIG. 38, it is suggested that, in the second filling processing, similarly to the first filling processing, the formation of the filling material of the hole began on the surface of the inner wall of the hole but the upper outer wall of the filling material tended to become thinner when compared with the first filling processing. It was found, as a result of the observation of a large number of these filling materials although not shown in drawings, a sufficiently thick outer wall was formed only in the lower (bottom-side) half of the hole in most of the cases. Also in the example shown in FIG. 38, the cleavage surface did not match with the hole near the exit of the hole and allowed the substrate to be observed, and, in the part from the position somewhat lower than the exit to the bottom, almost the upper half underwent the break of the outer wall upon cleavage.

Because of the nature of the BSE images, a site in which silver having a high atomic density appears bright when compared with the circumference. The Region E in FIG. 38 is a somewhat bright region in a ring shape surrounding the circumference of the central axis of the hole. The existence of this region suggests that in the processing the dispersion liquid entered to this position of the hole. Also in the lowest part of the filling material observed in FIG. 38, no ring-shaped groove was formed. As mentioned above, the lowest part of the filling material observed in FIG. 38 having no grooves is the offset of the form of a relatively smooth surface of the bottom of the hole because the bottom of the hole does not have the protrusion/recess corresponding to the groove, and it was confirmed finally that the filling material in FIG. 38 was filled completely deep into the bottom of the hole.

FIG. 39 shows the state obtained by cleavage almost along with the central axis of the hole through a surface almost in parallel with the axis similarly to FIG. 38. Also in FIG. 39, the inside of the entire hole is not observed, and the substrate, rather than the inside of the hole, is observed in a position slightly above the bottom. Also in FIG. 39, it is known that the condition of the formation of the filling material in the lower half of the hole was sufficiently satisfactory.

FIG. 40 to FIG. 45 shows the results of the filling of Comparative Examples in which a silicon substrate of the material similar to that employed in FIG. 35 to FIG. 49 on which the hole also of the similar shape and size was formed was immersed in 2.5 cc of the same reaction solution for the dispersion liquid, namely, the acetonitrile solution containing silver nitrate at a concentration of 1 mol/L and pyrrole at a concentration of 0.2 mol/L which had not been subjected to ultraviolet light irradiation. More specifically, FIG. 40 to FIG. 42 and FIG. 43 to FIG. 45 are the SEM images of the conditions of the inside of the hole observed using the aforementioned substrate and aforementioned starting material solution to perform the third and fourth filling processings shown below followed by cleavage of the board, respectively.

Third filling processing: The aforementioned silicon substrate is immersed in a reaction solution and then dried.

Fourth filling processing: The aforementioned silicon substrate was immersed in a reaction solution while performing an ultraviolet light irradiation and then dried.

Figure 40:
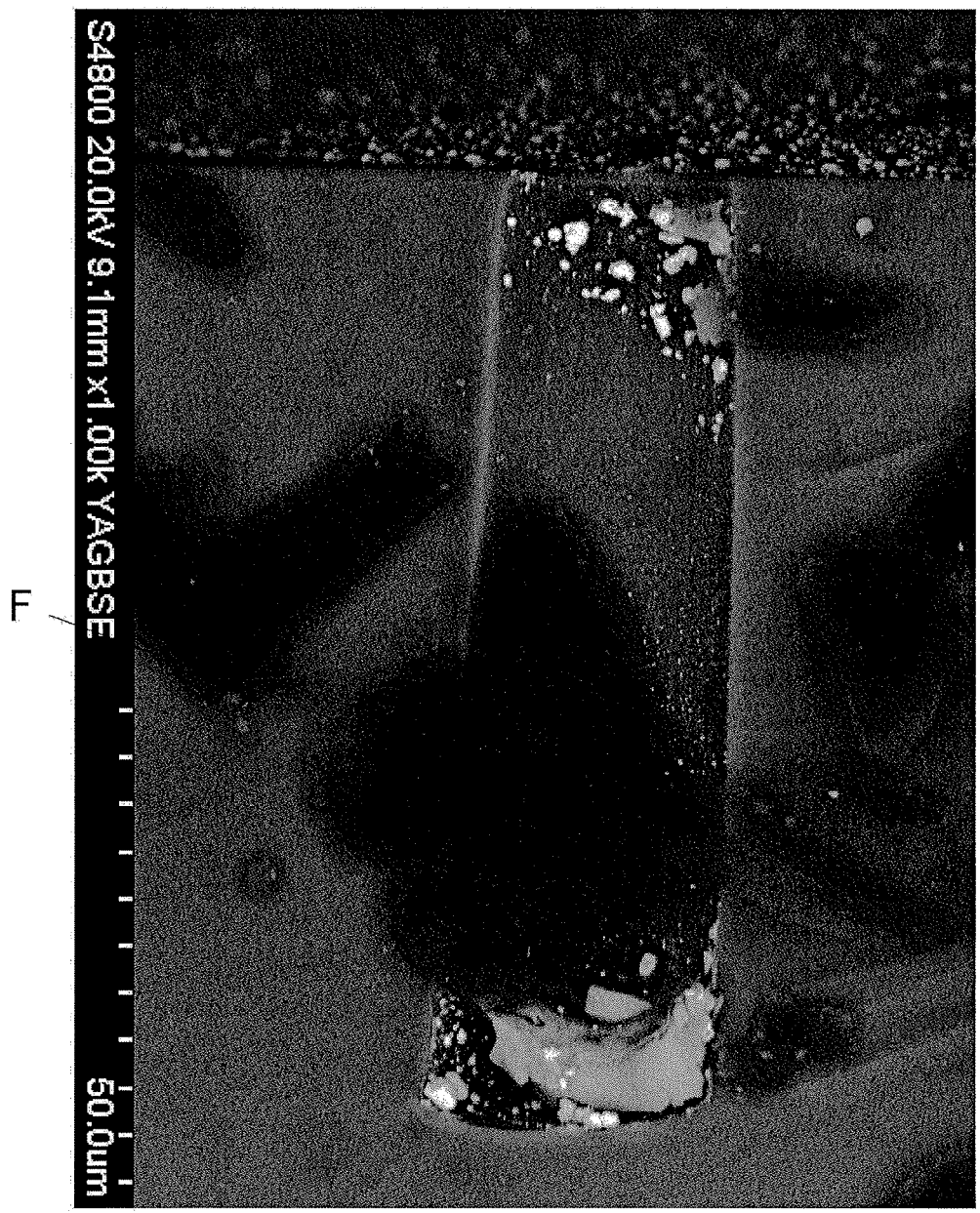
FIG. 40 is an SEM image showing an example of the manner of formation of the substance into the inside of the via only by immersion in the reaction solution of a polypyrrole-silver complex dispersion liquid.

FIG. 40 shows the inside of the hole exposed by cleavage along with a surface passing through the neighbor of the central axis of the hole and almost in parallel with this axis. In FIG. 40, the inside of the hole is observed from its exit to the bottom, and a small amount silver precipitated near the hole exit and only somewhat larger amounts of polypyrrole and silver precipitated on the bottom. A dark cloud-shaped part observed in Region F in FIG. 40 is considered to be due to the contamination after the cleavage.

Figure 41:
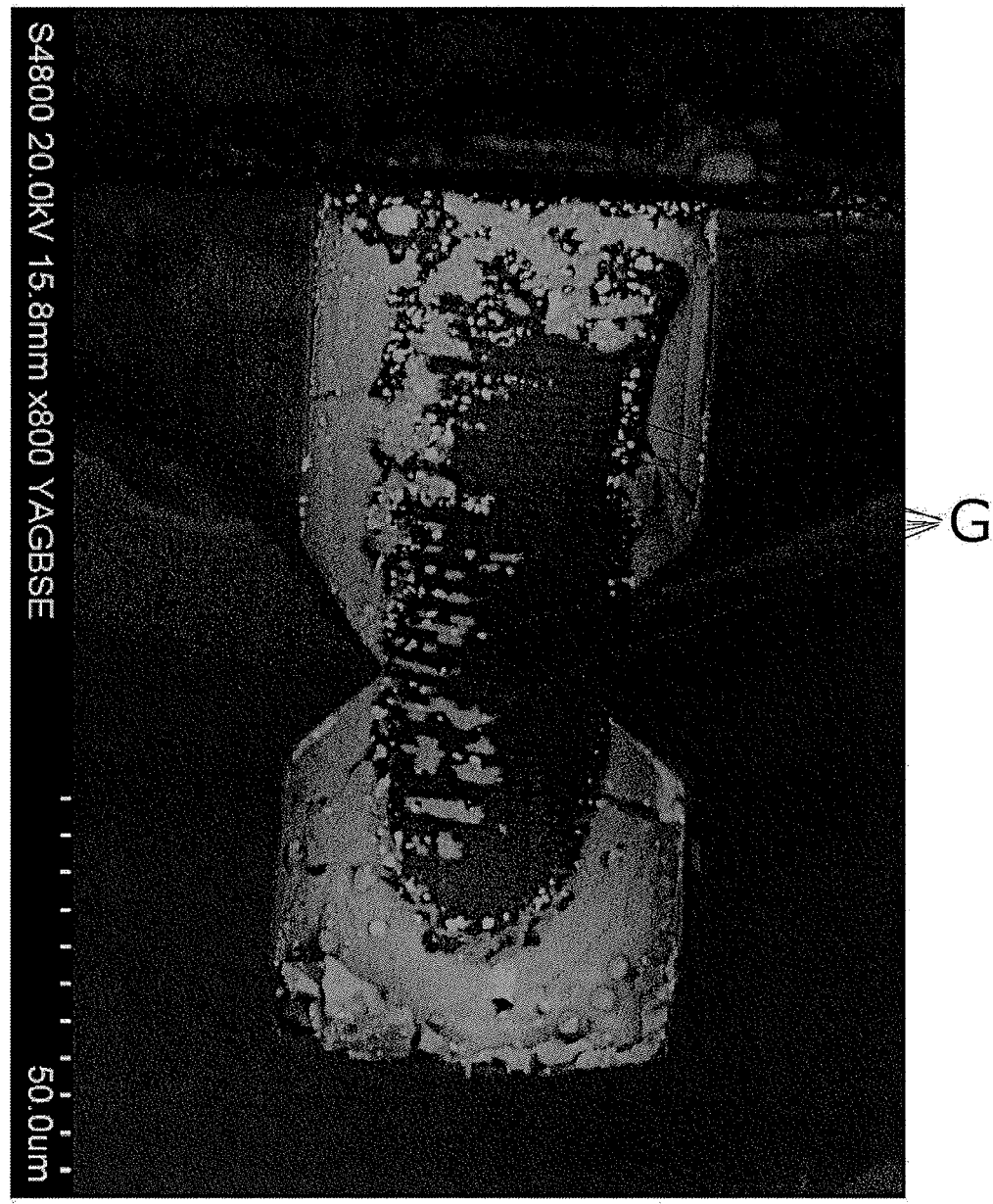
FIG. 41 is an SEM image showing another example of the manner of formation of the material into the inside of the via only by immersion in the reaction solution of a polypyrrole-silver complex dispersion liquid.

FIG. 41 shows the state in which the inside of the hole is exposed by performing the cleavage similarly to FIG. 40, in which the substrate comes closer from the right and the left at the position corresponding to ⅖ from the bottom toward the exit, around which a part of the inside of the hole was shielded. In an example shown in FIG. 41, a small amount of the precipitate was observed at the exit and on the bottom of the hole similarly to that shown in FIG. 40, and also in Region G the precipitation was known to occur along with the ring-shaped protrusion/recess formed on the inner wall of the hole.

Figure 42:
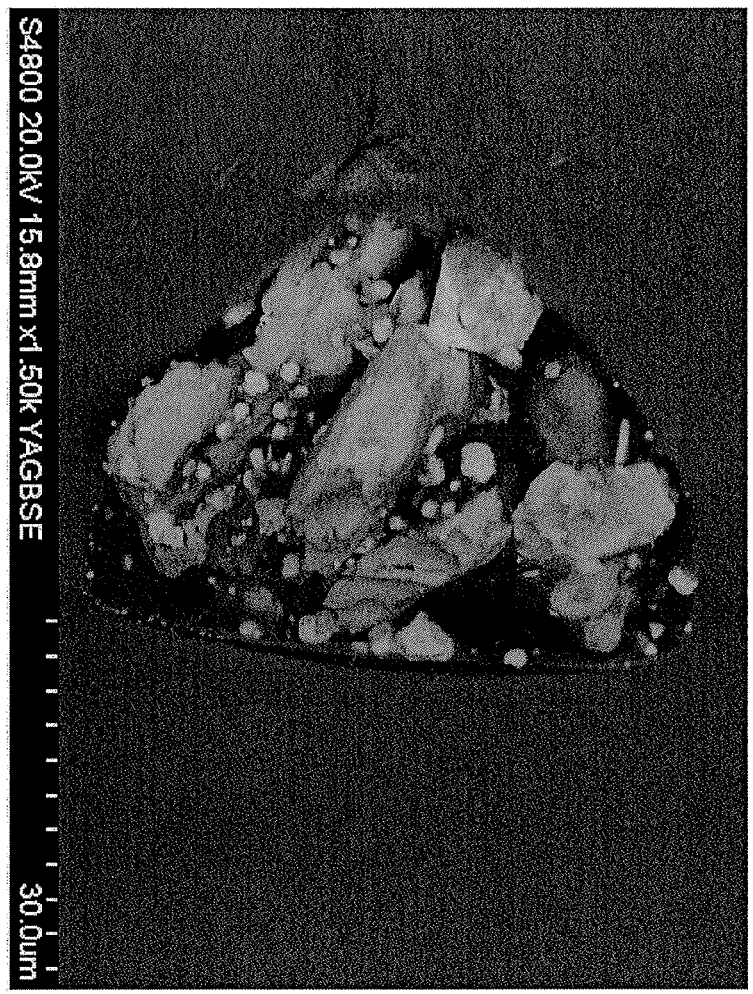
FIG. 42 is an SEM image showing another example of the manner of formation of the material to the bottom of the via only by immersion in the reaction solution of a polypyrrole-silver complex dispersion liquid.

In still another example shown in FIG. 42, the cleavage surface did not match with the central axis of the hole to a substantial extent, resulting in a slight exposure of the bottom of the hole. Also in this example, some precipitate consisting of silver and polypyrrole was observed on the bottom.

Figure 43:
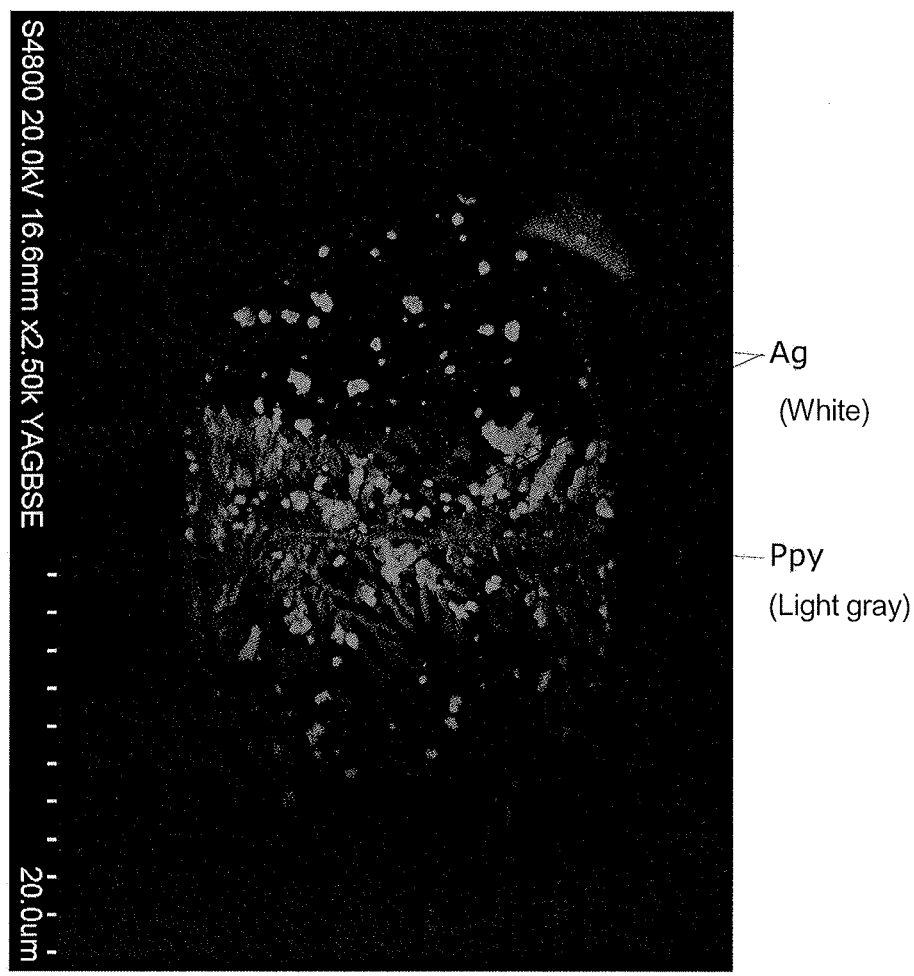
FIG. 43 is an SEM image showing an example of the manner of formation of the material into the inside of the via by conducting an ultraviolet light irradiation simultaneously with immersion in the reaction solution of a polypyrrole-silver complex dispersion liquid.
Figure 44:
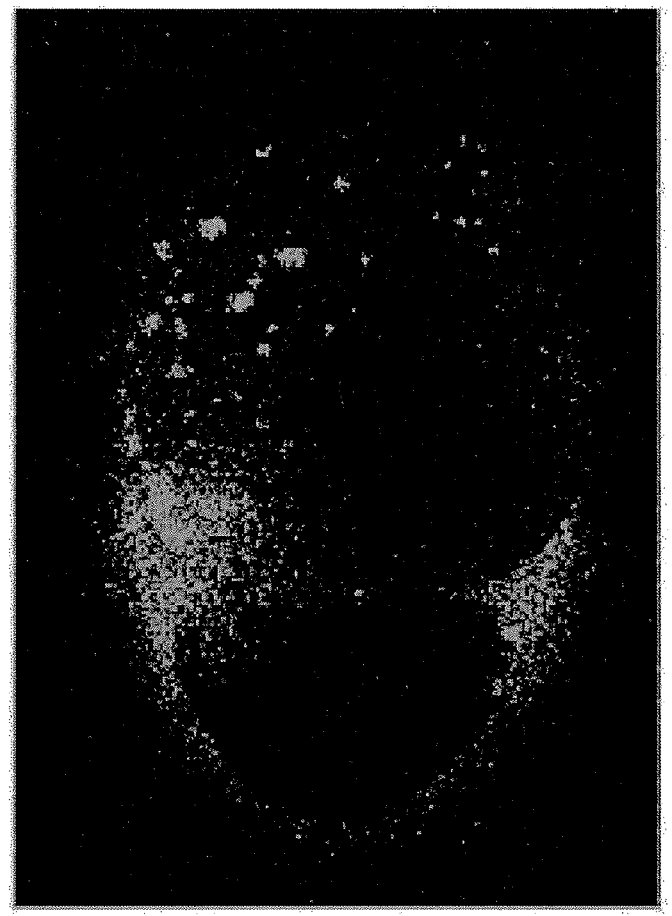
FIG. 44 is an EDX image of the inside of the via corresponding to FIG. 44.
Figure 45:
FIG. 45 is an SEM image showing another example of the manner of formation of the material into the inside of the via by conducting an ultraviolet light irradiation simultaneously with immersion in the reaction solution of a polypyrrole-silver complex dispersion liquid.

FIG. 43 to FIG. 45 shows the results of the ultraviolet light irradiation performed with immersion in the reaction solution as described above. As a result of observation of many examples in addition to these figures, it was found that, in most of the cases (at least in a half of the cases), the polymerization reaction of pyrrole began on the surface of the reaction solution (i.e., the upper end of the reaction solution) contained in the hole, and in this position of the inner wall of the hole the polymer adhered in the form of a ring, in other words, this reaction proceeded on the liquid surface. In addition, it was found that also on the side above this ring-shaped region a cluster of silver was formed independently. FIG. 43 shows the SEM image of the results of cleavage along with a surface passing through the neighbor of the axis of the hole and almost in parallel with this axis, and a region of only a part between the exit and the bottom of the hole was observed on the cleavage surface. Also near the center of the inside of the hole shown here, there is a ring-shaped region where silver and polypyrrole precipitated while surrounding the central axis of the hole. The aforementioned silver cluster is also observed in FIG. 43.

FIG. 44 is an EDX image of the part corresponding to FIG. 43, and the presence of silver is indicated as a bright region. Also from this, silver exited in a large amount in the aforementioned ring-shaped region and its cluster region.

FIG. 45 is the SEM image of the surface of the inside of another hole similarly to FIG. 43. In FIG. 45, the ring-shaped region is observed in a position lower when compared with FIG. 43, above which there are spots of the silver cluster region. It is suggested that the hole shown in FIG. 45 had a reduced amount of the reaction solution when compared with the hole of FIG. 44 and the surface of the liquid became lower.

Figure 46:
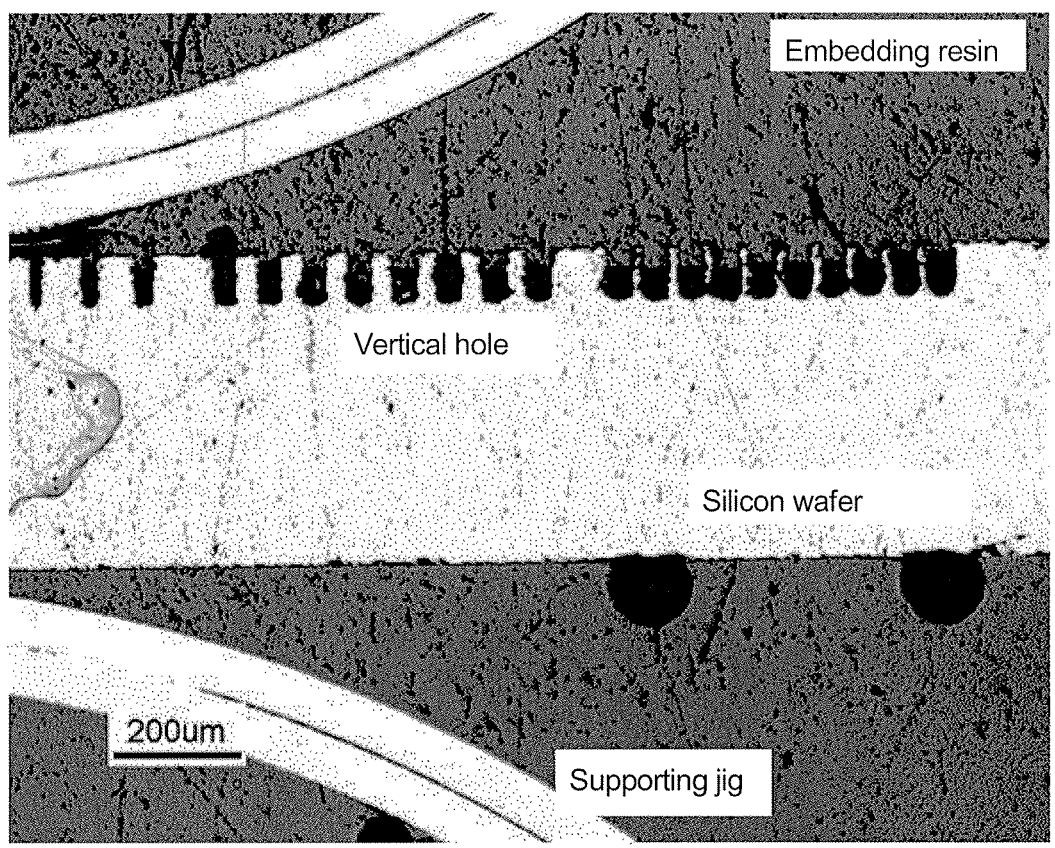
FIG. 46 is an SEM image of the section by polishing of a large number of silicon wafers in which the polypyrrole-silver complex is filled.
Figure 47:
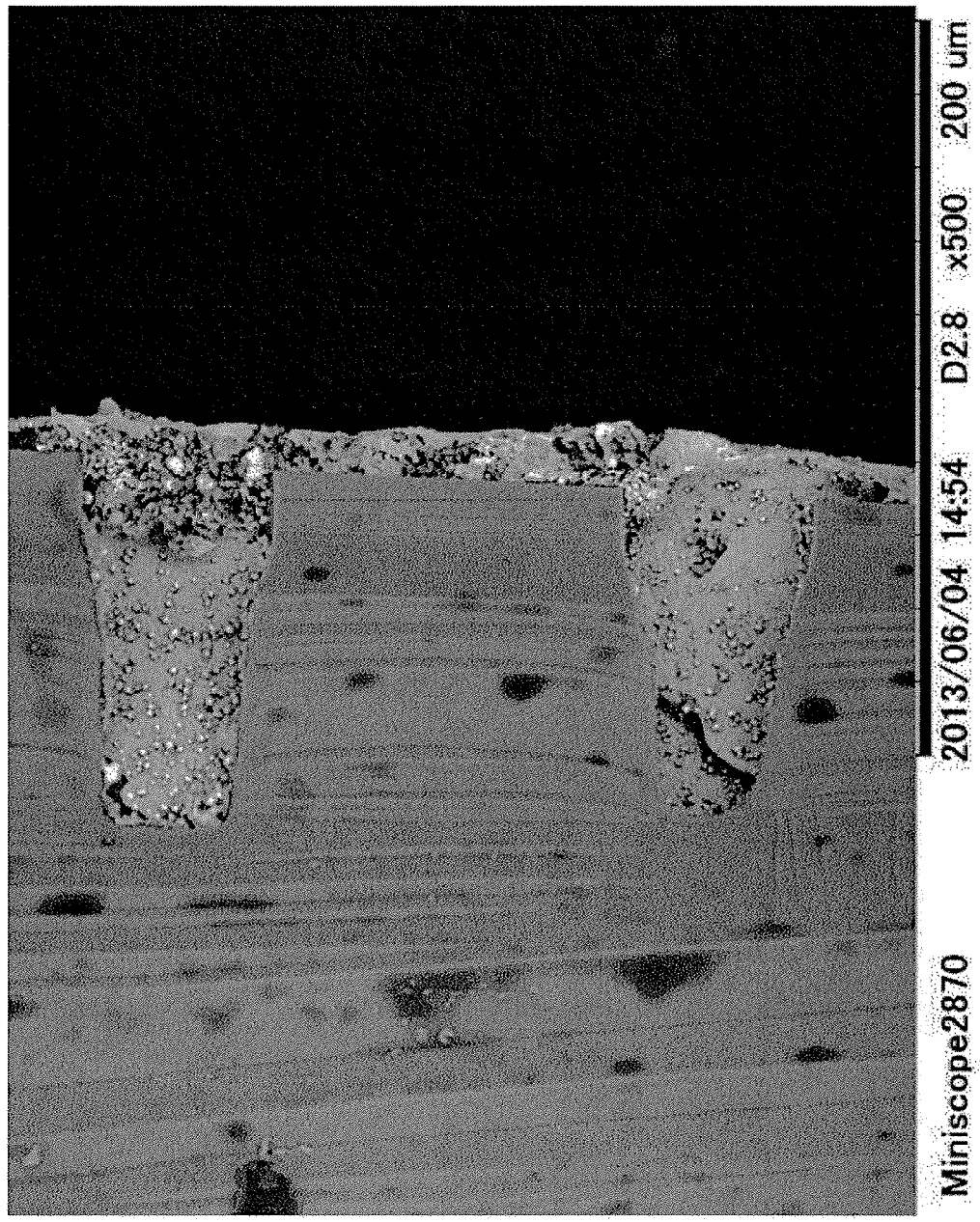
FIG. 47 is an SEM image of the section by cleavage of 2 silicon wafers in which the polypyrrole-silver complex is filled completely.

FIG. 46 is the SEM image of the section as a result of processing by immersing a silicone substrate having many holes in the dispersion liquid similar to that described above for 1 minutes followed by drying. Unlike to other SEM images, this section was exposed by fixing a post-immersion processing/drying silicon substrate using an embedding resin followed by polishing. On the top of the silicon wafer, 21 vertical holes were formed and inside of these vertical holes the polypyrrole-silver complex (dense color part) was from the bottom to the surface of the silicon wafer or from the bottom to the halfway of the hole. The polypyrrole-silver complex was not filled completely up to the surface of the silicon wafer partly because of the liquid draining operation immediately after removal from the dispersion liquid. Thus, even if the complex had been filled up to the surface during immersion in the dispersion liquid, subsequent liquid draining operation of the silicon wafer surface performed by tilting the silicon wafer to allow the dispersion liquid remaining the surface to run down on the surface may serve to allow a part of the polypyrrole-silver complex in the hole to be drawn out.

FIG. 47 is the SEM image of the surface obtained by cleavage of a silicon wafer almost along with the center of the hole filled with the polypyrrole-silver complex in the operation similar to that in FIG. 46. Also in this SEM image, a column-shaped polypyrrole-silver complex filling the hole completely is observed as being exposed. The polypyrrole-silver complex was formed here not only in the hole but also as a thin plane on the surface of the silicon wafer.

INDUSTRIAL APPLICABILITY

As described above, since the present invention allows a highly adhesive conductive polymer-metal complex thin layer to be formed readily and precisely to a wide range of the substrates, a substantial industrial utility can be expected.

Also according to the present invention, since the adhesion effect based on that a microparticle of the conductive polymer-metal complex enters into and mates with a narrow hall on the surface of the various substrates such as PTFE allows this complex to be adhered readily and strongly onto the substrate, a substantial industrial utility can be expected.

Also according to the present invention, an extremely simple processing which is sufficient to fill the conductive material into a narrow hole such as a via also provides a high industrial utility.

CITATION LIST

Patent Literatures

Patent Literature 1: JP 2010-225697 A
Patent Literature 2: Japanese Patent No. 3,743,801
Patent Literature 3: JP 2004-87427 A
Patent Literature 4: JP 2007-229733 A Non Patent Literatures Non Patent Literature 1: T. Yoshinaga et al., "Trend of TSV technology research and development for three dimensional LSI packaging", Science & Technology Trends April 2010, pp. 23-34

Non Patent Literature 2: "Non-electrolytic copper plating bath suitable for build-up method" S. Hashimoto et al, Fine Plating, No. 55, Page 51-58 (September, 1999)

Non Patent Literature 3: "Simulation of coverage on size exhibiting non-linear surface reaction", H. Kim et al, Report of Functional substance institute of Kyushu University, Vol. 12, No. 1, (1998), Page 15-19

Non Patent Literature 4: S. Fujii et al., J. Mater. Chem., 178 (2007) 3777.

Non Patent Literature 5: Yeon Jae Jung et al., Synth. Met., 161 (2011) 1991.

Non Patent Literature 6: "Mitsubishi Chemical's resistivity meter series Lineup catalogue" "http://www.dins.jp/dins_j/6data/pdf/catalog/Lineup_catalog_J0408-LP.3000US.pdf Non Patent Literature 7: "Ultramicrographic inkjet device "http://www.sijtechnology.com/jp/super_fine_inkjet/index.html Non Patent Literature 8: "minute droplet application system "http://www.applied-micro-systems.net/b300.html

The invention claimed is:

1. An adhesive body comprising a conductive polymer-metal complex and a plastic substrate, wherein
   the conductive polymer-metal complex comprises an organic conductive polymer and metal nanoparticles having a diameter of 5 nm or more and less than 100 nm,
   wherein at least a part of the metal nanoparticles is exposed on a surface of the organic conductive polymer;
   wherein the complex is adhered to a surface of the plastic substrate comprising narrow holes having a size of 5 nm or more; and
   the complex comprises microparticles having a diameter of 5 nm to 500 nm in the narrow holes on the surface of the plastic substrate adhering the complex to the surface of the plastic substrate.

2. The adhesive body comprising the conductive polymer-metal complex and the plastic substrate according to claim 1, wherein the narrow holes have a size of 5 nm or more and 1000 nm or less.

3. The adhesive body comprising the conductive polymer-metal complex and the plastic substrate according to claim 1, wherein the microparticles are bound to each other.

4. The adhesive body comprising the conductive polymer-metal complex and the plastic substrate according to claim 3, wherein the binding of the microparticles of the complex to each other occurs via Van der Waals' force or a hydrogen bond.

5. The adhesive body comprising the conductive polymer-metal complex and the plastic substrate according to claim 1, wherein the organic conductive polymer is an organic polymer of a straight chain, aromatic, heterocyclic compound or a heteroatom compound having a conjugation structure.

6. The adhesive body comprising the conductive polymer-metal complex and the plastic substrate according to claim 1, wherein the organic conductive polymer is a polymer of a monomer selected from the group consisting of pyrrole, 3,4-ethylenedioxythiophene and aniline.

7. The adhesive body comprising the conductive polymer-metal complex and the plastic substrate according to claim 1, wherein the metal is at least one metal selected from the group consisting of gold, platinum, palladium, ruthenium, iridium, silver, copper, nickel, iron, chromium, zinc, cadmium, tellurium, tin and lead.

8. A method for forming the adhesive body comprising the conductive polymer-metal complex and the plastic substrate according to claim 1, said method comprising adhering a conductive polymer-metal complex dispersion liquid wherein microparticles of a conductive polymer-metal complex comprising an organic conductive polymer and metal nanoparticles with at least a part of the metal nanoparticles being exposed on a surface of the organic conductive polymer is dispersed in a solvent to a substrate.

9. The adhesive body comprising the conductive polymer-metal complex and the plastic substrate according to claim 1, wherein the plastic is selected from the group consisting of an acrylonitrile butadiene styrene (ABS) copolymer, an olefin resin, polypropylene, polyimide, polytetrafluoroethylene, polyvinyl chloride and polyethylene terephthalate.

* * * * *